(12) United States Patent
Matsudera et al.

(10) Patent No.: US 6,498,741 B2
(45) Date of Patent: *Dec. 24, 2002

(54) SEMICONDUCTOR MEMORY DEVICE

(75) Inventors: Katsuki Matsudera, Yokohama; Kazuhide Yoneya, Sagamihara; Toshiki Hisada; Masaru Koyanagi, both of Yokohama; Natsuki Kushiyama; Kaoru Nakagawa, both of Kawasaki; Takahiko Hara, Yokohama, all of (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/746,890

(22) Filed: Dec. 21, 2000

(65) Prior Publication Data

US 2001/0000990 A1 May 10, 2001

Related U.S. Application Data

(63) Continuation of application No. 09/460,641, filed on Dec. 15, 1999, now Pat. No. 6,198,649.

(30) Foreign Application Priority Data

Dec. 22, 1998 (JP) .......................................... 10-364613

(51) Int. Cl.[7] ................................................ G11C 5/06
(52) U.S. Cl. ...................... 365/63; 365/51; 365/189.05; 365/189.12
(58) Field of Search ...................... 365/63, 51, 189.05, 365/230.06, 230.08, 230.03, 189.12

(56) References Cited

U.S. PATENT DOCUMENTS 5,198,999 A    3/1993   Abe et al. .............. 365/189.05
5,812,490 A    9/1998   Tsukude .................... 365/233
5,995,404 A    9/1998   Nakaumura et al. .......... 365/63
5,926,431 A  * 7/1999   Toda ..................... 365/230.03
5,982,680 A   11/1999   Wada ........................ 365/200
6,198,649 B1 * 3/2001   Matsudera et al. ........... 365/63

FOREIGN PATENT DOCUMENTS

JP          9-161476          6/1997

* cited by examiner

Primary Examiner—Richard Elms
Assistant Examiner—Hien Nguyen
(74) Attorney, Agent, or Firm—Hogan & Hartson, L.L.P.

(57) ABSTRACT

A semiconductor memory device is provided which ensures the symmetry of memory data transmission time and a high-speed operation and has large write/read operation margin with no need of increasing the chip area. By placing a horizontally long peripheral circuit section in the middle in the vertical direction of a semiconductor chip, placing a vertically long shift register section above and below and perpendicularly to the peripheral circuit section, and making the memory core and shift register arrangement symmetrical in the horizontal direction, the data/signal lines between the memory core and the shift register section can be made short and the symmetry of the interconnections can be maintained, which allows the implementation of a high-speed and large-margin semiconductor memory device. In addition, a faster semiconductor memory can be obtained by forming the shift register section by stacking shift registers each corresponding to a data block and selecting the order in which the shift registers are stacked so that the length of interconnections between the peripheral circuit and the shift register is minimized.

20 Claims, 33 Drawing Sheets

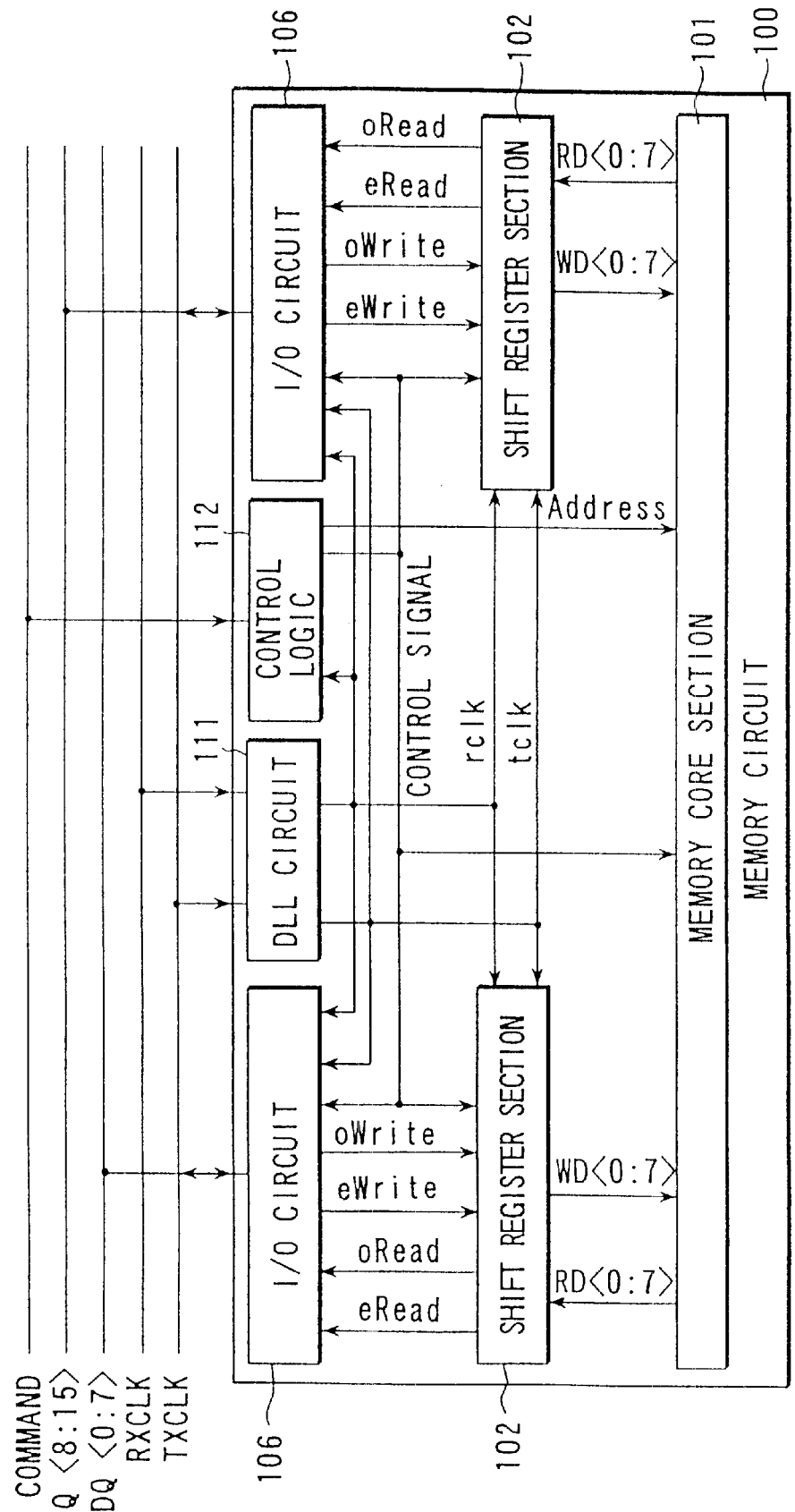
FIG. 1 "PRIOR ART"

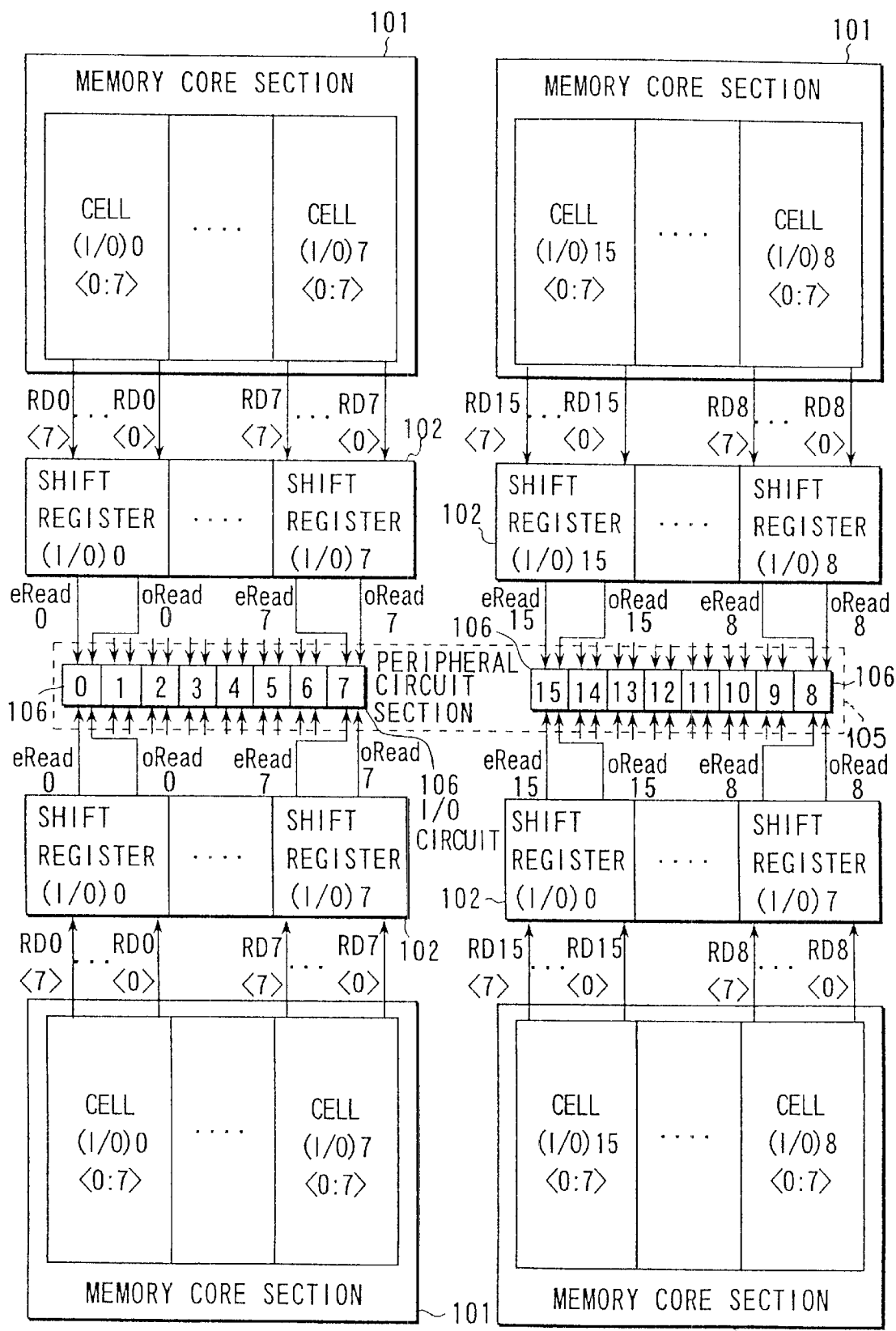
FIG. 2 "PRIOR ART"

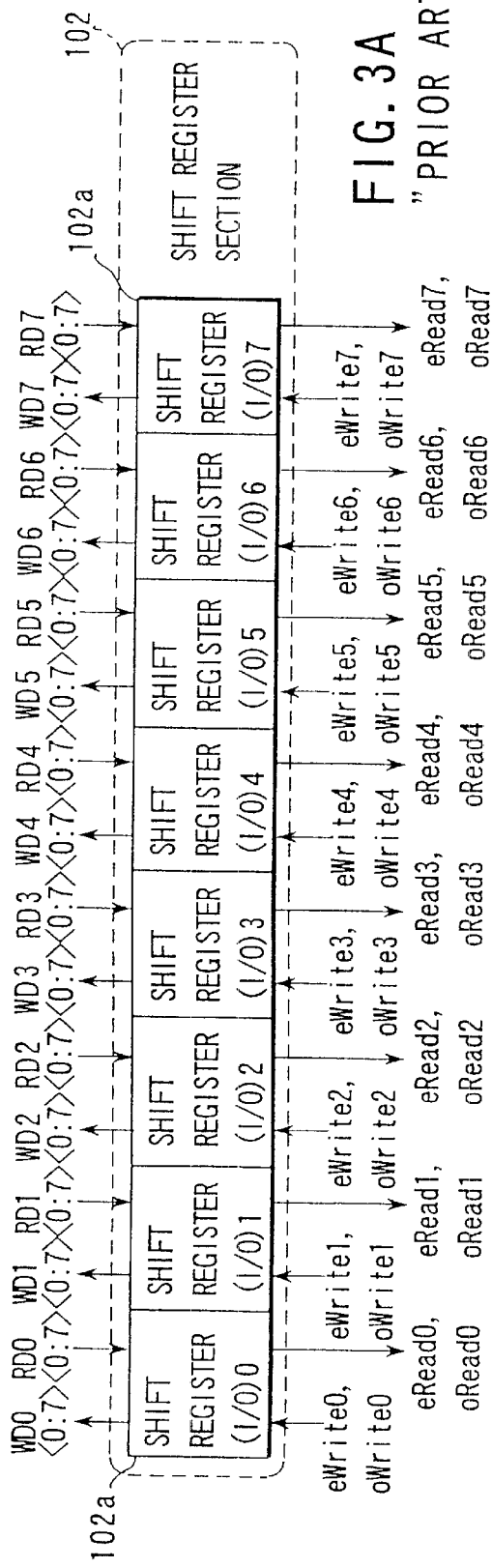
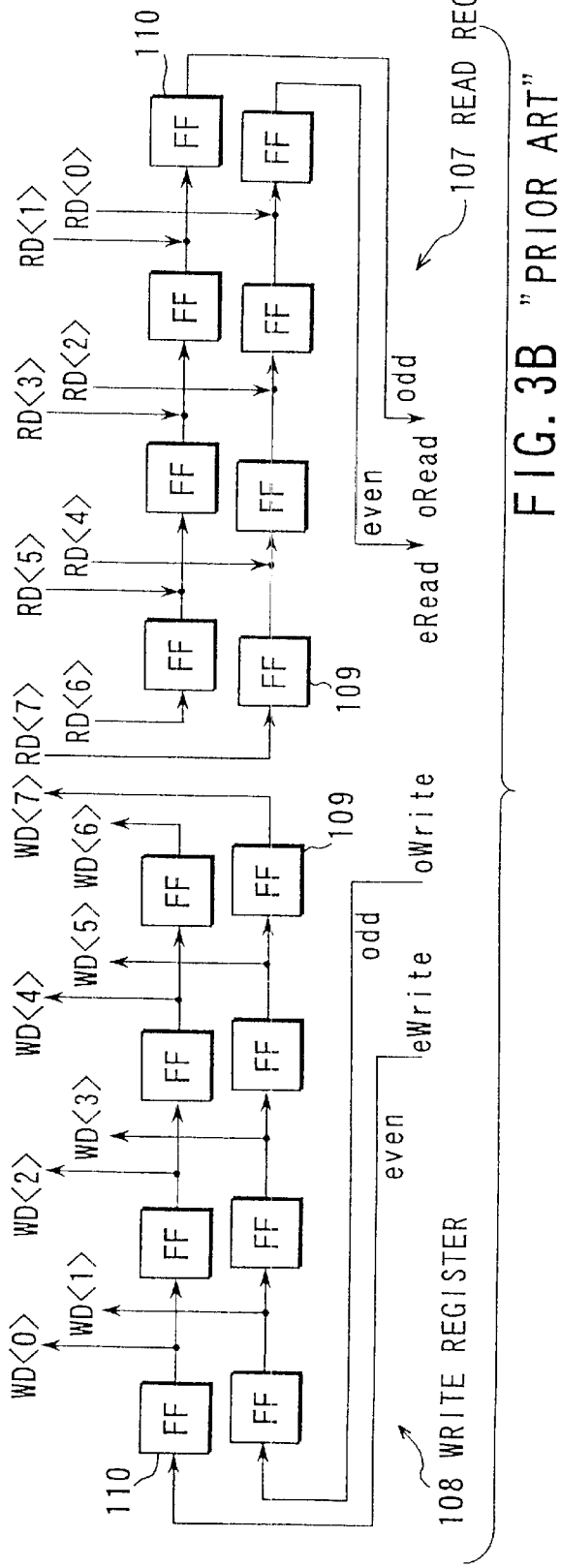
FIG. 3A "PRIOR ART"
FIG. 3B "PRIOR ART"

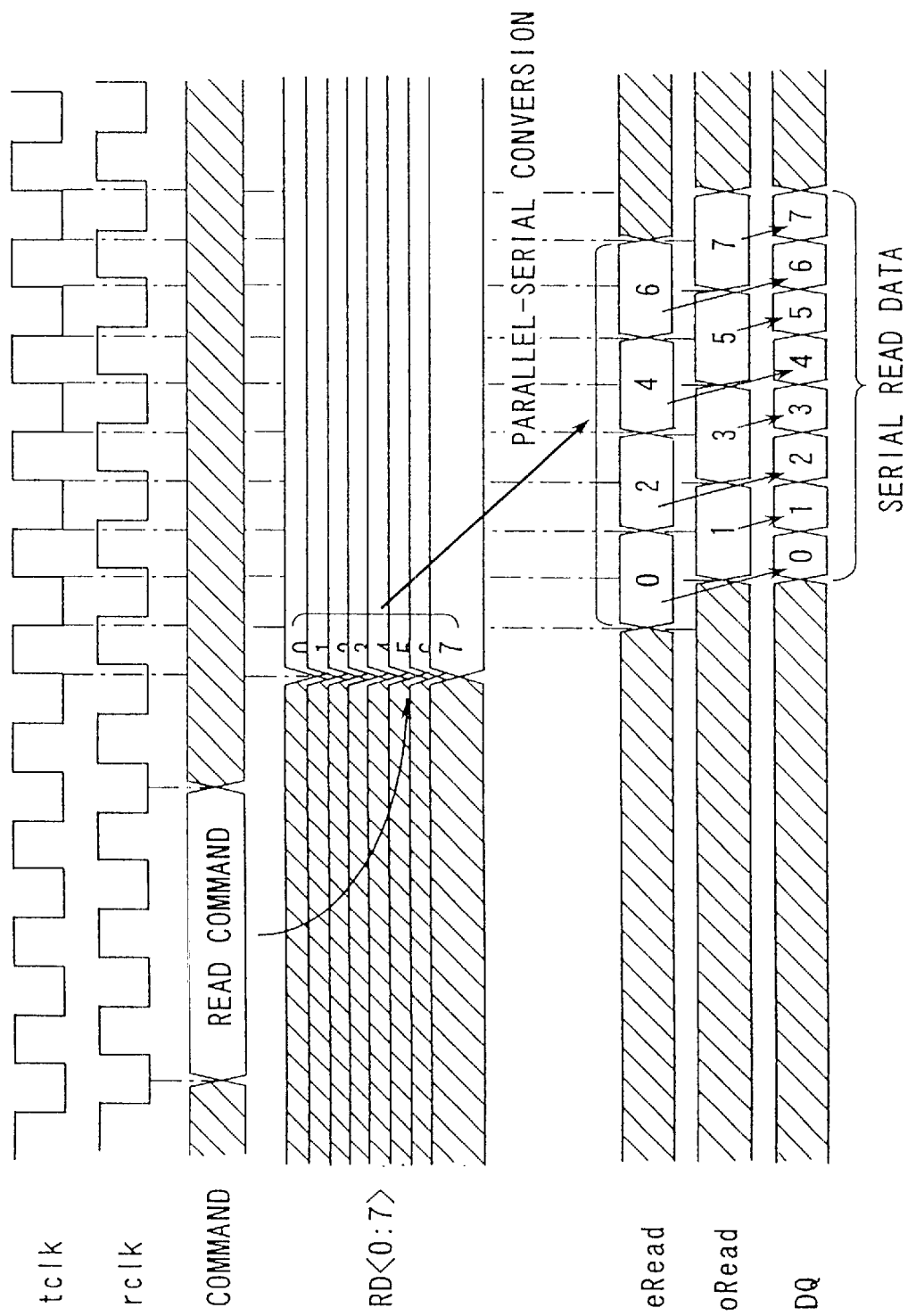
FIG. 4 "PRIOR ART"

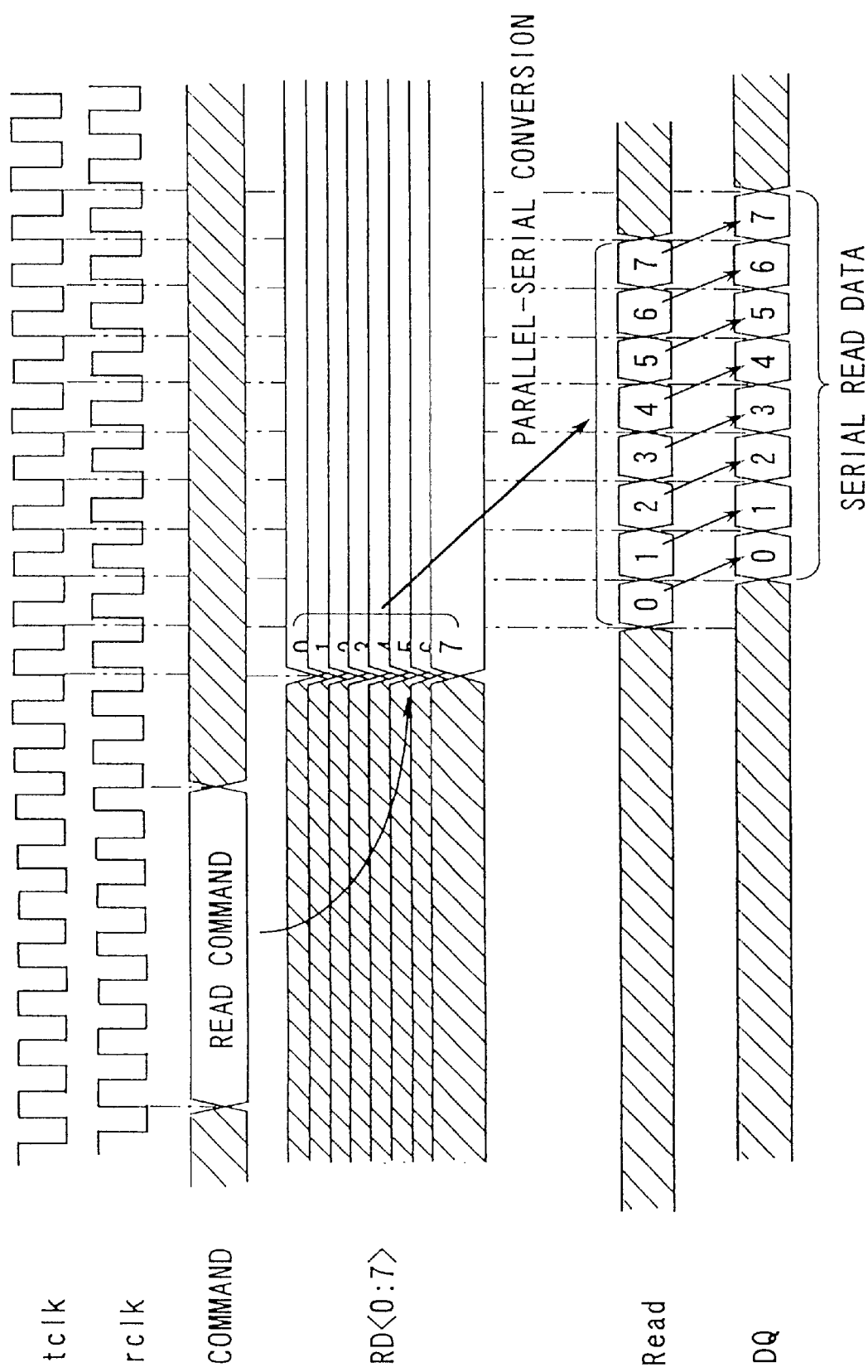
FIG. 5 "PRIOR ART"

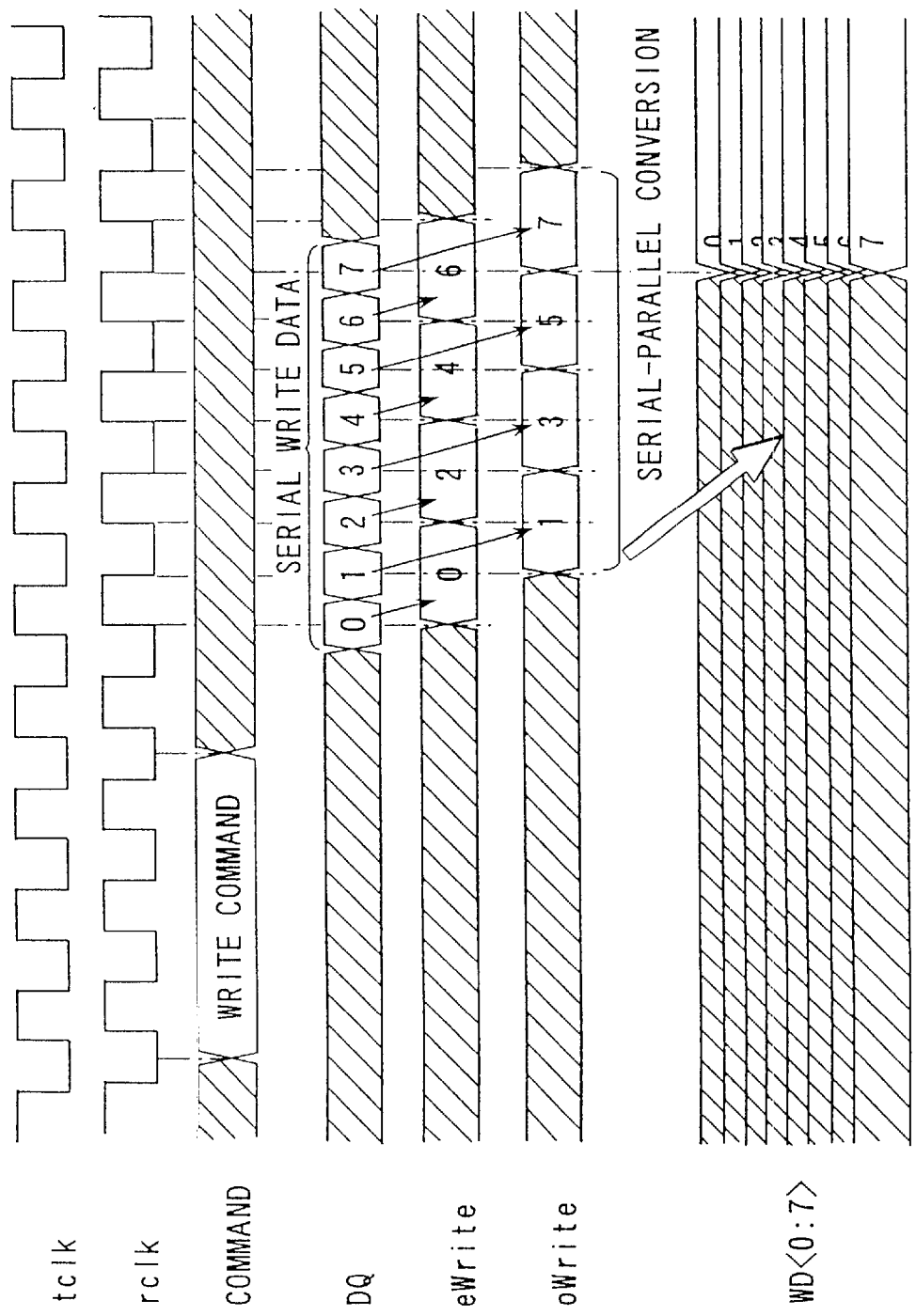
FIG. 6 "PRIOR ART"

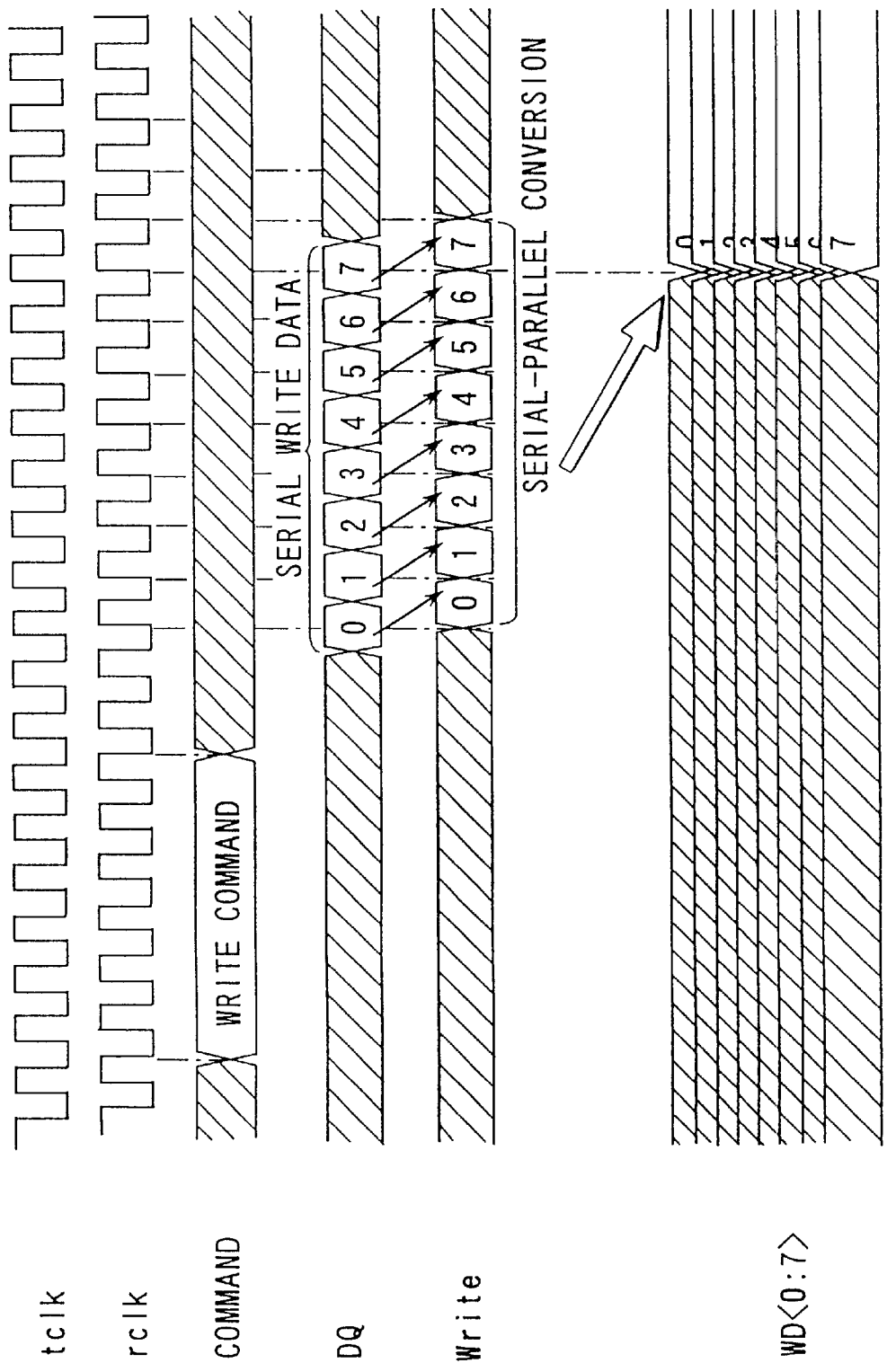
FIG. 7 "PRIOR ART"

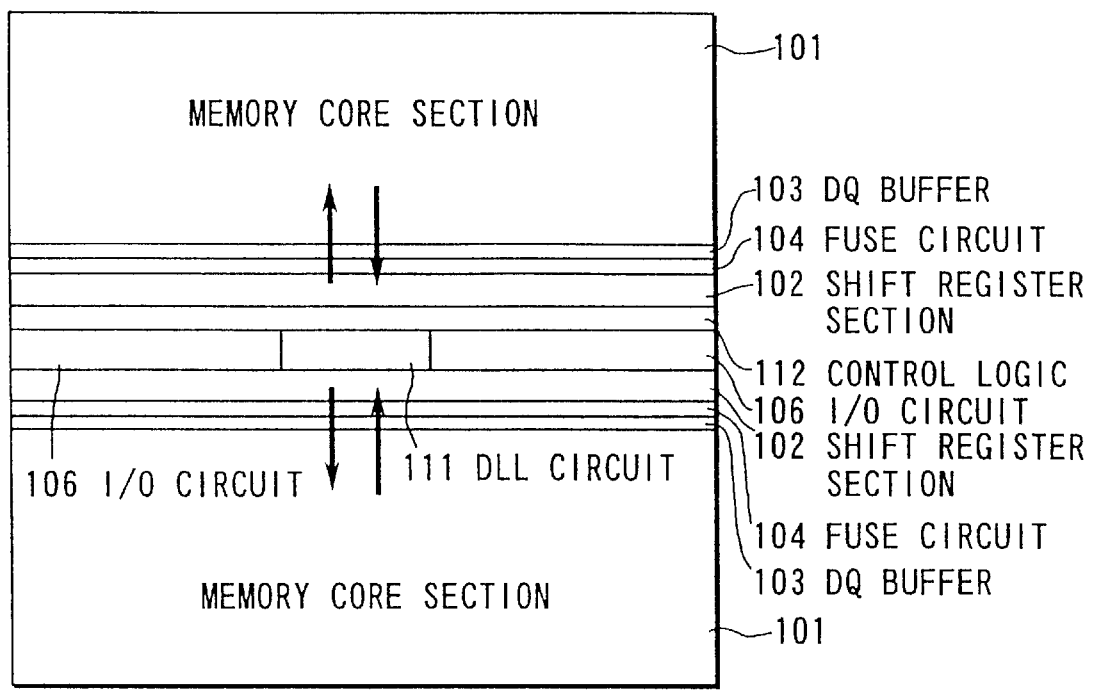
FIG. 8A "PRIOR ART"
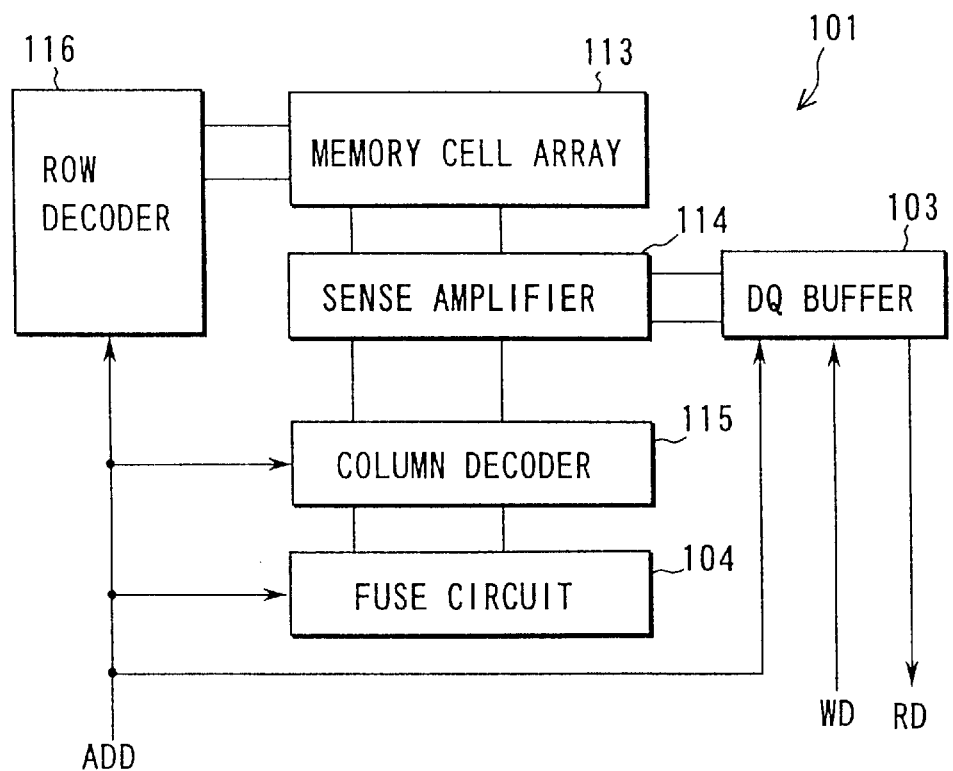
FIG. 8B "PRIOR ART"

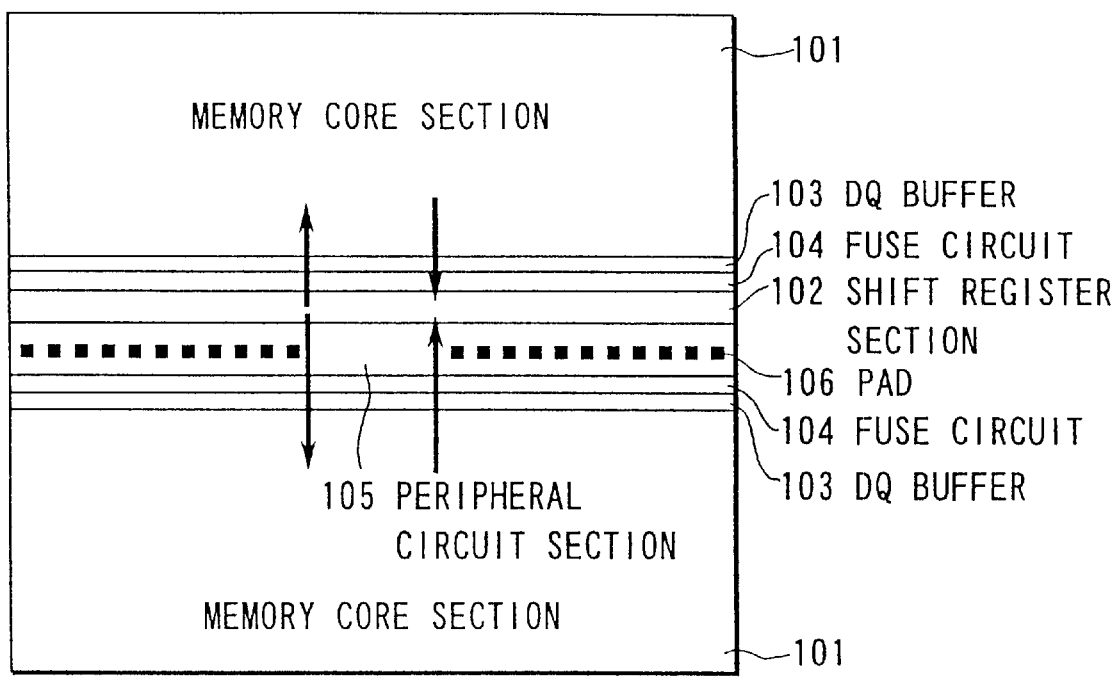
FIG. 9  "PRIOR ART"

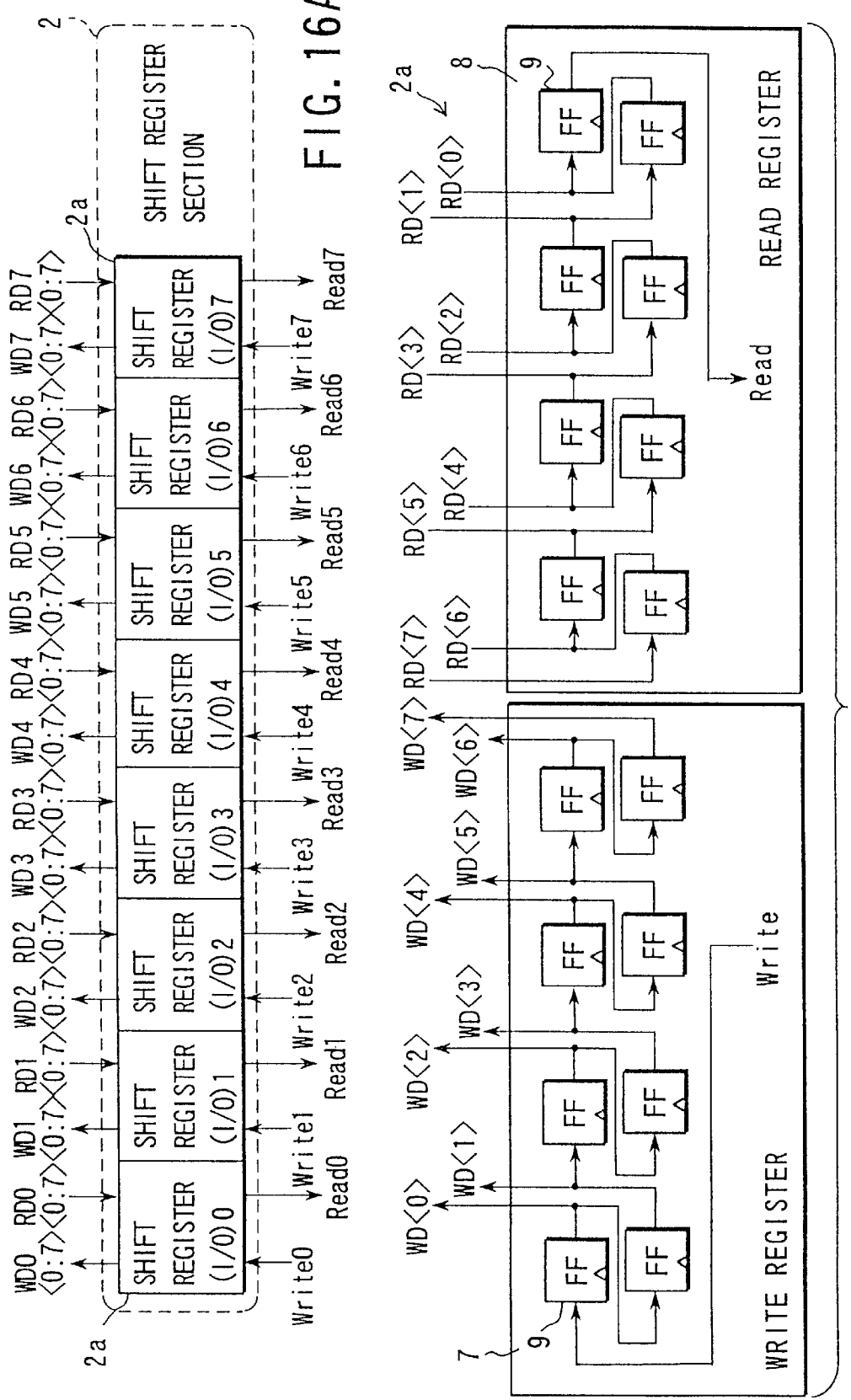

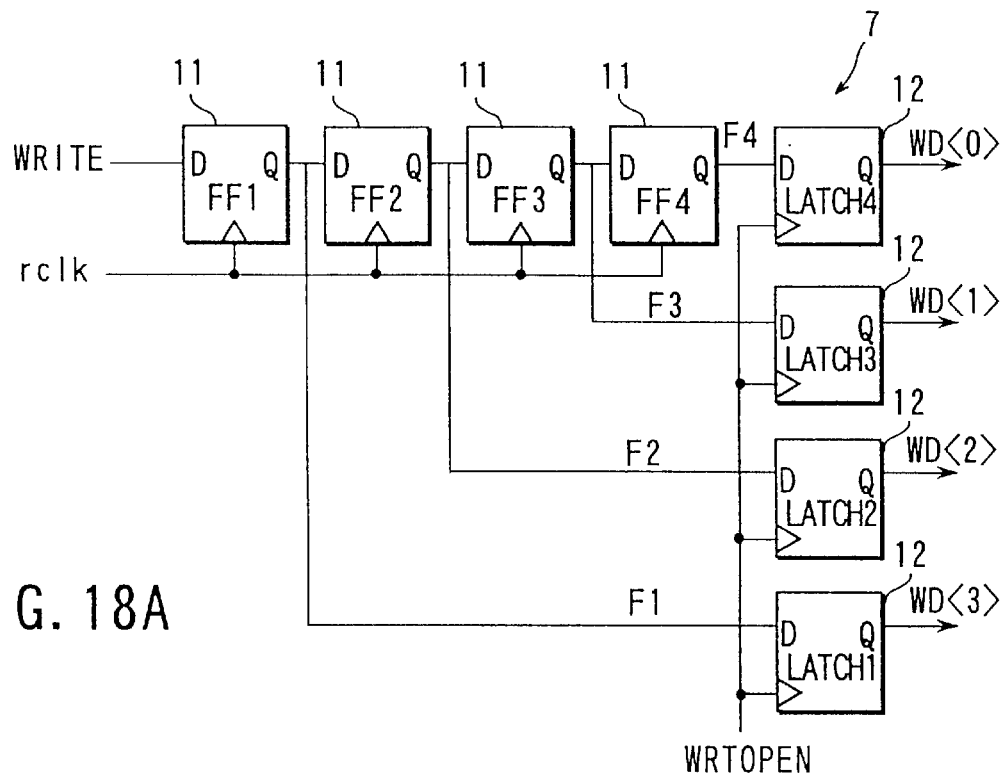
FIG. 18A
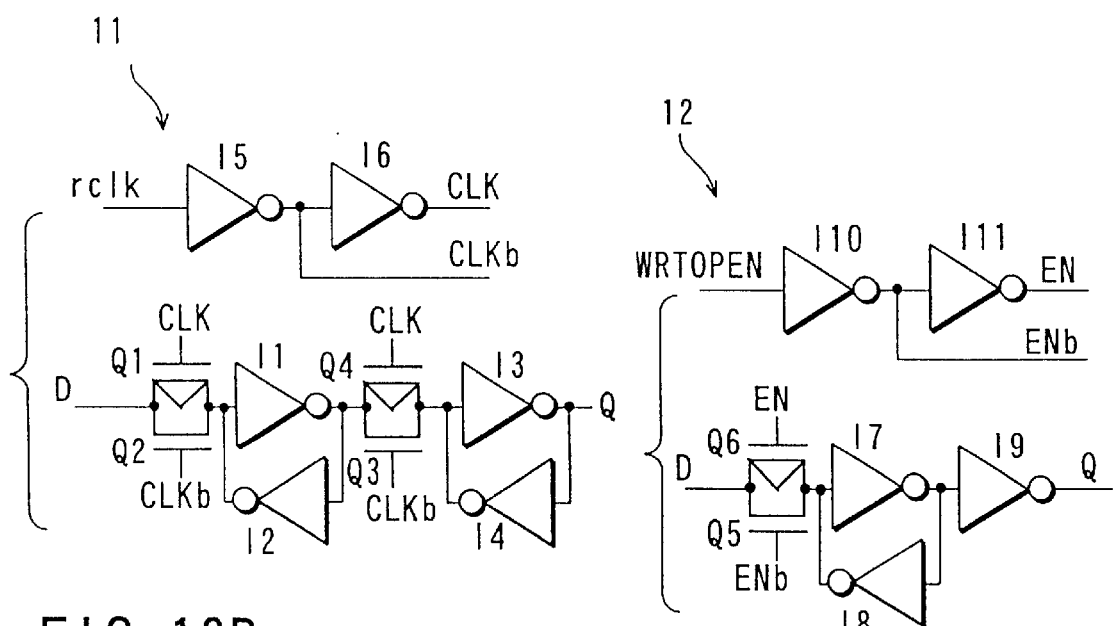
FIG. 18B
FIG. 18C

US 6,498,741 B2

SEMICONDUCTOR MEMORY DEVICE

This application is a continuation of 09/460,641 filed Dec. 15, 1999 now U.S. Pat. No. 6,198,649.

BACKGROUND OF THE INVENTION

The present invention relates to a semiconductor memory device and more specifically to the circuit arrangement of a semiconductor memory device operations of which are synchronized with a high-frequency clock signal. This application is based on Japanese Patent Application No. 10-364613, filed Dec. 22, 1998, the content of which is incorporated herein by reference.

Such a semiconductor memory device as is synchronized with a high-frequency clock signal is referred hereinafter to as a synchronous memory. The circuit arrangement of a conventional synchronous memory 100 is shown in FIG. 1. The memory 100 is roughly divided into a memory core section 101 and an I/F circuit section.

The I/F circuit section includes right and left shift register sections 102 adjacent to the memory core section 101, right and left input/output (I/O) circuits 106 corresponding to the right and left shift register sections, a delayed locked loop (DLL) circuit 111, and a control logic circuit 112.

The DLL circuit 111 produces an internal write data control clock signal rclk in synchronization with an externally applied write clock signal RXCLK and an internal read data control clock signal tclk in synchronization with an externally applied read clock signal TXCLK.

The control logic circuit 112 performs logical operations on a protocol entered through an external command signal COMMAND to produce control signals for the memory.

The right and left I/O circuits 106 are responsive to the internal write data control signal rclk to take in serial write data DQ<0:7> and DQ<8:15>, respectively, from external I/O data lines and then output internal serial write data eWrite and oWrite to the shift register sections 102 each consisting of plural shift registers.

Further, the right and left I/O circuits are responsive to the internal read data control signal tclk to take in internal serial read data eRead and oRead from the left and right shift register sections, respectively, and then output serial read data DQ<0:7> and DQ<8:15>, respectively, onto the external I/O data lines.

Here, <0:7> and <8:15> represent the low-order eight bits and the high-order eight bits, respectively, of 16-bit data. The letters e and o affixed to Read and Write represent even-numbered and odd-numbered bits of data, respectively.

The shift register sections 102 are each responsive to a control signal to take in internal parallel read data RD<0:7> output from the memory core section 101 in a read operation and to write internal parallel write data WD<0:7> output therefrom into the memory core section in a write operation.

Thus, the right and left shift registers 102 convert internal parallel read data RD<0:7> read from the memory core section 101 into internal serial read data eRead and oRead at read time and convert internal serial write data eWrite and oWrite from the I/O circuits 106 into internal parallel write data WD<0:7> at write time.

The memory core section 101 includes, as in a normal DRAM circuit, a memory cell array, a sense amplifier, a row decoder, a column decoder, a redundancy fuse, and a DQ buffer.

In FIG. 2, there is illustrated, in the layout of the conventional synchronous memory, the flow of data from the memory core section 101 to the I/O circuits 106 with conversion from parallel form to serial form by the shift register sections 102. Here, the right and left I/O circuits 106 included in a peripheral circuit section 105 enclosed with dashed lines are consecutively numbered 0 through 7 and 8 through 15.

In writing into the memory core section 101, serial write data from the I/O circuits 106 are entered into the shift register sections 102 for conversion into parallel write data and the resulting parallel write data are written into the memory core section 101.

Thus, the flow of data in a write operation is the reverse of that in a read operation. In FIG. 2, therefore, there is illustrated the flow of data in a read operation by way of example.

In FIG. 2, four memory core sections 101 are placed above and below the peripheral circuit section 105. The left-hand memory core sections 101 are each allocated areas for eight bits in correspondence with the left-hand 8-bit I/O circuit 106 assigned consecutive numbers 0 through 7. Likewise, the right-hand memory core sections 101 are each allocated areas for eight bits in correspondence with the right-hand 8-bit I/O circuit 106 assigned consecutive numbers 8 through 15. As a result, a 16-bit synchronous memory is constituted as a whole.

In this manner, the cell array is allocated areas from (I/O)0<0:7> to (I/O)15<0:7> each of eight bits as shown in FIG. 2. If the synchronous memory is active, then either upper left and lower right memory core sections or lower left and upper right ones will be selected in combination by an address signal.

Data read from each memory core section in a parallel form, eight bits at a time, is converted to 8-bit serial data in the corresponding shift register section 102. The shift register section 102 is illustrated in detail in FIGS. 3A and 3B.

FIG. 3A shows the shift register section 102 in enlarged form. The shift register section 102 has shift registers 102a each corresponding to a respective one of the I/O circuits (I/O)0 through (I/O)7. Odd-numbered bits of data and even-numbered bits of data (hereinafter referred simply as to even and odd data) are shifted in the shift register section in synchronization with rising and falling edges, respectively, of the internal read data control clock tclk.

That is, eight-bit parallel read data of RD0<0:7> to RD7<0:7> read from the memory core section are entered into the shift registers 102a and odd serial read data of oRead0 to oRead7 and even serial read data of eRead0 to eRead7 are read from the shift registers 102a.

Odd serial write data of oWrite0 to oWrite7 and even serial write data of eWrite0 to eWrite7 are entered into the shift registers 102a and 8-bit parallel write data of WD0<0:7> to WD7<0:7> are output from the shift registers.

FIG. 3B shows the circuit arrangement of the shift register 102a, which includes a read register 107 and a write register 108.

The read register 107 includes first and second shift registers. The first shift register includes four cascade-connected flip-flops (FFs) 109 that receive odd parallel read data RD<1>, RD<3>, RD<5>, and RD<7> and output serial read data oRead. The second shift register includes four cascade-connected FFs 110 that receive even parallel read data RD<0>, RD<2>, RD<4>, and RD<6> and output serial read data eRead.

Likewise, the write register 108 includes first and second shift registers. The first shift register includes four cascade-connected FFs 109 that receive odd serial write data owrite and output odd parallel write data WD<1>, WD<3>, WD<5> and WD<7>. The second shift register includes four cascade-connected FFs 110 that receive even serial write data eWrite and output even parallel write data WD<0>, WD<2>, WD<4> and WD<6>.

Thus, the read register 107 and the write register 108 provide parallel-to-serial conversion and serial-to-parallel conversion, respectively.

Next, reference will be made to timing diagrams of FIGS. 4 through 7 to describe read and write operations of the synchronous memory in terms of one memory core section 101 and its associated shift register section 102 and I/O circuit 106.

First, an example of a read operation will be described with reference to FIG. 4. Eight-bit parallel read data RD<0:7> is output from a memory core section 101 at a fixed time after the entry of a read command signal COMMAND.

The odd bits 1, 3, 5 and 7 of the 8-bit parallel read data RD<0:7> are applied to the inputs of the respective FFs 109 in the read register 107 and then clocked out of the read register in synchronization with rising edges of the internal read data control clock signal tclk, whereby conversion into 4-bit serial read data oRead is performed.

On the other hand, the even-numbered bits 0, 2, 4 and 6 of the 8-bit parallel read data RD<0:7> are applied to the inputs of the respective FFs 110 in the read register 107 and then clocked out of the read register in synchronization with falling edges of the internal read data control clock signal tclk, whereby conversion into 4-bit serial read data eRead is performed.

These serial read data oRead and eRead are then combined, so that 8-bit serial read data including bits numbered 0 through 7 is output to outside through the associated I/O circuit 106 of FIG. 2. In this manner, 8-bit serial read data is output in four cycles of the clock signal tclk. That is, 4-bit read data oRead and eRead can be alternately output using rising and falling edges of the clock signal tclk.

Another example of a read operation is illustrated in FIG. 5, which is a timing diagram for parallel-to-serial conversion using only rising edges of the internal read data control clock signal tclk. This approach requires eight cycles of the clock signal tclk for parallel-to-serial conversion of 8-bit data unlike the FIG. 4 case where both the rising and falling edges of the clock signal tclk are used.

Next, an example of a write operation will be described with reference to FIG. 6. Eight-bit serial write data is output from an I/O circuit at a fixed time after the entry of a write command signal COMMAND.

The even-numbered bits 0, 2, 4 and 6 of 8-bit serial write data from the I/O circuit are sequentially applied to the input of cascade connection of the FFs 110 in the write register 108 and then clocked into the write register in synchronization with rising edges of the internal write data control clock signal rclk, whereby conversion into 4-bit parallel write data ewrite is performed.

On the other hand, the odd-numbered bits 1, 3, 5 and 7 of the 8-bit serial write data from the I/O circuit are sequentially applied to the input of cascade connection of the FFs 109 in the write register 108 and then clocked into the write register in synchronization with falling edges of the internal write data control clock signal rclk, whereby conversion into 4-bit parallel write data owrite is performed.

By combining the outputs of the FFs 109 and 110 in the write register 108, serial-to-parallel converted write data WD<0:7> including bits numbered 0 through 7 is output.

Another example of a write operation is illustrated in FIG. 7, which is a timing diagram for serial-to-parallel conversion based on only rising edges of the internal write data control clock signal rclk. This approach requires eight cycles of the clock signal rclk for serial-to-parallel conversion of 8-bit data unlike the case of FIG. 6 where both the rising and falling edges of the clock signal rclk are used.

Next, the configuration of the conventional synchronous memory will be described with reference to FIGS. 8A and 8B. FIG. 8A shows the pattern layout of the main circuit of the memory. Though not shown, pads connected to input/output terminals are placed in the middle of the chip.

The I/O circuits 106 are placed on the right and left of the DLL circuit 111. The control logic circuit 112 is placed above the DLL circuit. The shift register sections 102 are placed above the control logic circuit 112 and below the DLL circuit 111 and the I/O circuits 106 for data transfer to and from the memory sections 101 as indicated by arrows.

DQ buffers 103 and redundancy fuse circuits 104 are placed adjacent to the shift register sections 102. The redundancy fuse circuits are adapted to improve the manufacturing yield by providing redundancy for the memory core sections 101 and removing failed bits.

By placing each memory core section 101 and its associated shift register section 102 in the upper and lower portions of the chip symmetrically with respect to the central line, data lines and signal lines between each memory core section and its associated shift register section can be made symmetrical with respect to the central line and transfer times of data and signals over the data lines and signal lines in the upper and lower portions can be made equal to each other. The margin of read and write operations can therefore be improved. However, this configuration increases the area of the chip because of need of the two upper and lower shift register sections.

FIG. 8B is a block diagram of the memory core section 101. As with a normal semiconductor memory device, the memory core section 101 includes the DQ buffer 103, the fuse circuit 104, a memory cell array 113, a sense amplifier 114, a column decoder 115, and a row decoder 116. ADD indicates an address signal, RD read data, and WD write data.

The pattern layout can be modified such that the upper and lower memory core sections 101 share one shift register section 102. This conventional example is shown in FIG. 9. With this modified layout, a reduction in the chip area can be expected in comparison with the layout of FIG. 8, but the length of data lines and signal lines between the shared shift register section and the upper memory core section and the length of those between the shift register section and the lower memory core section will become different from each other. For this reason, a disadvantage arises in that the margin of operations of reading from and writing into the memory core section associated with longer and different length interconnections is reduced.

BRIEF SUMMARY OF THE INVENTION

As described above, the conventional synchronous memory has a problem that, in order to make the signal transfer times for the upper and lower memory core sections equal to each other, two upper and lower shift registers are required and as a result the chip area increases.

With another conventional synchronous memory such that the upper and lower memory core sections share one shift register section, a reduction in the chip area can be expected, but the length of data lines and signal lines between the shared shift register section and the upper memory core section and the length of those between the shift register section and the lower memory core section differ from each other. For this reason, a disadvantage arises in that the margin of operations of reading from and writing into the memory core section associated with longer and different length interconnections is reduced and the symmetry of data/signal transmission time is lost.

It is therefore an object of the present invention to provide a synchronous memory having large write/read operation margin by placing memory core and shift register arrangements in the upper right and left portions and the lower right and left portions of a chip so that they are symmetrical not only in the up-and-down direction but in the right-and-left direction to ensure the symmetry of data/signal transmission time between each memory core and its associated shift register without increasing the chip area.

A semiconductor memory device of the present invention is a synchronous memory formed on a rectangular semiconductor chip and characterized in that a horizontally long peripheral circuit section including I/O circuits is placed in the middle of the chip and memory core, shift register arrangements are placed in the upper and lower portions of the chip so that the chip is symmetrical about the peripheral circuit section and the longitudinal line of the shift register section and the longitudinal line of the peripheral circuit section are perpendicular to each other.

The synchronous memory of the present invention in which the pattern layout has the up-and-down symmetry is further characterized by having the right-and-left symmetry.

In addition, the synchronous memory is characterized by optimizing the direction of flow of write/read data in the shift register section in order to reduce the length of interconnections between the peripheral circuit section and the shift register section which are perpendicular to each other on the chip.

In the description below, the right-and-left direction along a side of a rectangular semiconductor chip is referred to as the horizontal direction and the up-and-down direction along another side of the chip is referred to as the vertical direction. The shape of the semiconductor chip may be either square or rectangular.

Specifically, a semiconductor memory device of the present invention is formed on a rectangular semiconductor chip having horizontal and vertical sides and comprises: a peripheral circuit section including a plurality of I/O circuits and placed in the middle in the vertical direction of the chip so that its longitudinal line is oriented parallel to the horizontal direction of the chip; a shift register section placed on the chip symmetrically with respect to the center line of the peripheral circuit section along its longitudinal line so that its longitudinal line is perpendicular to the longitudinal line of the peripheral circuit section; and a memory core section including a memory cell array and placed adjacent to the shift register section along the longitudinal line of the shift register section.

Preferably, in the semiconductor memory device, the memory core section and the shift register section are placed on the chip symmetrically with respect to the vertical center line of the semiconductor chip.

Preferably, in the semiconductor memory device, the memory core section is placed adjacent to one side of the shift register section along its longitudinal line.

Preferably, in the semiconductor memory device, the memory core section is placed adjacent to both sides of the shift register section along its longitudinal line.

Preferably, in the semiconductor memory device, the memory core section comprises first and second memory cores placed adjacent to both sides of the shift register section and the shift register section comprises a first shift register section which operates in association with the first memory core and a second shift register section which operates in association with the second memory core.

Preferably, in the semiconductor memory device, the memory core section comprises first and second memory cores placed adjacent to both sides of the shift register and the shift register section operates in association with the first and second memory cores.

A semiconductor memory device of the present invention is formed on a rectangular semiconductor chip having horizontal and vertical sides and comprises: a peripheral circuit section including a plurality of I/O circuits and placed in the middle in the vertical direction of the chip so that its longitudinal line is oriented parallel to the horizontal direction of the chip; a shift register section placed on the chip symmetrically with respect to the center line of the peripheral circuit section along its longitudinal line so that its longitudinal line is perpendicular to the longitudinal line of the peripheral circuit section; and a memory core section including a memory cell array and placed adjacent to the shift register section along the longitudinal line of the shift register section, the shift register section including a plurality of shift registers which are arranged along the vertical direction of the chip and correspond one for one with the plurality of I/O circuits. The shift registers which correspond one for one with the I/O circuits are described in the sixteenth embodiment of the invention.

In a semiconductor memory device of the present invention, the shift register section includes a plurality of shift registers which are arranged along the vertical direction of the chip and correspond one for one with bits of write/read serial data. Such shift registers are described in the seventeenth embodiment of the present invention.

Preferably, the shift register section comprises a first shift register section having a plurality of shift registers which correspond one for one with even bits of the serial data and a second shift register section having a plurality of shift registers which correspond one for one with odd bits of the serial data, the first and second shift register sections being arranged independently.

Preferably, write/read data is transferred in one of the following transfer modes: a transfer mode in which, at data write time, serial data is transferred from a shift register which is close to the peripheral circuit section to a shift register which is far from the peripheral circuit section; a transfer mode in which, at data read time, parallel data read from the memory core section is transferred to a shift register close to the peripheral circuit section; a transfer mode in which, at data write time, serial data is transferred from a shift register close to the peripheral circuit section to a shift register far from the peripheral circuit section and then turns back toward a shift register close to the peripheral circuit section; and a transfer mode in which, at data read time, parallel data read from the memory core section is transferred to a shift register far from the peripheral circuit section and then turns back toward a shift register close to the peripheral circuit section.

This configuration ensures the symmetry of data lines and signal lines that connect the memory core section and the shift register section. Further, by optimizing the dividing arrangement of the memory core section and the shift register section and the data transfer mode of the shift register section, the length of the data lines and the signal lines is reduced, thus allowing the write/read operation margin to be obtained, the operating speed to be increased, the power dissipation to be reduced, and the chip size to be reduced.

Preferably, in the semiconductor memory device of the present invention, a write register forming a part of the shift register section is arranged such that a latch control signal (WRTLAT in FIG. 20) for a plurality of latch circuits is transferred in synchronization with an internal clock signal, bits of serial write data entered into the write register are taken into the latch circuits in a given order, and the bits of the write data are taken from the latch circuits in parallel, and, in the write data transfer mode of the shift register section, by the latch control signal entered into a shift register in the shift register section which is close to the peripheral circuit section being transferred toward a shift register far from the peripheral circuit section, bits of serial write data entered into a shift register close to the peripheral circuit section are sequentially taken into latch circuits from close to the peripheral circuit section to far from the peripheral circuit section.

In normal shift register-based serial-to-parallel conversion, bits of input serial data are sequentially taken into register blocks starting with the block far from the input of the shift register to the block close to the input of the shift register. In the write register stated above, bits of input serial data are sequentially taken into blocks starting with the block close to the input to the block far from the input.

Using this function, by entering serial write data into the write register block closest to the peripheral circuit section and outputting serial read data subjected to parallel-to-serial conversion in the read register from the read register block closest to the peripheral circuit section, the data lines and signal lines can be reduced in length.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 shows the arrangement of a conventional semiconductor memory device;

FIG. 2 shows the flow of data in the memory core section, the shift register section, and the I/O circuit of FIG. 1;

FIGS. 3A and 3B show the circuit arrangement of the conventional shift register section;

FIG. 4 is a timing diagram illustrating a conventional read operation;

FIG. 5 is a timing diagram illustrating another conventional read operation;

FIG. 6 is a timing diagram illustrating a conventional write operation;

FIG. 7 is a timing diagram illustrating the operation of another conventional write operation;

FIG. 8A shows a pattern layout of a conventional memory device;

FIG. 8B shows the arrangement of the memory core of the conventional semiconductor memory device;

FIG. 9 shows another conventional pattern layout;

FIG. 16A shows an arrangement of the shift register section;

FIG. 16B shows circuit arrangements of the write register and the read register in each shift register of FIG. 16A;

FIG. 18A shows the circuit arrangement of the write register;

FIG. 18B shows the circuit arrangement of the FF circuit in the write register of FIG. 18A;

FIG. 18C shows the circuit arrangement of the latch circuit in the write register of FIG. 18A;

DETAILED DESCRIPTION OF THE INVENTION

The preferred embodiments of the present invention will be described below with reference to the accompanying drawings. In the following description, a memory core section including a DQ buffer and a fuse circuit is simply referred to as a core, and three types of circuits, i.e., I/O circuits including pads connected to input/output terminals, a DLL circuit and a control logic circuit, are collectively referred to as a peripheral circuit section.

Figure 10:
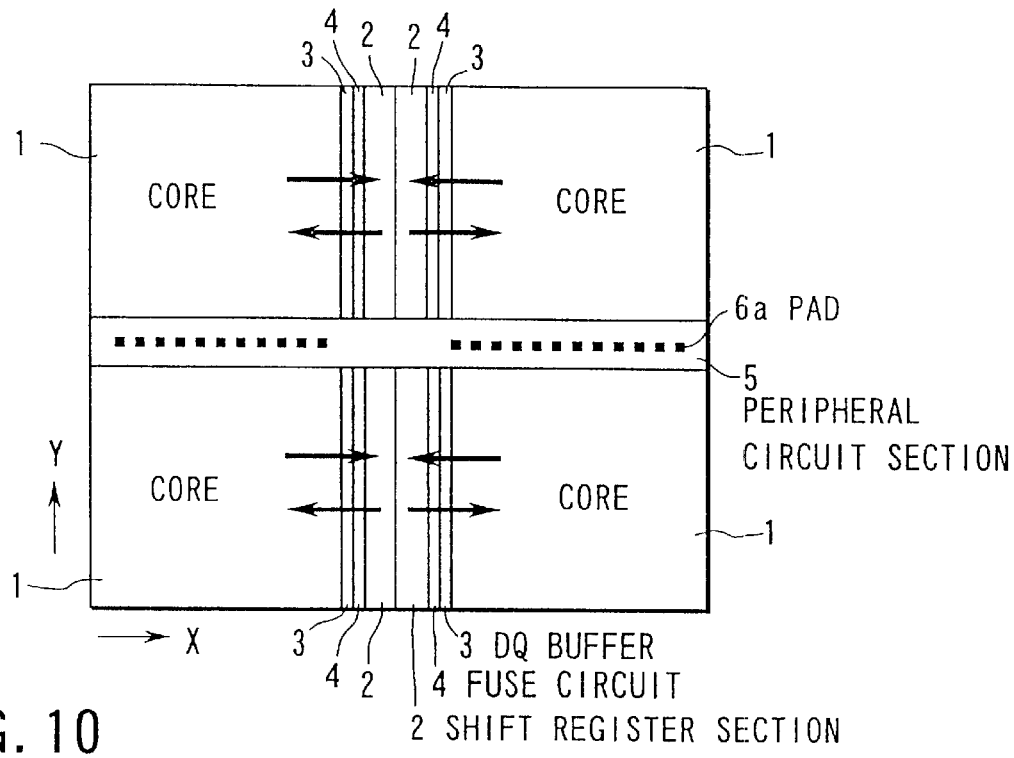
FIG. 10 shows the pattern layout of a semiconductor memory device according to a first embodiment of the present invention.

In FIG. 10, there is illustrated the layout of the main circuit of a synchronous memory according to a first embodiment of the present invention. Hereinafter, the right-and-left direction in this layout is referred to as the X direction or simply as X and the up-and-down direction is referred to as the Y direction or simply as Y.

In the conventional layout shown in FIG. 8A, the peripheral circuit section is placed in the middle in the X direction of the layout and the core and the shift register section are each placed divided into two in the Y direction. In contrast, the first embodiment is characterized by dividing the core and the shift register section into four.

In the layout of the first embodiment, as shown in FIG. 10, a peripheral circuit section 5 including pads 6a and having its longitudinal line oriented parallel to X is placed in the middle in the Y direction of a chip. The center line of the peripheral circuit section along its longitudinal line is the up-and-down symmetry axis of the chip. The layout of the first embodiment has the right-and-left (X-direction) symmetry axis located in the middle in the X direction of the chip and parallel to the Y direction.

In the first embodiment, shift register sections 2, DQ buffers 3 and fuse circuits 4 have their respective longitudinal line oriented parallel to Y and are located symmetrically with respect to the Y-direction symmetry axis.

That is, the core 1, the shift register 2, the DQ buffer 3 and the fuse circuit 4 are each partitioned into four by the up-and-down and right-and-left symmetry axes, and the longitudinal line of the shift register, the DQ buffer and the fuse circuit and the longitudinal line of the peripheral circuit section are perpendicular to each other.

Each of four shift register sections 2 is connected to a corresponding one of four cores 1. Thus, unlike the prior art, the flow of data between each core and the corresponding shift register section is in the X direction as indicated by arrows in FIG. 10.

In the conventional layout of FIG. 8A, two shift register sections 102 having their longitudinal line oriented parallel to X and extending in the X direction from one end to the other of the chip are located in the middle in the Y direction of the chip symmetrically with respect to the center line in the X direction. This configuration makes the length of interconnections the same for the upper and lower shift register sections and ensures the margin of write/read operations but imposes restrictions on the layout and results in an increase in the chip area.

In the case of the other conventional layout in which the upper and lower memory core sections share one shift register section as shown in FIG. 9, on the other hand, the chip area is reduced in comparison with the case where two shift registers are used, but the length of interconnections from each of the upper and lower memory core sections to the shared shift register section becomes different from each other. For this reason, the margin of operations of reading from and writing into the memory core section associated with longer and different length interconnections is reduced.

In writing into and reading from the synchronous memory, the shift register is used as a parallel-to-serial or serial-to-parallel converter. As the number of cascade-connected stages (FFs) in the shift register increases, the serial shift operation time increases, resulting in reduced writing/reading speed.

In the layout of the synchronous memory according to the first embodiment shown in FIG. 10, the length of the shift register sections 2 is reduced to ½ of that of the shift register sections 102 of FIG. 8A and the symmetry of interconnections (input/output data lines and signal lines) in the X direction for the cores 1 is ensured. Therefore, the writing/reading speed can be increased and the margin of write and read operations can be improved.

In addition, with the layout in which the longitudinal line of the peripheral circuit section 5 and the longitudinal line of the shift register sections 2 are perpendicular to each other as shown in FIG. 10, the restrictions on the layout can be lightened and the chip area can be reduced in comparison with the case of FIG. 8A where two shift register sections that elongate in the X direction are placed up and down in the middle in the Y direction of the chip.

Figure 11:
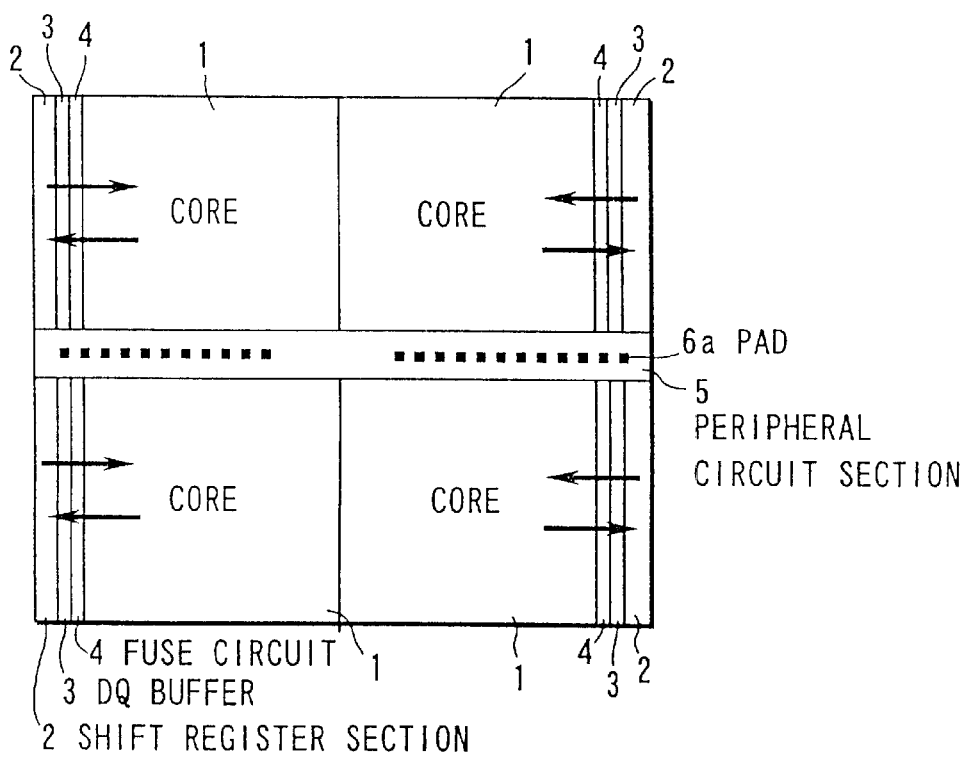
FIG. 11 shows the pattern layout of a semiconductor memory device according to a second embodiment of the present invention.

A second embodiment of the layout of the synchronous memory will be described next with reference to FIG. 11. The second embodiment remains unchanged from the first embodiment in that the peripheral circuit section 5 having its longitudinal line oriented parallel to X is located in the middle in the Y direction of the chip, the center line of the peripheral circuit section along its longitudinal line is the up-and-down symmetry axis of the chip, and the straight line located in the middle in the X-direction of the chip and parallel to Y is the right-and-left symmetry axis of the chip.

The second embodiment is distinct from the first embodiment in that the shift register sections 2, the DQ buffers 3 and the fuse circuits 4 are located at opposite ends in the X-direction of the chip. The layout of FIG. 11 provides the same advantages as the layout of FIG. 10 from the same reasons as the first embodiment.

Figure 12:
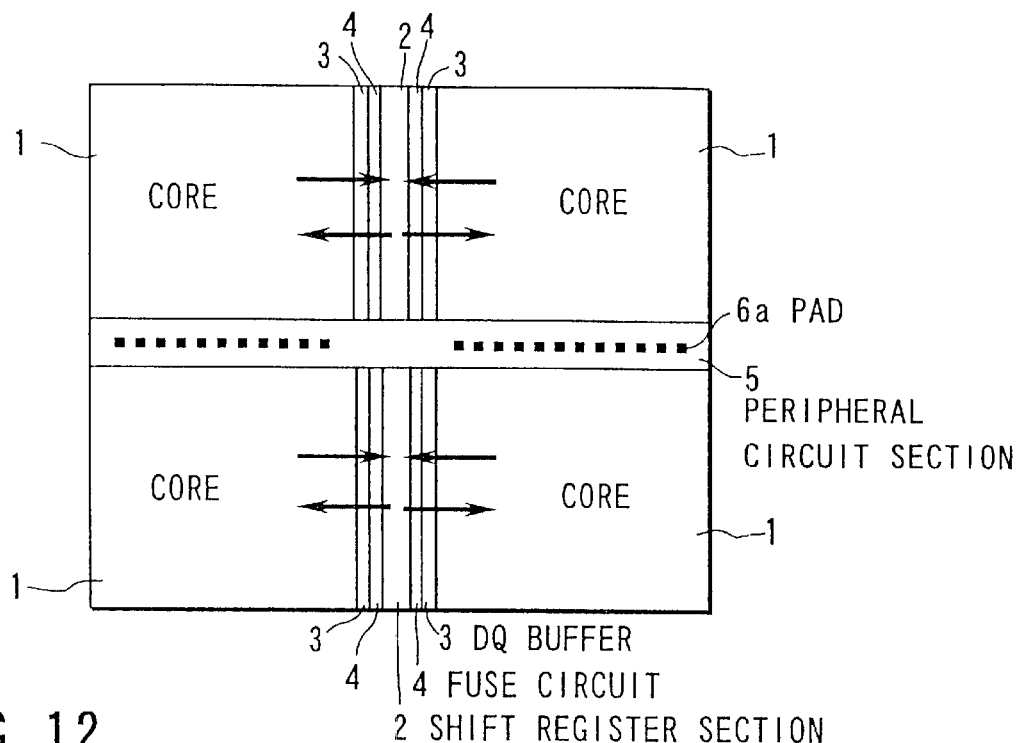
FIG. 12 shows the pattern layout of a semiconductor memory device according to a third embodiment of the present invention.

FIG. 12 shows the layout of a synchronous memory according to a third embodiment of the present invention. The third embodiment remains unchanged from the first embodiment in that the peripheral circuit section 5 having its longitudinal line oriented parallel to X is located in the middle in the Y direction of the chip, the center line of the peripheral circuit section along its longitudinal line is the up-and-down symmetry axis of the chip, and the straight line located in the middle in the X-direction of the chip and parallel to Y is the right-and-left symmetry axis of the chip.

The third embodiment is distinct from the first embodiment in that the two shift register sections 2 located on opposite sides of the right-and-left symmetry axis in FIG. 10 are replaced by a shift register section located on that symmetry axis and common to the right and left cores 1. In the third embodiment, such a common shift register section is located above and below the peripheral circuit section 5.

In the conventional layout shown in FIG. 9, the symmetry of the layout between the shift register section 102 and each of the upper and lower cores 101 is lost because the shift register section 102 is located only on one side of the peripheral circuit section 105. In the third embodiment, the shift register section 2 can be located on the right-and-left symmetry axis independently of the peripheral circuit section 5.

Thus, the symmetry of interconnections for the right and left cores can be maintained to ensure the margin of write/read operations. The configuration of the third embodiment reduces the occupied area of the shift register section to ½ of that in the first embodiment, allowing for reduced chip area.

Figure 13:
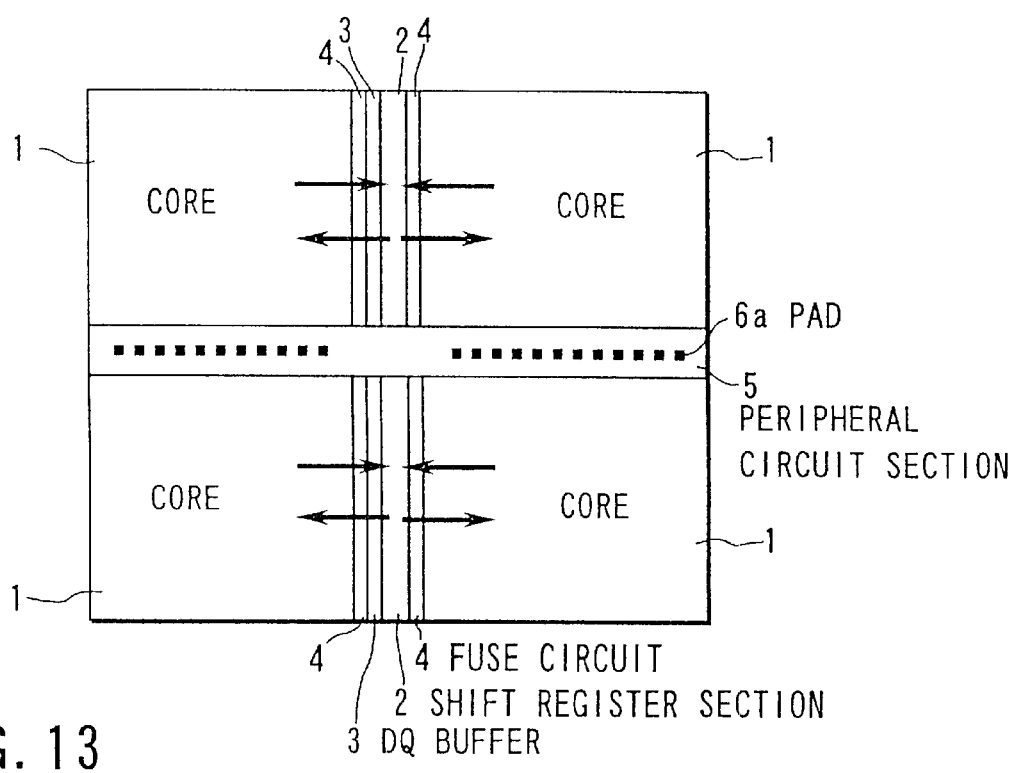
FIG. 13 shows the pattern layout of a semiconductor memory device according to a fourth embodiment of the present invention.

FIG. 13 shows the layout of a synchronous memory according to a fourth embodiment of the present invention. In the fourth embodiment, the peripheral circuit section 5 having its longitudinal line oriented parallel to X is located in the middle in the Y direction of the chip, the center line of the peripheral circuit section along its longitudinal line forms the up-and-down symmetry axis of the chip, but, unlike the third embodiment, there is no right-and-left symmetry axis.

That is, the fourth embodiment differs from the third embodiment in that not only the shift register section 2 but the DQ buffer 3 is shared by the right and left memory core sections 1.

The DQ buffer 3 is simple in construction and small in width in comparison with the shift register section 2. Even if the right-and-left symmetry of the chip is lost, therefore, the right-and-left symmetry of interconnections for the right and left memory cores 1 is almost maintained to ensure the margin of write and read operations. Since the occupied area of the DQ buffer is halved in comparison with the third embodiment, the chip size can be further reduced.

Figure 14:
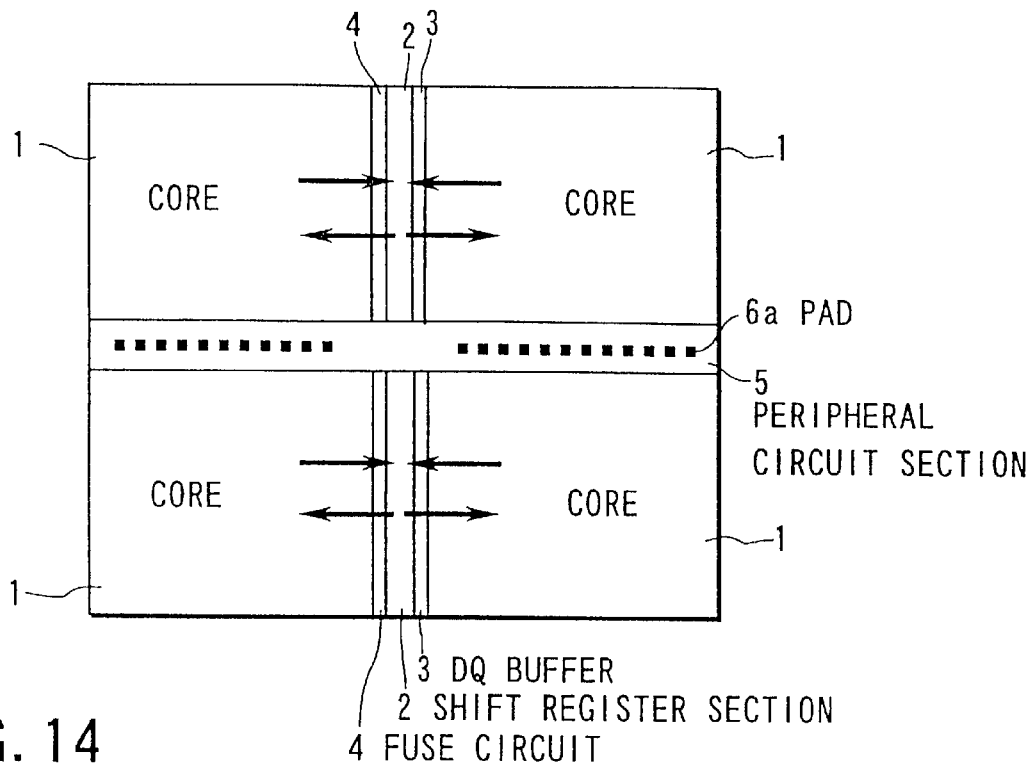
FIG. 14 shows the pattern layout of a semiconductor memory device according to a fifth embodiment of the present invention.

In FIG. 14, there is illustrated the layout of a synchronous memory according to a fifth embodiment of the present invention. In the fifth embodiment, unlike the fourth embodiment, not only the shift register section 2 and the DQ buffer 3 but also the fuse circuit 4 is shared by the right and left cores.

The fuse circuit 4 is smaller in width than the shift register section 2. Even if the right-and-left symmetry of the chip is lost, therefore, the right-and-left symmetry of interconnections for the right and left memory cores 1 is almost maintained to ensure the margin of write and read operations. Since the occupied area of the fuse circuit 4 is halved in comparison with the fourth embodiment, the chip size can be further reduced.

Figure 15:
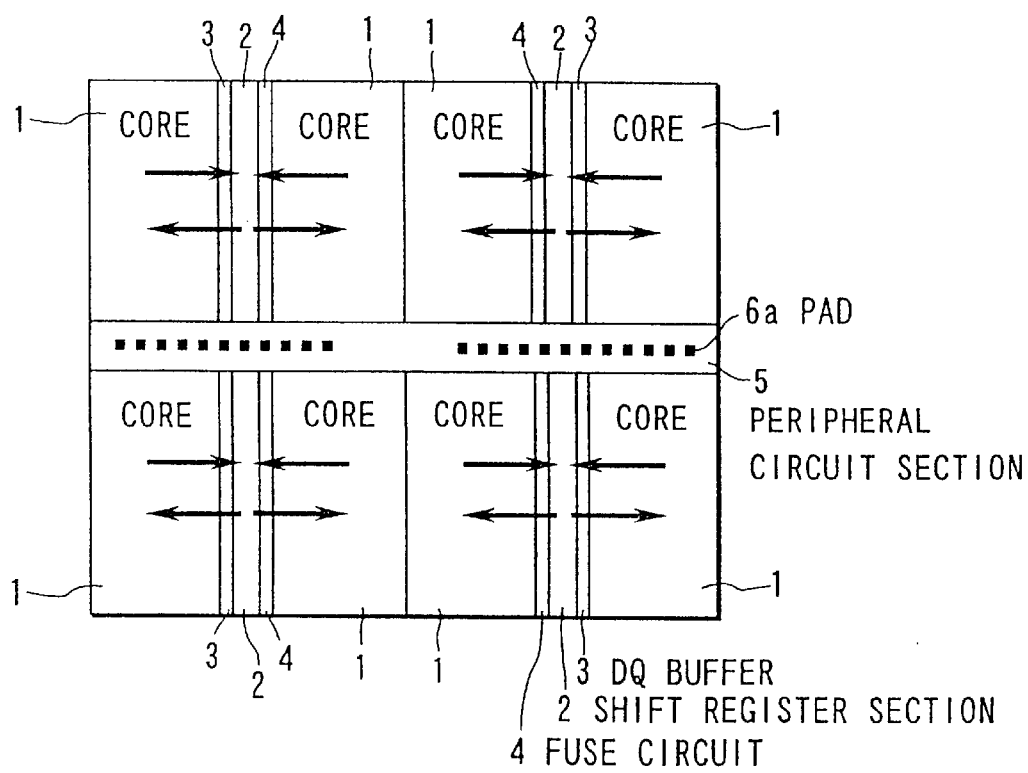
FIG. 15 shows the pattern layout of a semiconductor memory device according to a sixth embodiment of the present invention.

In FIG. 15, there is illustrated the layout of a synchronous memory according to a sixth embodiment of the present invention. The sixth embodiment is a modification of the fifth embodiment and is characterized by dividing vertically each of the four cores shown in FIG. 14 into two so that a total of eight cores results as shown in FIG. 15.

In the sixth embodiment, as with the first, second and third embodiments, the peripheral circuit section 5 having its longitudinal line oriented parallel to X is located in the middle in the Y direction of the chip, the center line of the peripheral circuit section along its longitudinal line is the up-and-down symmetry axis of the chip, and the straight line located in the middle in the X-direction of the chip and parallel to Y is the right-and-left symmetry axis of the chip. The arrangement of the shift register section 2, the DQ buffer 3 and the fuse circuit 4 that partition each core vertically is the same as in the fifth embodiment.

The fuse circuit 4 is smaller in width than the shift register section 2. The right-and-left symmetry of interconnections can be almost maintained to ensure the margin of write and read operations. In addition, since the length of input/output data lines and signal lines is reduced, the writing/reading speed can be improved in comparison with the fifth embodiment.

In each of the upper and lower portions of the chip, when the shift register section 2, the DQ buffer 3 and the fuse circuit 4 shown in FIG. 14 are each divided as shown in FIG. 15, the bit capacity of each core 1 can effectively be increased. That is, in the presence of a limitation in the subdivided unit size, an increase in chip size can be minimized. The symmetry of the arrangement of each memory core and the shift register can also be almost maintained.

So far, we have described the advantages of various layouts in terms of the operation margin and the writing/reading speed from the viewpoint of interconnections between the core and the shift register. We will next describe means for implementing faster operations from the viewpoint of the flow of input/output data and the length of interconnections (input/output data lines and signal lines) extending from the shift register section 2 through the peripheral circuit section 5 to the I/O circuit 6.

Here, the flow of input/output data in the synchronous memory will be described in detail prior to the description of such means. In FIGS. 16A, 16B, 17A and 17B, there are shown the arrangements of the shift register section 2 located between the I/O circuit and the core 1 for performing data conversion. The data conversion refers to serial-to-parallel conversion in write operation and parallel-to-serial conversion in read operation.

Each shift register 2a forming the shift register section 2 of FIG. 16A is arranged as a block corresponding to an I/O circuit as indicated by (I/O)0, (I/O)1, . . . , (I/O)7. The shift register section 2 performs data conversion of internal signals on a block-by-block basis in synchronization with the control clock signal. The circuit arrangement of each shift register 2a is shown in FIG. 16B.

The shift register 2a includes a write shift register 7 for converting internal serial write data Write0, Write1, . . . , Write7 into parallel write data WD0<0:7>, WD1<0:7>, . . . , WD7<0:7> and a read register 8 for converting internal parallel read data RD0<0:7>, RD1<0:7>, . . . , RD7<0:7> into serial read data Read0, Read1, . . . , Read7.

As shown in FIG. 16B, each of the write register 7 and the read register 8 includes eight-stage FF circuits 9. In the write register 7, serial write data Write which is eight bits long is sent to the FF circuits in synchronization with the internal write data control clock signal rclk and 8-bit parallel write data WD<0>, WD<1>, . . . , WD<7> are then output from the respective FF circuits. In the read register 8, internal 8-bit parallel read data RD<0>, RD<1>, . . . RD<7> are input to the respective FF circuits and 8-bit serial read data Read is then output in synchronization with the internal read data control clock signal tclk.

Here, the number of the FF circuits in each shift register varies according to the number of bits in each parallel or serial data.

To increase the data transfer efficiency, the write register 7 and the read register 8 may be of either a type that employs both the rising edges (for odd-numbered bits of data) and the falling edges (for even-numbered bits of data) of the internal clock signal or a type that employs either the rising edges or the falling edges.

Figure 17A:
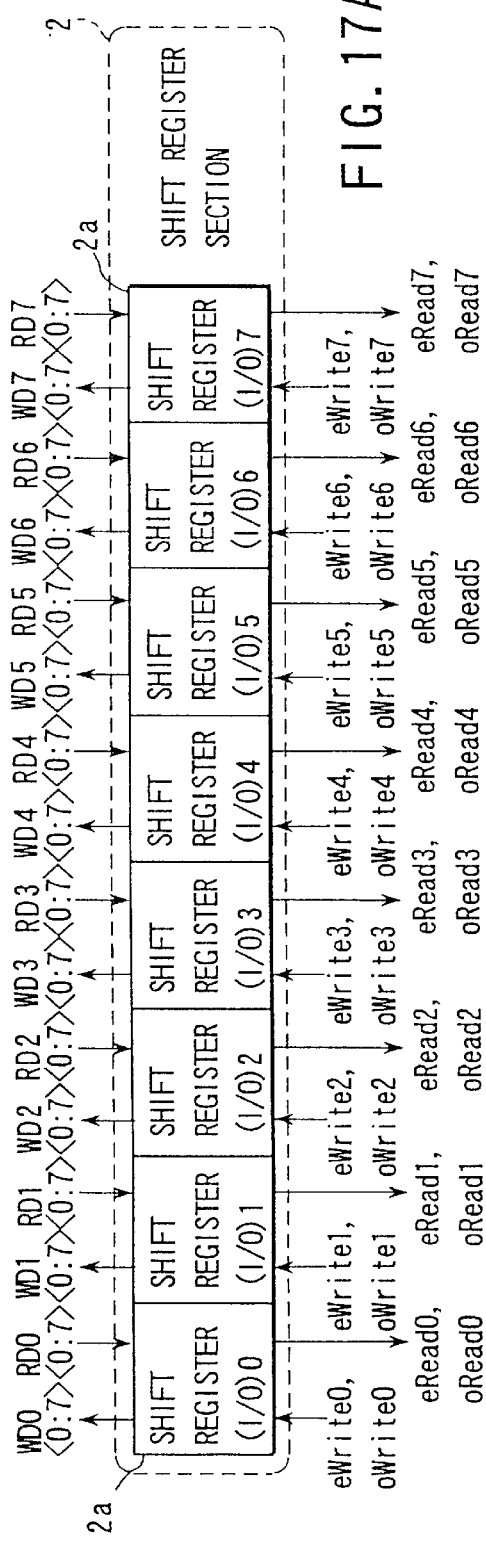
FIG. 17A shows another arrangement of the shift register section.
Figure 17B:
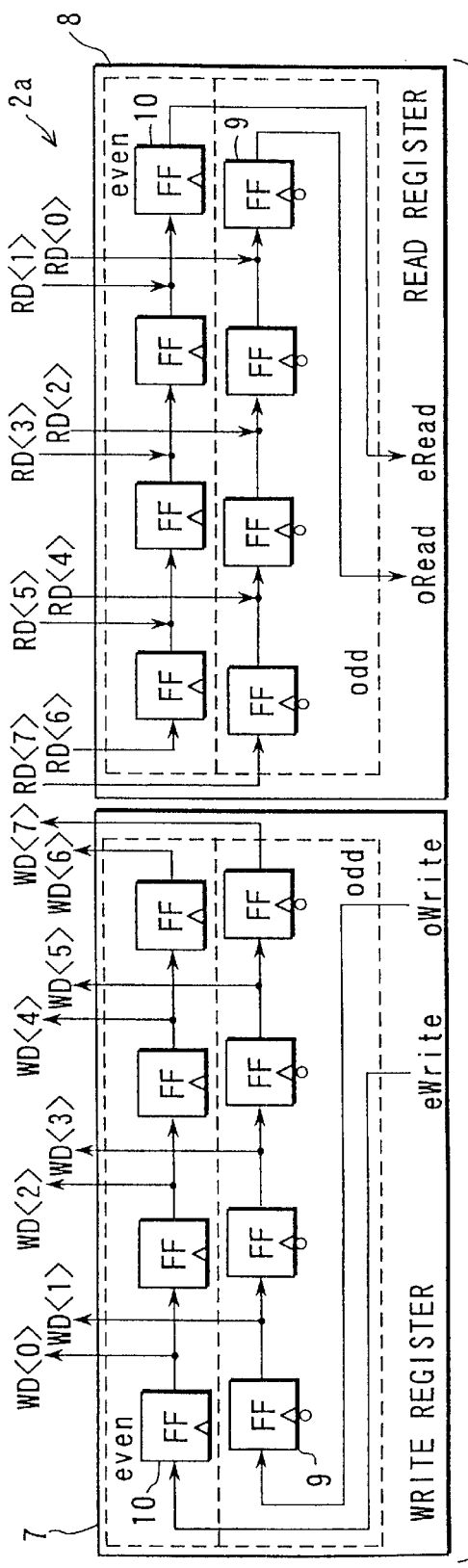
FIG. 17B shows circuit arrangements of the write register and the read register in each shift register of FIG. 17A.

FIGS. 17A and 17B show an example of a shift register that employs the rising edges of the internal clock signal for odd bits of data and the falling edges for even bits of data.

FIG. 17A shows shift register section 2 including shift registers 2a each of 8 bits. Eight-bit serial write data is divided into 4-bit serial write data of even bits eWrite0, eWrite2, . . . , eWrite6 and 4-bit serial write data of odd bits oWrite1, oWrite3, . . . , oWrite7 and then converted into 8-bit parallel write data WD0<0:7>, WD1<0:7>, . . . , WD7<0:7>.

Eight-bit parallel read data is converted into 4-bit serial read data of even bits eRead0, eRead2, . . . , eRead6 and 4-bit serial read data of odd bits oRead1, oRead3, . . . , oRead7.

As shown in FIG. 17B, each of the write register 7 and the read register 8 includes two shift registers: each register includes four-stage FF circuits 9 for odd bits of data and the other consists of four-stage FF circuits 10 for even bits of data. The FF circuits 9 operate on the rising edges of the internal control clock signal, while the FF circuits 10 trigger on the falling edges. When triggered, each FF circuit outputs a bit of data.

In the write register 7, each of 4-bit internal serial write data eWrite and oWrite is entered into a corresponding one of the shift registers in synchronization with the write data control clock signal, so that odd bits of data WD<1>, WD<3>, WD<5> and WD<7> are output in parallel from the FF circuits 9 and even bits of data WD<0>, WD<2>, WD<4> and WD<6> are output in parallel from the FF circuits 10.

In the read register 8, each of four odd bits RD<1>, RD<3>, RD<5> and RD<7> of internal parallel read data is entered into a corresponding one of the FF circuits 9 and each of four even bits RD<0>, RD<2>, RD<4> and RD<6> of the internal parallel read data is entered into a corresponding one of the FF circuits 10, so that 4-bit serial read data oRead and eRead are output from the last-stage FF circuits 9 and 10, respectively, in synchronization with the read data control clock signal tclk.

Next, the circuit arrangements and the operation of the write and read shift registers 7 and 8 will be described more specifically with reference to FIGS. 18A, 18B, 18C, 19, 20 and 21. FIGS. 18A, 18B and 18C show the circuit arrangement of the write register 7 for serial-to-parallel conversion of four bits of data.

The write register 7 includes four FF circuits 11 (FF1 to FF4) and four latch circuits 12 (latch1 to latch4). The FF circuits 11 are D-type FF circuits that take in input serial write data WRITE on the rising edges of the internal write data control clock signal rclk and output the data on the falling edges.

These four FF circuits 11 are connected in cascade and their respective outputs F1, F2, F3 and F4 are fed into the four latch circuits 12. Each of the latch circuits latches input data on a falling edge of a control signal WRTOPEN from the control logic 112 described previously in conjunction with FIG. 1 and outputs the latched data on a rising edge of the control signal. The outputs of the four latch circuits 12 provide parallel write data WD<0>, WD<1>, WD<2> and WD<3>.

FIG. 18B shows the circuit arrangement of the FF circuits 11. The write data control signal rclk is converted through inverters 15 and 16 into complementary clock signals CLK and CLKb.

Input data D to the FF circuit 11 is taken through a transfer gate, including a p-type transistor Q1 and an n-type transistor Q2 and controlled by the complementary clock signals CLK and CLKb, into a first-stage FF including cross-coupled inverters I1 and I2 when the clock signal rclk is at a low (L) level and then sent through a transfer gate, including a p-type transistor Q3 and an n-type transistor Q4 and controlled by the complementary clock signals CLK and CLKb, to the next stage FF consisting of cross-coupled inverters I3 and I4 in response to the clock signal rclk changing to a high (H) level. The output Q is thus taken from the second-stage FF.

FIG. 18C shows the circuit arrangement of the latch circuits 12. The control signal WRTOPEN is converted through inverters I10 and I11 into complementary signals EN and ENb. Input data D to the latch circuit 12 is taken through a transfer gate, including a p-type transistor Q5 and an n-type transistor Q6 and controlled by the complementary signals EN and Enb, into a latch consisting of cross-coupled inverters I7 and I8 when the control signal WRTOPEN is high and the output Q is then taken in through an inverter I9.

Figure 19:
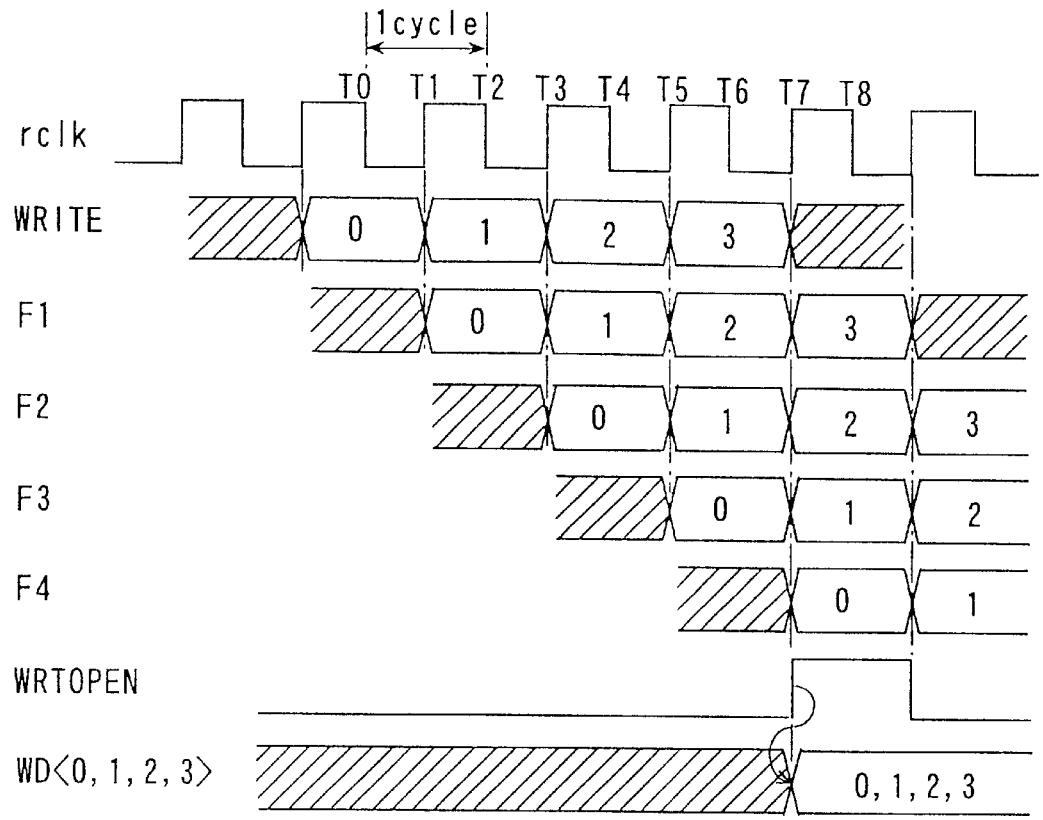
FIG. 19 is a timing diagram illustrating the operation of a write operation of the write register of FIG. 18A.

The operation of the write register 7 for serial-to-parallel conversion of four bits of data with reference to the timing diagram of FIG. 19. Internal serial data WRITE includes four bits numbered 0 through 3. The first bit 0 is taken into FF1 on the falling edge of the clock signal rclk at time T0 and then taken out of FF1 as F1 on the rising edge of the clock signal rclk at time T1.

On the next falling edge of the clock rclk at time T2, the signal F1 from FF1 is taken into FF2 and at the same time the second bit 1 is taken into FF1. On the rising edge of the clock rclk at time T3, the second bit 1 is output from FF1 as F1 and the first bit 0 is output from FF2 as F2.

By taking a bit of data into each FF on a falling edge of the clock rclk and outputting the bit of data to the next FF on a rising edge in the manner described above, four bits of data are output from the four FFs on the rising edge of the clock rclk at time T7 four cycles after time T0 at which the first bit of data was taken in.

At this point, the conversion of 4-bit serial data WRITE to parallel data WD<0:3> is accomplished by rendering the transfer gates in the latch 1 through latch 4 conductive by raising the level of the control signal WRTOPEN.

When the write register 7 is configured to operate on both the rising and falling edges of the internal clock signal rclk, a shift register merely need to be added which is arranged such that each FF takes in data on the rising edge of a clock pulse in the clock signal rclk and outputs the data on the falling edge of that clock pulse.

Figure 20:
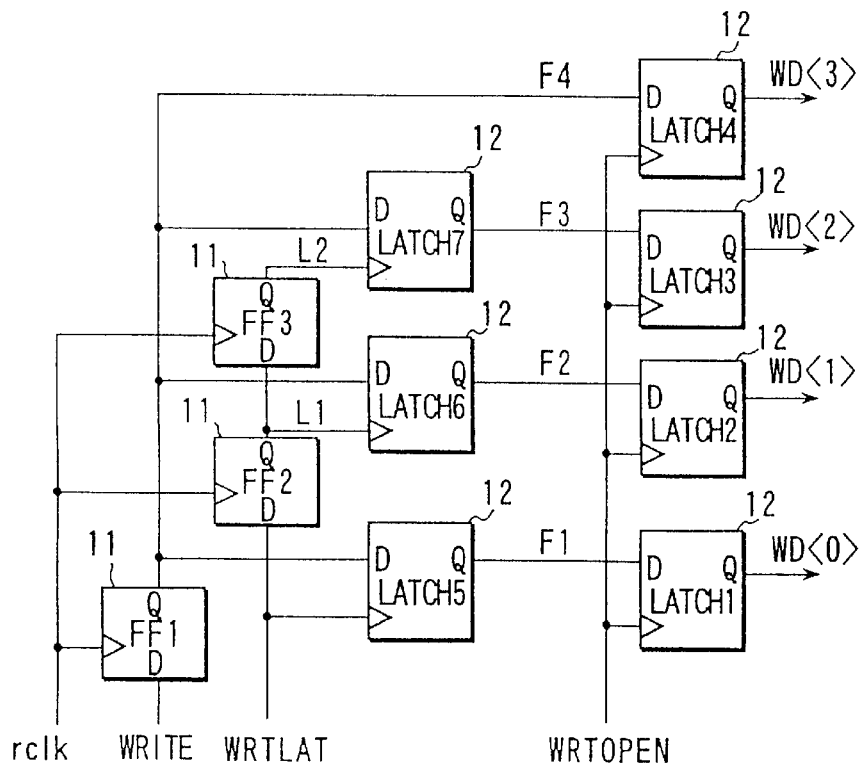
FIG. 20 shows another circuit arrangement of the write register.

FIG. 20 shows a modification of the write register shown in FIG. 18A. This write register includes three FF circuits (FF1 to FF3) 11 and seven latch circuits 12 (latch1 through latch7).

Although, in the write register of FIG. 18A, the FF circuits 11 transfer write data using the internal write data control clock signal rclk, in the circuit of FIG. 20, FF2 and FF3 transfer a latch control signal WRTLAT using the internal write data control clock signal rclk, thereby implementing serial-to-parallel conversion of write data.

Figure 21:
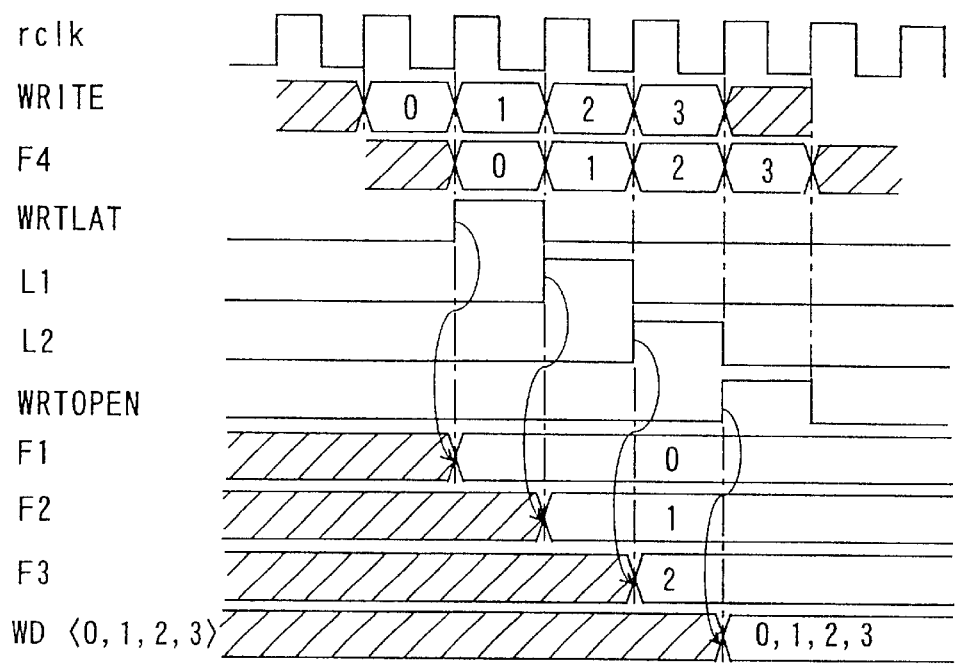
FIG. 21 is a timing diagram illustrating a write operation of the write register of FIG. 20.

Reference is made to a timing diagram shown in FIG. 21 to describe the operation of the write register of FIG. 20. Four bits of serial write data WRITE, numbered 0 to 3, are sequentially entered into FF1 (FIG. 20) in synchronization with the clock signal rclk and then sequentially output as F4 with each bit delayed by one cycle of the clock signal rclk. The output signal F4 is entered into the latch4 to latch7.

The latch control signal WRTLAT is entered into FF2 and FF3 in synchronization with the clock signal rclk. The control signal WRTLAT, the output L1 of FF2 and the output L2 of FF3 are applied to the control signal terminals of the latch5, latch6 and latch7, respectively. The write data bits numbered 0, 1 and 2 then appear at the outputs F1, F2 and F3 of the latch5, latch6 and latch7, respectively. The last bit 3 of the serial write data WRITE which was previously entered into FF1 appears at the input of the latch4 as F4.

When triggered by the control signal WRTOPEN under this condition, the latch 1 to latch 4 provide at their respective outputs write data bits WD<0> to WD<3>in parallel. Thus, serial-to-parallel conversion of write data can be implemented.

Whereas the write register shown in FIG. 18A is arranged to shift each bit of serial write data by the internal write data control clock signal rclk, the write register of FIG. 20 is configured to transfer the latch control signal WRTLAT, which determines the timing of taking each bit of serial write data into a corresponding latch, through FF circuits in synchronization with the control signal rclk. Thus, bits of serial write data can be taken into the latch circuits in required cycles and in a required arrangement.

Here, a comparison is made between the write registers shown in FIGS. 18A and 20 for the output arrangement of parallel write data WD<0> to WD<3>. For bits of input serial write data of the same order, the latch1 to latch4 in the register of FIG. 18A provide WD<3>, WD<2>, WD<1> and WD<0>, respectively. In the register of FIG. 20, on the other hand, the latch1 to latch4 provide WD<0>, WD<1>, WD<2> and WD<3>, respectively, which is the reverse of output data arrangement in FIG. 18A. Applications of the write registers of FIGS. 18A and 20 will be described later in a twelfth embodiment.

Figure 22A:
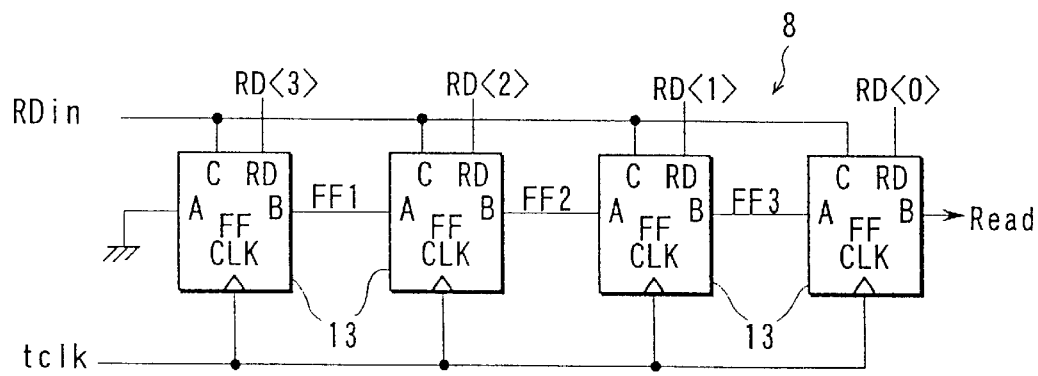
FIG. 22A shows the circuit arrangement of the read register.

The circuit arrangement of the read register 8 that provides parallel-to-serial conversion of 4-bit data is shown in FIG. 22A. The read register includes four cascade-connected FF circuits 13, which differ in circuit arrangement from the FF circuits 11 in the write register shown in FIG. 18B.

The FF circuits 13, each of which is a D-type FF that takes in input data on the falling edge of a clock pulse in the internal read data control clock signal tclk and outputs the data on the rising edge of the next clock pulse, are arranged to allow four bits of internal parallel data, RD<0> to RD<3>, to be taken in on a rising edge of the RDin signal from the control logic 112 of FIG. 1. The 4-bit internal serial read data Read is output from the last stage of the cascade connection of the four FF circuits 13.

Figure 22B:
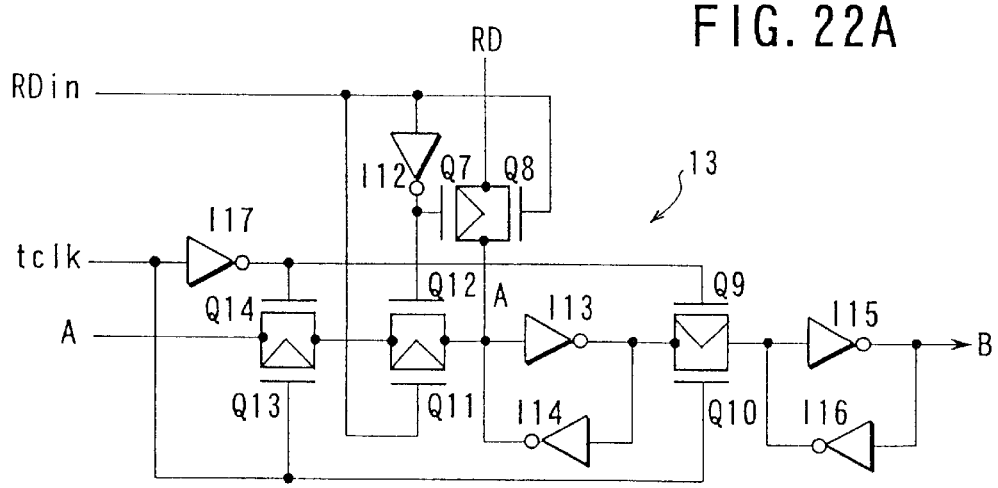
FIG. 22B shows the circuit arrangement of the FF circuit in the read register of FIG. 22A.

The circuit arrangement of each FF circuit 13 is shown in detail in FIG. 22B. When the tclk and RDin are both low, the tclk renders transmission gates Q9 and Q10 off and transmission gates Q13 and Q14 on through an inverter 117, while the RDin renders transmission gates Q7 and Q8 off and transmission gates Q11 and Q12 on through an inverter 112.

The state of input A (connected to ground as shown in FIG. 22A) of the first stage is transferred through the transmission gates Q11, Q12, Q13 and Q14 to the input of an FF including cross-coupled inverters 113 and 114 as a low level.

When the tclk goes high with RDin maintained low, the transmission gates Q9 and Q10 turn on and the transmission gates Q13 and Q14 turn off. As a result, the low state of the input A is transferred through the transmission gates Q9 and Q10 to the output B of an FF including cross-coupled inverters 115 and 116. In this manner, the state of each FF circuit 13 in the read register at the time of no entry of data RD is fixed using the clock signal tclk.

When RDin is set high at that time, the transmission gates Q7 and Q8 turn on and the transmission gates Q11 and Q12 turn off, thus allowing each of bits of internal parallel read data, RD<0> to RD<3>, to be taken into the corresponding FF consisting of inverters 113 and 114 through the RD terminal.

RDin is set next low and the bits of the parallel read data taken into the read register 8 are then transferred serially through the FF circuits using the clock signal tclk, so that the bits of the parallel read data are output in serial form.

Figure 23:
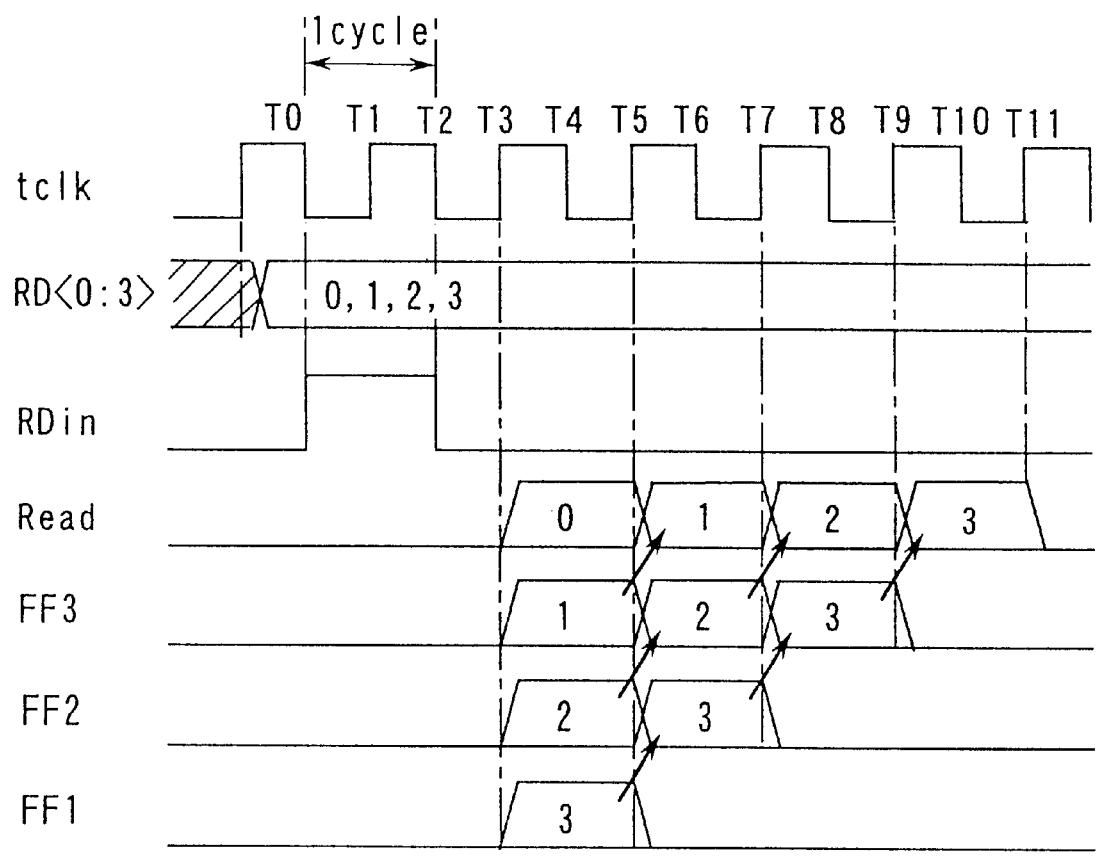
FIG. 23 is a timing diagram illustrating the operation of a read operation of the read register of FIG. 22A.

Using a timing diagram of FIG. 23, the operation of the 4-bit read register 8 will be described more specifically. At time T0, internal parallel read data RD<0:3> are read from the core 1, whereupon the RDin signal is output from the control logic 112 of FIG. 1. The bits of the parallel read data are taken into the internal nodes A of the respective FF circuits 13 on the rising edge of the RDin signal and then latched by the corresponding nodes A on the falling edge of that signal.

The bit RD<0> of the parallel read data taken into the fourth-stage FF is first output at the falling edge of the clock signal tclk at time T4. At this time, RD<3> taken into the first stage, RD<2> taken into the second stage and RD<1> taken into the third stage appear as FF1, FF2 and FF3, respectively, at the outputs of the corresponding respective FF circuits 13.

The outputs FF1, FF2 and FF3 are each taken into the next stage FF circuit 13 at the rising edge of the clock tclk at time T5 and then transferred to the next stage at the falling edge of the clock tclk at time T6. That is, the bit RD<0> of parallel read data is output as the first bit of internal serial read data Read at the falling edge at time T4 and the bit RD<3> of the parallel read data is output as the last bit of the serial read data at the falling edge at time T10 three cycles after T4. In this manner, the parallel-to-serial conversion is performed.

When the read register 8 is arranged to operate on each edge of the internal clock signal tclk, a shift register need merely be added which is arranged such that each FF takes in data on the rising edge of a clock pulse of the clock signal tclk and outputs the data on the falling edge.

So far, as described above memory data is transferred in the write/read operation of the synchronous memory. In the following seventh through twenty-second embodiments, methods of implementing yet higher speed operations in terms of the interconnection length of serial read data lines and serial write data lines that extend from the shift register section 2 through the peripheral circuit section 5 to the pads 6a included in the I/O circuit 6 and series resistance of the interconnections in the memory configuration shown in FIG. 10 by way of example are explained.

Figure 24A:
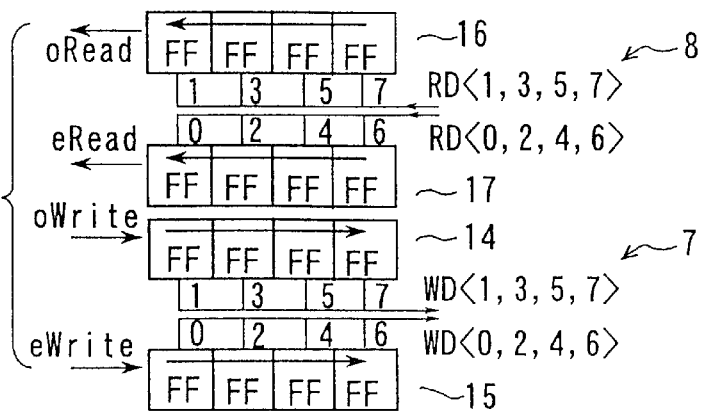
FIG. 24A shows input and output of data in the read register and the write register in accordance with a seventh embodiment.
Figure 24B:
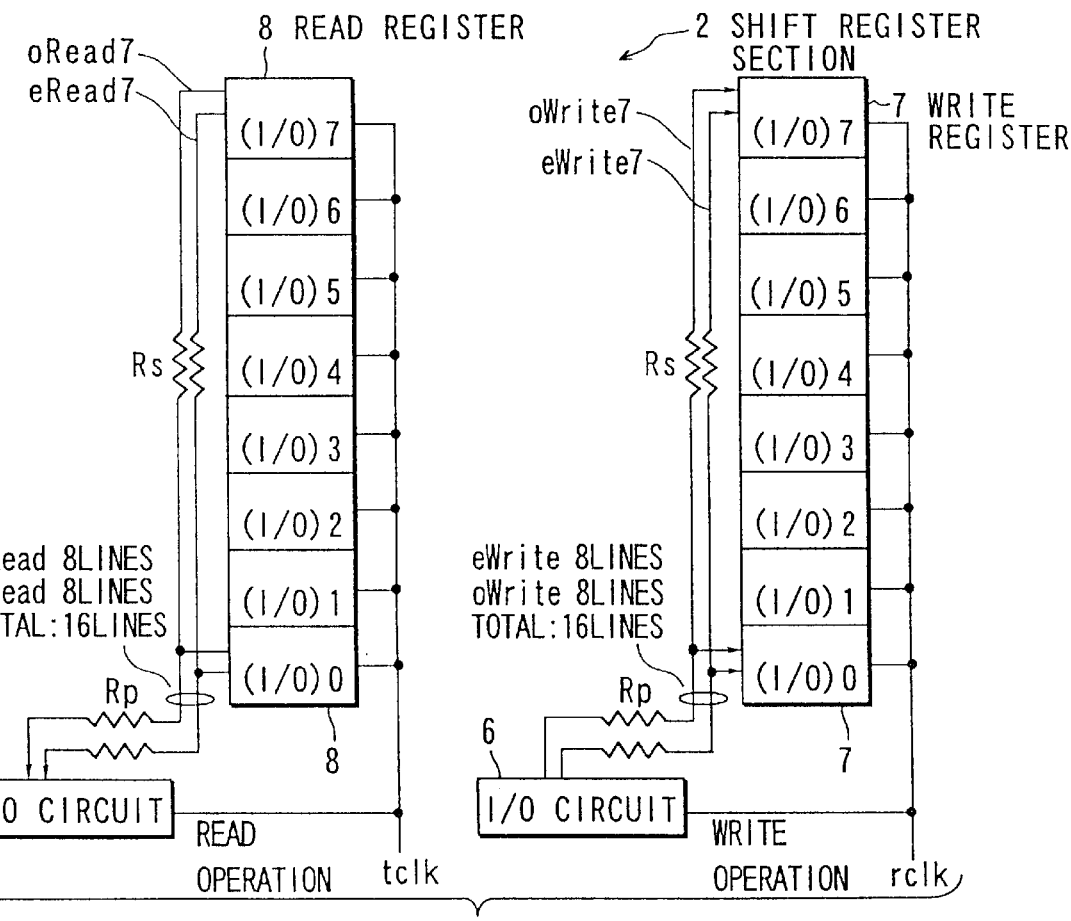
FIG. 24B shows the arrangement of the shift register section of the seventh embodiment.
Figure 24C:
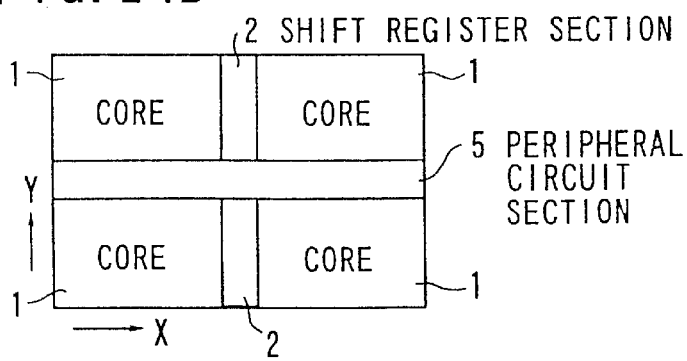
FIG. 24C is a schematic illustration of a pattern layout.

FIGS. 24A, 24B and 24C show a seventh embodiment of the present invention. Specifically, FIGS. 24A and 24B show the arrangement of the shift register section 2 in the seventh embodiment and FIG. 24C shows its disposition with respect to the cores 1 and the peripheral circuit 5.

As shown in FIG. 24A, the write register 7 of the seventh embodiment includes an odd write register 14 that receives 4-bit odd serial write data oWrite and outputs 4-bit odd parallel write data WD<1, 3, 5, 7> and an even write register 15 that receives 4-bit even serial write data eWrite and outputs 4-bit even parallel write data WD<0, 2, 4, 6>.

The read register 8 of the seventh embodiment includes an odd read register 16 that receives 4-bit odd parallel read data RD<1, 3, 5, 7> and outputs 4-bit odd serial read data oRead and an even read register 17 that receives 4-bit even parallel read data RD<O, 2, 4, 6> and outputs 4-bit even serial read data eRead.

The write register 7 operates on each edge of the write control clock signal rclk to transfer eight bits of data in four clock cycles. Likewise, the read register 8 operates on each edge of the read control clock signal tclk to transfer eight bits of data in four clock cycles.

As shown in FIG. 24B, eight read registers, each corresponding to a respective one of eight I/O circuits (I/O)0 through (I/O)7, are stacked on top of one another in the Y direction. The same is true for the write registers.

As shown in the pattern layout of FIG. 24C, two shift register sections 2, each including eight write registers and eight read registers corresponding to 16 I/O circuits, are placed in the middle in the X direction of the chip so that they are perpendicular to the peripheral circuit section 5.

Two internal serial write lines for even data eWrite and odd data oWrite extend from the I/O circuit 6 to a corresponding one of the eight write registers. Thus, a total of 16 internal serial write data lines is connected through the peripheral circuit section 5 to the eight write registers 7 with different line length for each I/O.

Two internal serial read data lines for even data eRead and odd data oRead are connected to each of the eight read registers 8. Thus, a total of 16 internal serial read data lines is connected through the peripheral circuit section 5 to the I/O circuit 6 with different line length for each I/O, where the I/O circuit 6 is included in the peripheral circuit 5.

Let the line resistance between each of the write and read registers and the peripheral circuit section 5 be Rs and the line resistance to the I/O circuit 6 through the peripheral circuit section 5 be Rp. Then, the line resistance Rs is the maximum for the farthest register from the peripheral circuit section.

However, the line resistance Rs does not damage the symmetry of data transmission time in write/read operations between the core 1 and the shift register section 2; thus, the operation margin can be maintained. In this case, however, it is required to allow for not only the line resistance Rp suffered by data passing through the peripheral circuit 5 but also the line resistance Rs that differs for each I/O.

Figure 25A:
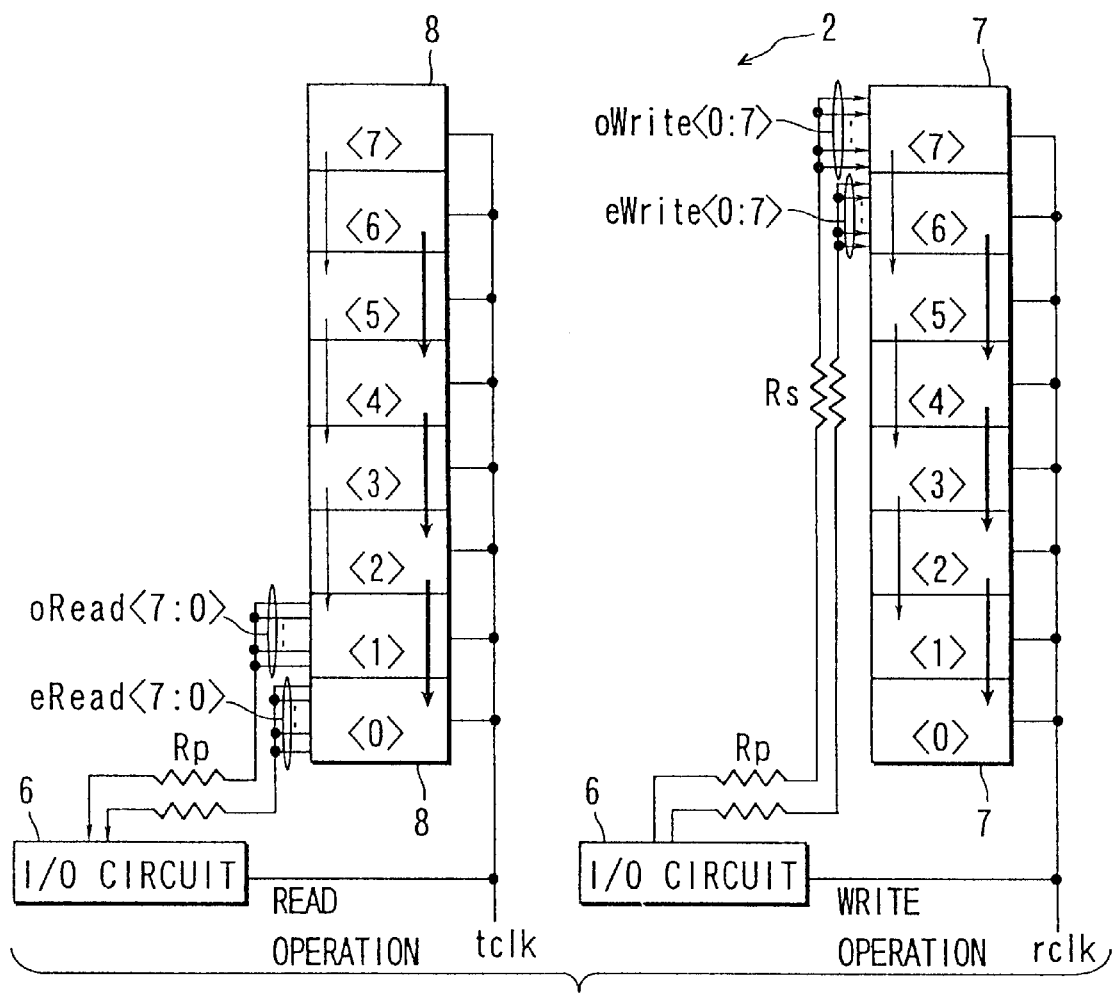
FIG. 25A shows the arrangement of the shift register section of an eighth embodiment.
Figure 25B:
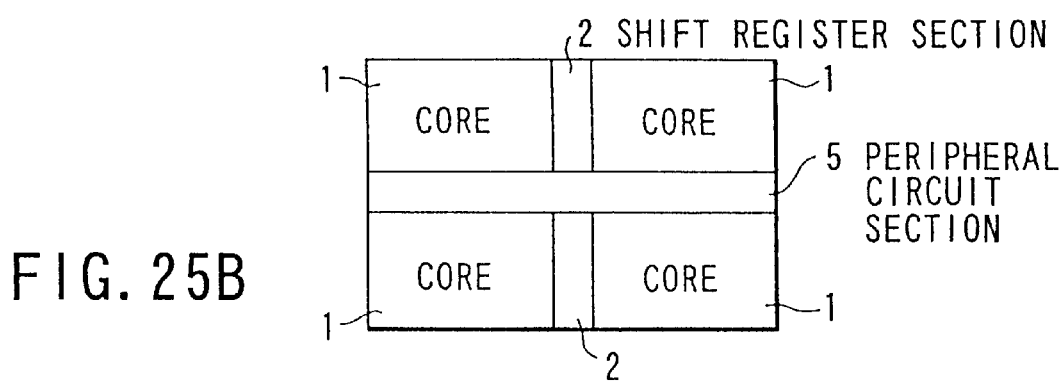
FIG. 25B is a schematic illustration of a pattern layout.

FIGS. 25A and 25B show an eighth embodiment of the present invention.

In the seventh embodiment, the write registers 7 and the read registers 8 are arranged to correspond one for one with the I/O circuits 6, which are included in the peripheral circuit section 5 shown in FIG. 25B. In the eighth embodiment, on the other hand, the write registers 7 and the read registers 8 are arranged, as shown in FIG. 25A, with eight bits of serial data <0> through <7> input or output at each edge of the internal clock signal rclk or tclk as a unit.

Data blocks of eight bits of serial data are stacked vertically with respect to the peripheral circuit 5 in ascending order of bit number, i.e., in the order of <0>, <1>, ..., <7>, thus constructing sets of write registers and read registers.

Thus, odd write data owrite <0:7> and even write data ewrite <0:7>in internal serial write data from all the I/O circuits are entered into the write data blocks <7> and <6>, respectively, which are furthest from the peripheral circuit section 5. Even read data eRead <0:7> and odd read data oRead <0:7> are read from the read data blocks <0> and <1>, respectively, which are nearest to the peripheral circuit section.

That is, as shown in FIG. 25A, the data transfer in the write and read registers 7 and 8 is made toward the peripheral circuit section. In this figure, bold arrows indicate the transfer of even data and fine arrows indicates the transfer of odd data. The same holds true through FIG. 28.

With the read register 8 thus arranged, the internal serial read data for all the I/O circuits 6 is output from the read data blocks <0> and <1> which are close to the peripheral circuit section 5, thus allowing the difference in the line length to the peripheral circuit section among the internal serial read lines to be minimized in comparison with the seventh embodiment.

The reading speed can therefore be improved because, with the internal serial read lines, it is required to allow for only the length of lines connected to the I/O circuits through the peripheral circuit section and their associated line resistance Rp.

Figure 26A:
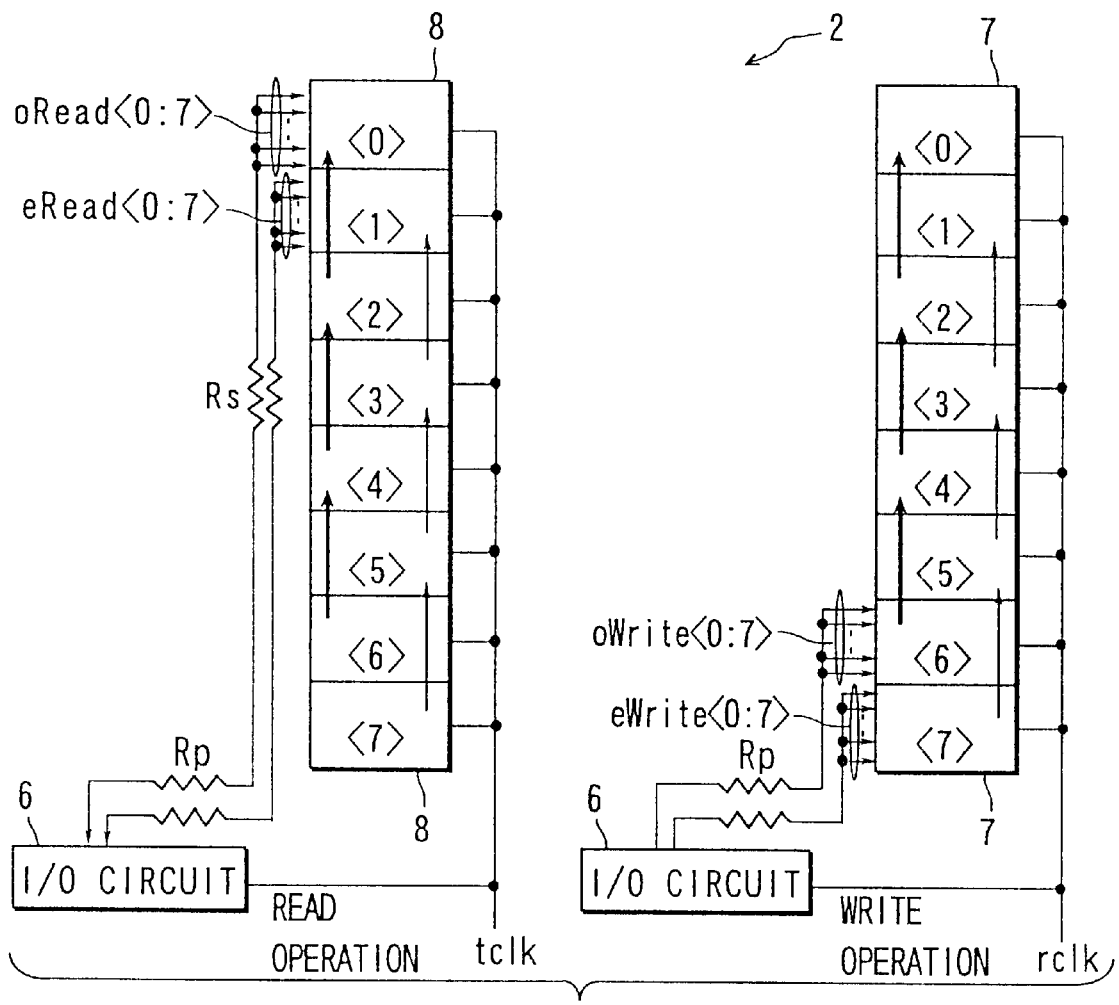
FIG. 26A shows the arrangement of the shift register section of a ninth embodiment.
Figure 26B:
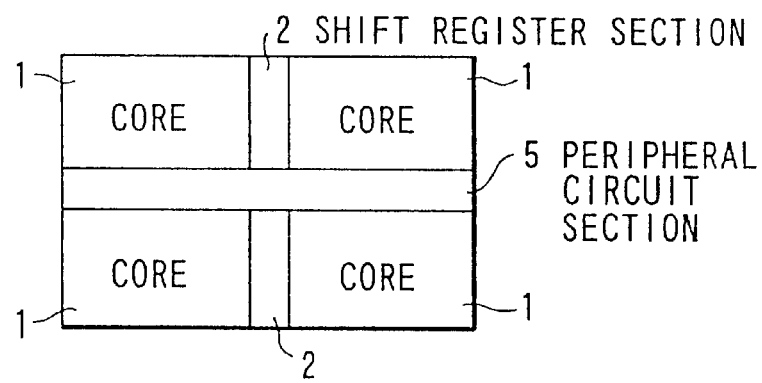
FIG. 26B is a schematic illustration of a pattern layout.

FIGS. 26A and 26B show a ninth embodiment of the present invention.

In the ninth embodiment, data blocks of eight bits of serial data are stacked vertically with respect to the peripheral circuit 5 in descending order of bit number, i.e., in the order of <7>, <6>, ..., <0>, thus constructing sets of write registers and read registers.

With the write registers 7 thus arranged, odd write data owrite <0:7> and even write data ewrite <0:7> in internal serial write data from all the I/O circuits 6, which are included in the peripheral circuit section 5 shown in FIG. 26B, are entered into the write data blocks <7> and <6>, respectively, which are closest to the peripheral circuit section 5. Even read data eRead <0:7> and odd read data oRead <0:7> are read from the read data blocks <0> and <1>, respectively, which are furthest from the peripheral circuit section. That is, as shown by arrows in FIG. 26A, data transfers are made in the direction away from the peripheral circuit section 5.

With the write register 7 thus arranged, the internal serial write data for all the I/O circuits 6 is entered into the write data blocks <6> and <7> which are close to the peripheral circuit section 5, thus allowing the difference in the line length to the peripheral circuit section among the internal serial write lines to be minimized in comparison with the seventh embodiment.

The writing speed can therefore be improved because it is required to allow for only the length of lines from the I/O circuit to the write data blocks <6> and <7> and their associated line resistance Rp.

Figure 27A:
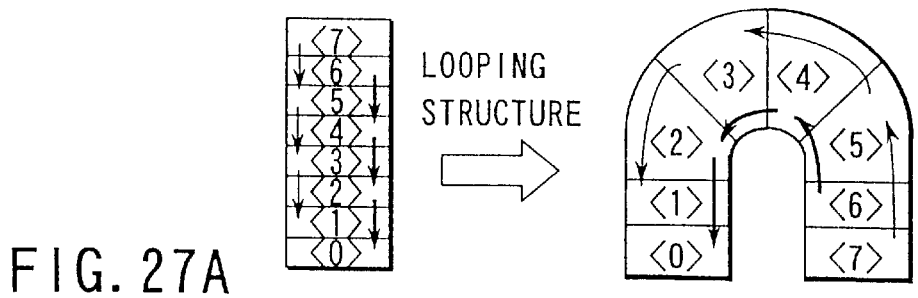
FIG. 27A shows the principle of a shift register section having looping structure.
Figure 27B:
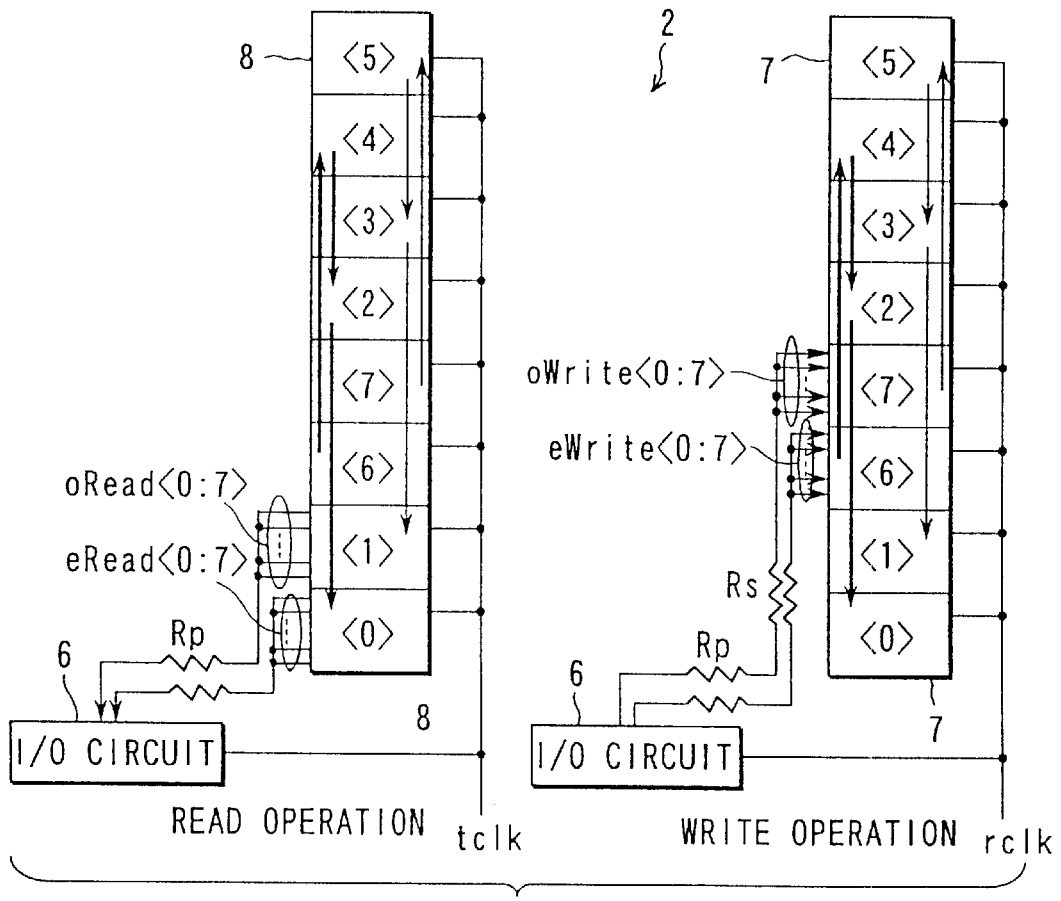
FIG. 27B shows the arrangement of a shift register section according to a tenth embodiment of the present invention.
Figure 27C:
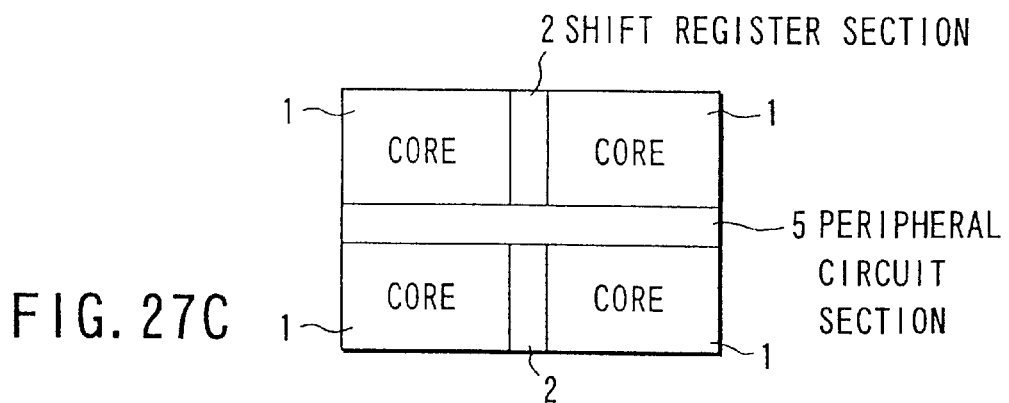
FIG. 27C is a schematic illustration of a pattern layout.

FIGS. 27A, 27B and 27C show a tenth embodiment of the present invention. In the tenth embodiment, as shown in FIGS. 27A and 27B, data blocks each of which has eight bits of serial data grouped as a unit are stacked vertically with respect to the peripheral circuit section so that the flow of data transfer forms a loop, thus constructing sets of write registers and read registers.

FIG. 27A shows registers in which data blocks are stacked in the order of <0>, <1>, <2>, . . . , <7> and a method of turning back the data flow from the direction away from the peripheral circuit section to the direction toward the peripheral circuit section by bending the stack of registers into a reverse U shape as indicated by an arrow as "looping structure".

The turning back of data flow direction can be equivalently implemented by changing the way to stack the data blocks as indicated by arrows in the write registers 7 and the read registers 8 in FIG. 27B without bending the registers.

With the write registers and the read registers thus arranged, the internal serial write data ewrite <0:7> and owrite <0:7>can be entered into the write data blocks <6> and <7>, respectively, which are relatively close to the peripheral circuit section 5 including I/O circuit 6. On the other hand, the serial read data eRead<0:7> and oRead<0:7> can be output from the read data blocks <0> and <1>, respectively, which are closest to the peripheral circuit section 5 including I/O circuits 6.

That is, with the tenth embodiment, the length of the internal serial read data lines to the peripheral circuit section can be minimized such that their associated line resistance Rs can be neglected. At the same time, the length of the internal serial write data lines to the peripheral circuit section can be reduced to decrease their associated line resistance Rs significantly.

Figure 28A:
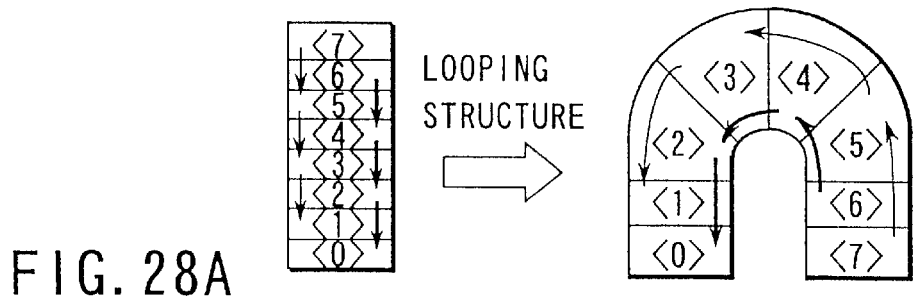
FIG. 28A shows the principle of a shift register section having looping structure.
Figure 28B:
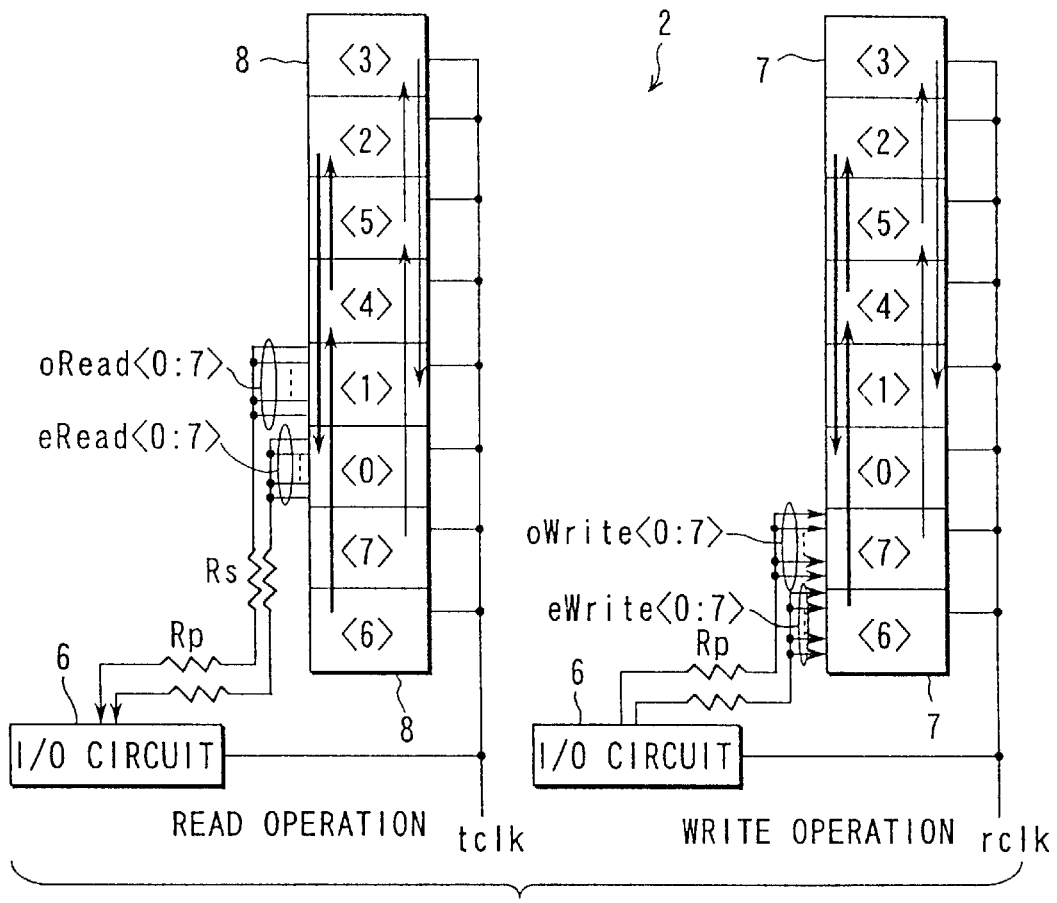
FIG. 28B shows the arrangement of a shift register section according to an eleventh embodiment of the present invention.
Figure 28C:
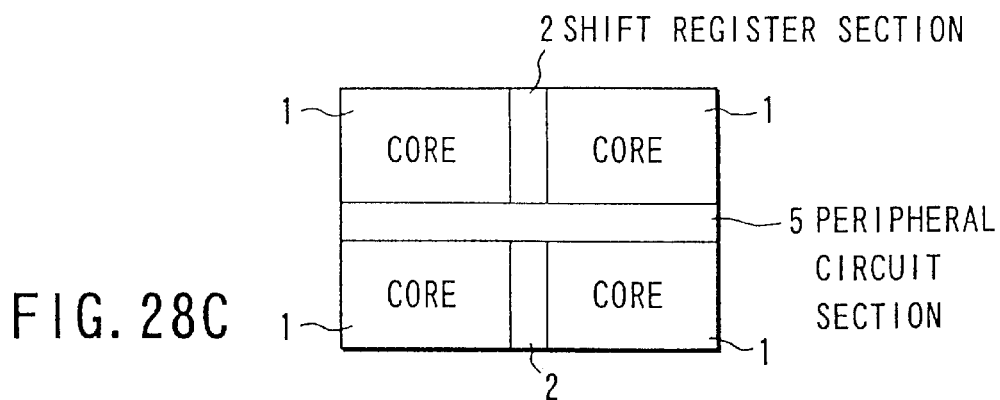
FIG. 28C is a schematic illustration of a pattern layout.

FIGS. 28A, 28B and 28C show an eleventh embodiment of the present invention, which is a modification of the tenth embodiment. In the eleventh embodiment, as shown in FIGS. 28A and 28B, data blocks each of which has eight bits of serial data grouped as a unit are stacked vertically with respect to the peripheral circuit section so that data transfer is made to form a loop, thus constructing stacks of write registers 7 and read registers 8.

The eleventh embodiment is distinct from the tenth embodiment in that the internal serial write data ewrite <0:7> and owrite <0:7> are entered into the write data blocks <6> and <7>, respectively, which are closest to the peripheral circuit section 5 including I/O circuits 6, while the serial read data eRead<0:7> and oRead<0:7> are output from the read data blocks <0> and <1>, respectively, which are relatively close to the peripheral circuit section 5 including I/O circuits 6.

The eleventh embodiment allows the length of the internal serial write data lines to the peripheral circuit section to be minimized such that their associated line resistance Rs can be neglected and, at the same time, the length of the internal serial read data lines to the peripheral circuit section to be reduced to decrease their associated line resistance Rs significantly.

Figure 29A:
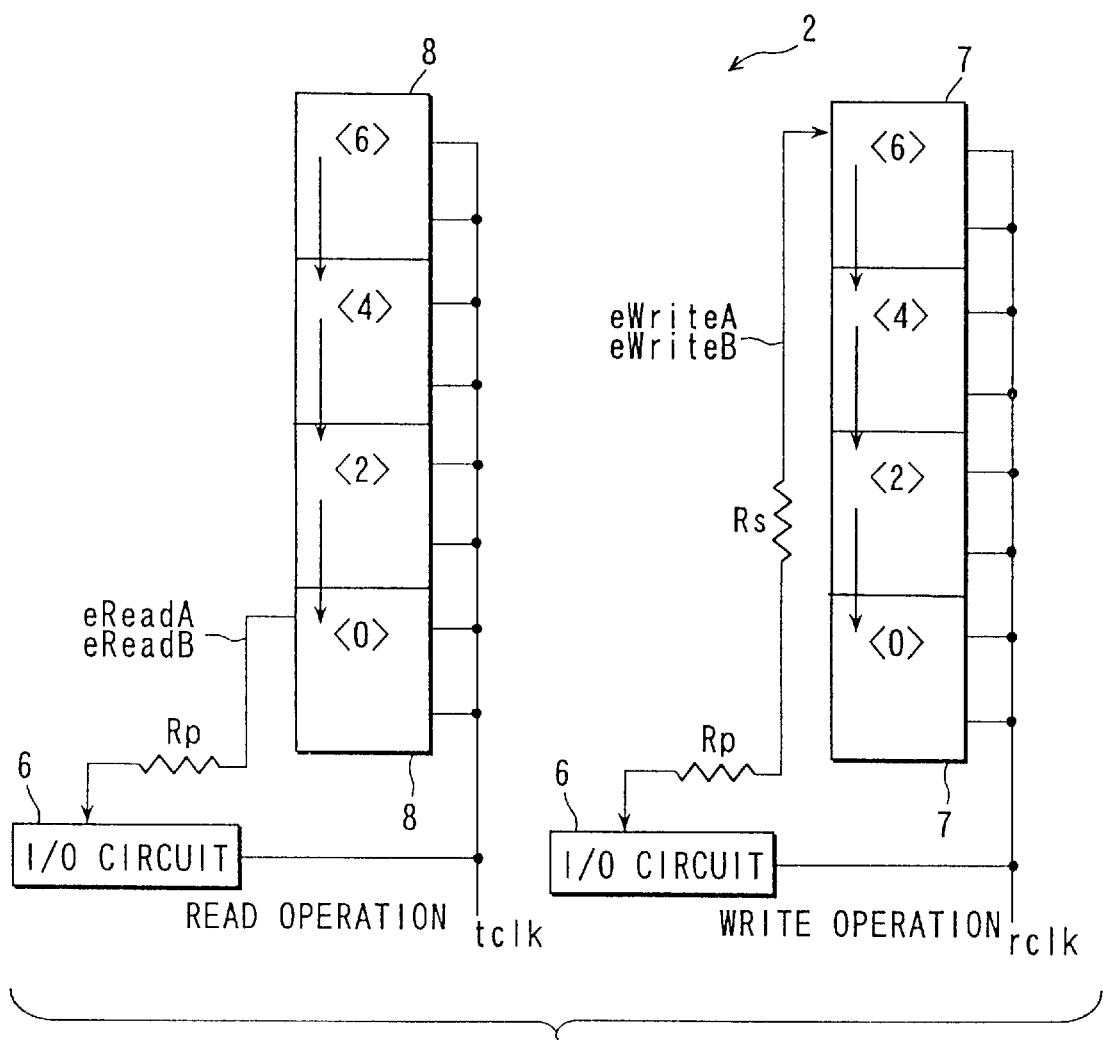
FIG. 29A shows the arrangement of a shift register section according to a twelfth embodiment of the present invention.
Figure 29B:
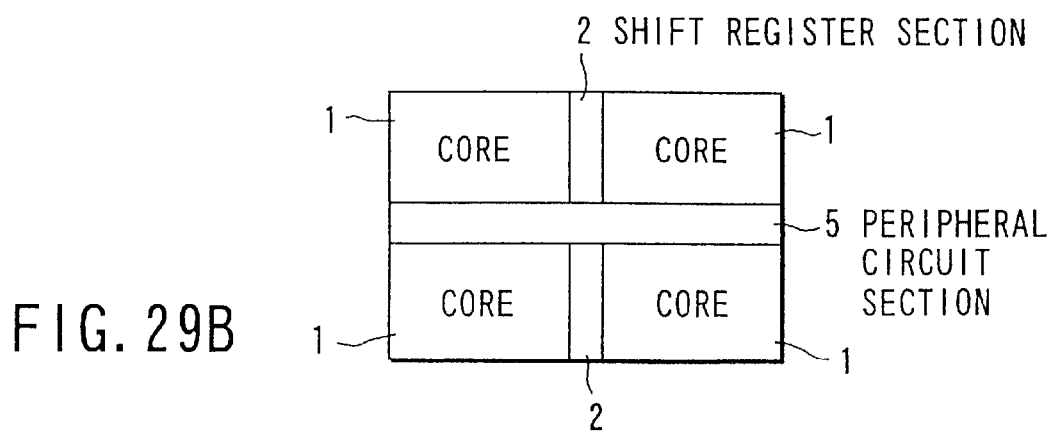
FIG. 29B is a schematic illustration of a pattern layout.

FIGS. 29A and 29B show a twelfth embodiment of the present invention. In the twelfth embodiment, as in the eighth embodiment, the shift register section 2 is formed from data blocks in which serial data is grouped as a unit. In this embodiment, only even data blocks <0>, <2>, <4> and <6> are stacked vertically with respect to the peripheral circuit section in the order of <0>, <2>, <4> and <6> to form an even shift register for even data as shown in FIG. 29A. And moreover, only odd data blocks <1>, <3>, <5> and <7>, though not shown, are stacked vertically with respect to the peripheral circuit section in the order of <1>, <3>, <5> and <7>to form an odd shift register for odd data. That is, the twelfth embodiment has a distinguished feature that the even shift register and the odd shift register are formed separately.

By placing the shift register section 2 thus arranged above and below the peripheral circuit section 5 as shown in FIG. 29B, the internal serial data lines and signal lines for even data and the internal serial data lines and signal lines for odd data are separated completely, which protects these data and signal lines for even and odd data from mutual interference and ensures the symmetry of data lines and signal lines from the shift register section to all the I/O circuits which are included in the peripheral circuit section 5 shown in FIG. 29B.

As to internal serial read data, even data are output from the closest block <0> to the peripheral circuit section and odd data are output from the closest block <1> to the peripheral circuit section. Thus, the wiring resistance Rs to the peripheral circuit section will offer no problem.

Figure 30A:
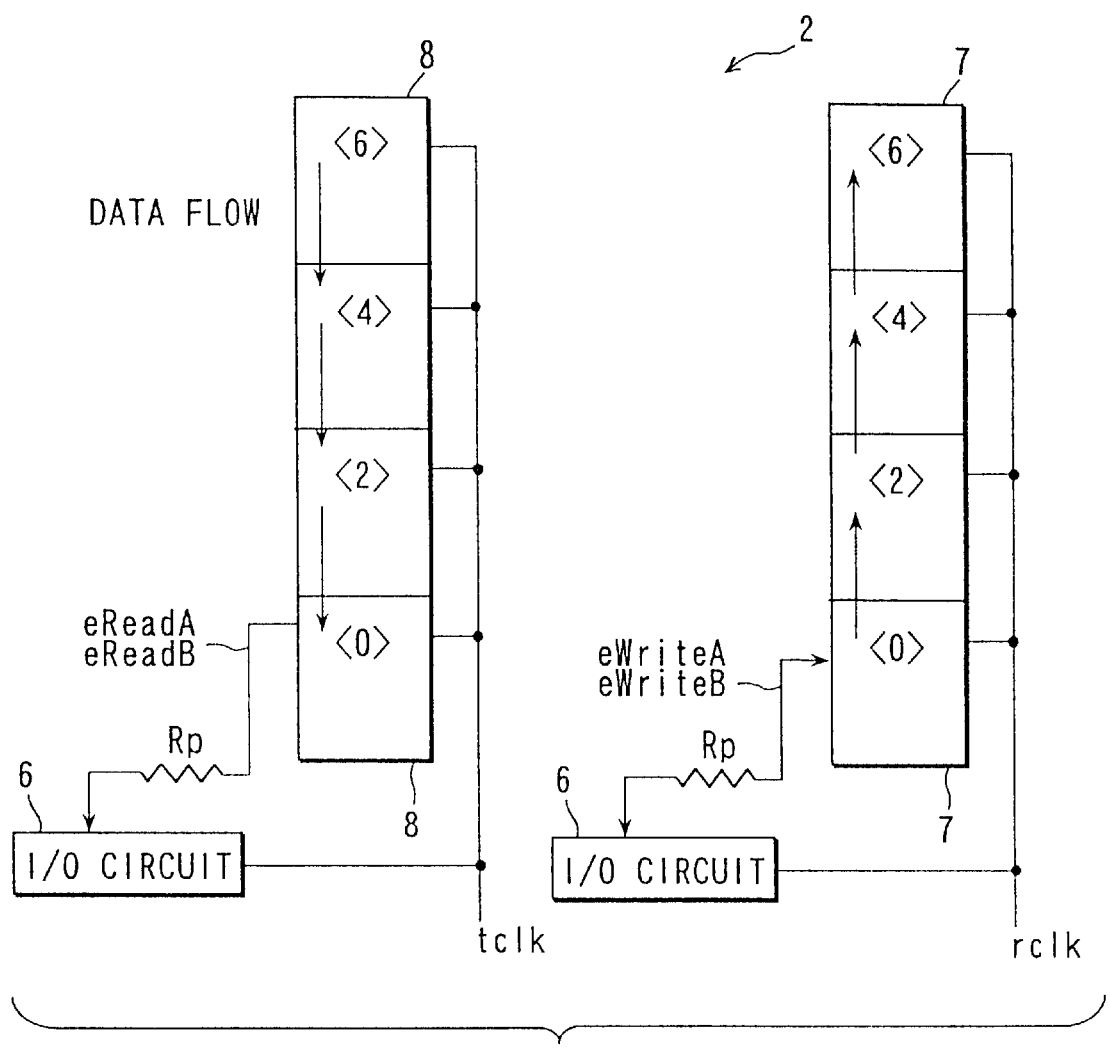
FIG. 30A shows the arrangement of a shift register section according to a modification of the twelfth embodiment.
Figure 30B:
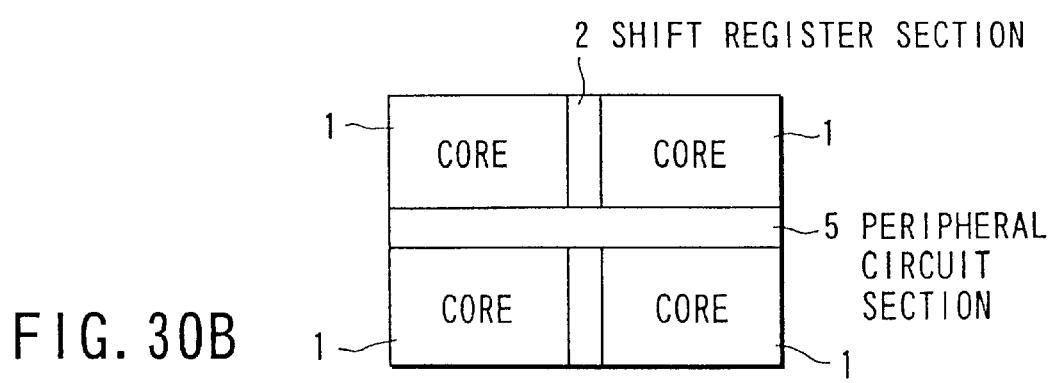
FIG. 30B is a schematic illustration of a pattern layout.

FIGS. 30A and 30B show a modification of the twelfth embodiment. As in the twelfth embodiment, in this example, only even data blocks <0>, <2>, <4>and <6> are stacked vertically with respect to the peripheral circuit section in the order of <0>, <2>, <4> and <6> to form an even shift register for even data as shown in FIG. 30A and, though not shown, only odd data blocks <1>, <3>, <5> and <7> are stacked vertically with respect to the peripheral circuit section in the order of <1>, <3>, <5> and <7> to form an odd shift register for odd data. That is, the even shift register and the odd shift register are constructed as separate devices.

However, unlike the twelfth embodiment in which the write register described in conjunction with FIG. 18A is used, the modification of FIG. 30A has a distinguished feature that the write register described in conjunction with FIG. 20 is used as the write register 7.

As described previously, the arrangement of parallel write outputs of the write register of FIG. 18A is opposite to that of the write register of FIG. 20 for the same serial write data input. Therefore, by entering write data into the closest block <0> to the peripheral circuit section as shown in FIG. 30 and by transferring the latch control signal WRTLAT through the FF circuits as indicated in FIG. 20, the flow of data from block <0> to block <6>can be obtained.

The same is true of the odd blocks. Thus, eWrite (oWrite) and eRead (oRead) for each I/O circuit, which is included in the peripheral circuit, can be input to and output from the data blocks <0> (<1>) which are closest to the peripheral circuit, thus allowing the removal of the wiring resistance Rs associated with all the internal serial read and write lines.

Figure 31A:
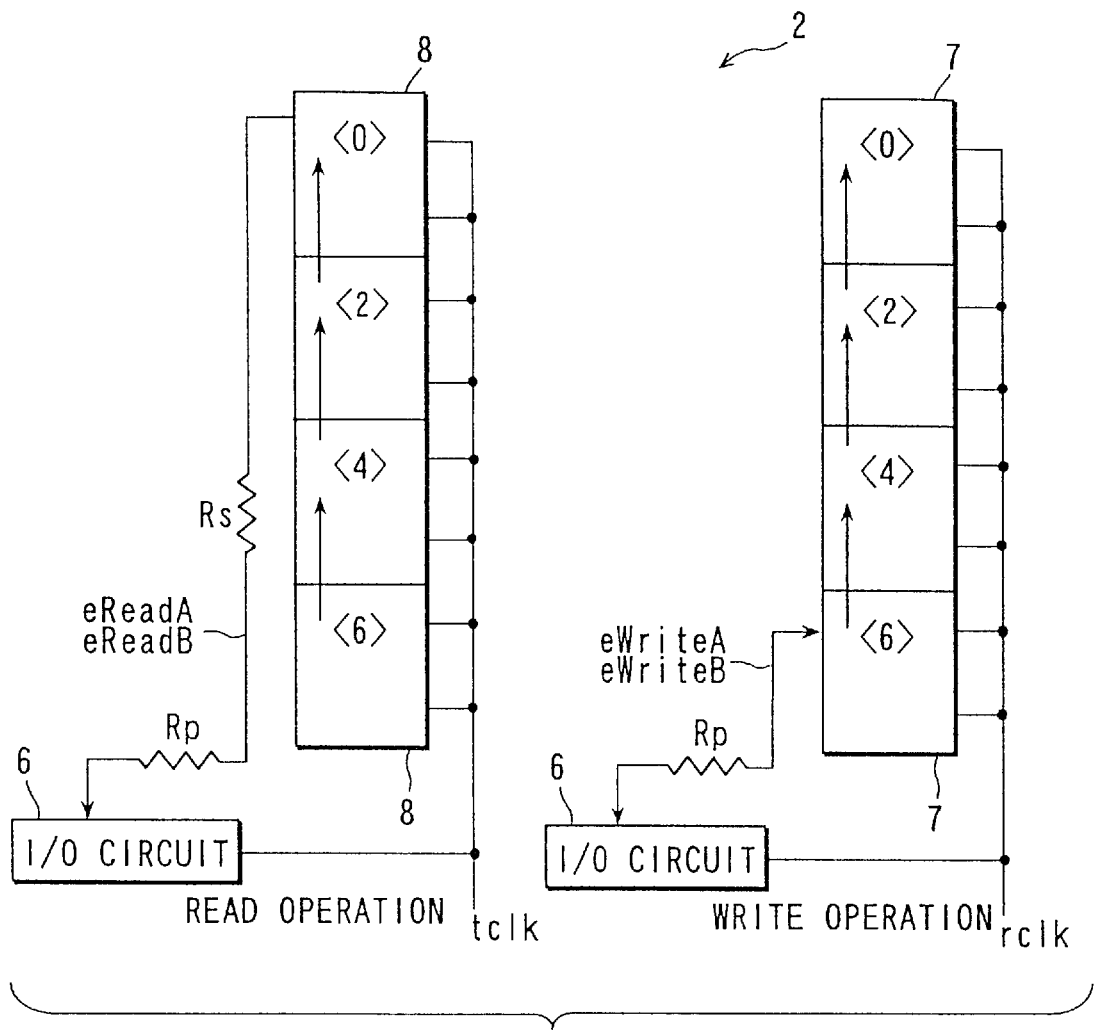
FIG. 31A shows the arrangement of a shift register section according to a thirteenth embodiment of the present invention.
Figure 31B:
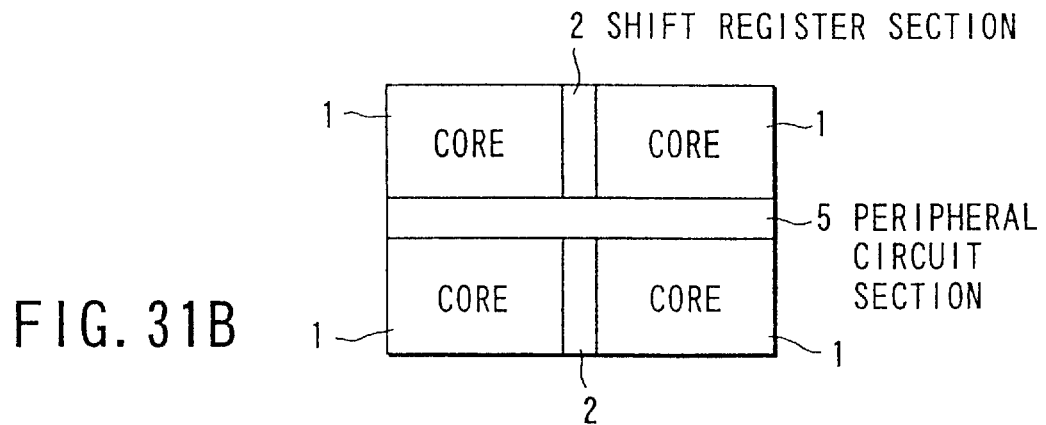
FIG. 31B is a schematic illustration of a pattern layout.

FIGS. 31A and 31B show a thirteenth embodiment of the present invention. In the thirteenth embodiment, as in the twelfth embodiment, the shift register section 2 is formed from data blocks in which serial data are grouped as a unit. In this embodiment, only even data blocks <6>, <4>, <2> and <0> are stacked vertically with respect to the peripheral circuit section in the order of <6>, <4>, <2> and <0> to form an even shift register for even data as shown in FIG. 31A and, through not shown, only odd data blocks <7>, <5>, <3> and <1> are stacked vertically with respect to the peripheral circuit section in the order of <7>, <5>, <3> and <1> to form an odd shift register for odd data. That is, the twelfth embodiment has a distinguished feature that the even shift register and the odd shift register are formed separately.

By placing the shift register section 2 thus arranged above and below the peripheral circuit section 5 including I/O circuits 6 as shown in FIG. 31B, the internal serial data lines and signal lines for even data and the internal serial data lines and signal lines for odd data are separated completely, which protects these data and signal lines for even and odd data from mutual interference and ensures the symmetry of data lines and signal lines from the shift register section to all the I/O circuits.

As to internal serial write data, even data are input to the closest block <6> to the peripheral circuit section and odd data are input to the block <7>. Thus, the wiring resistance Rs from the peripheral circuit section will offer no problem.

Figure 32A:
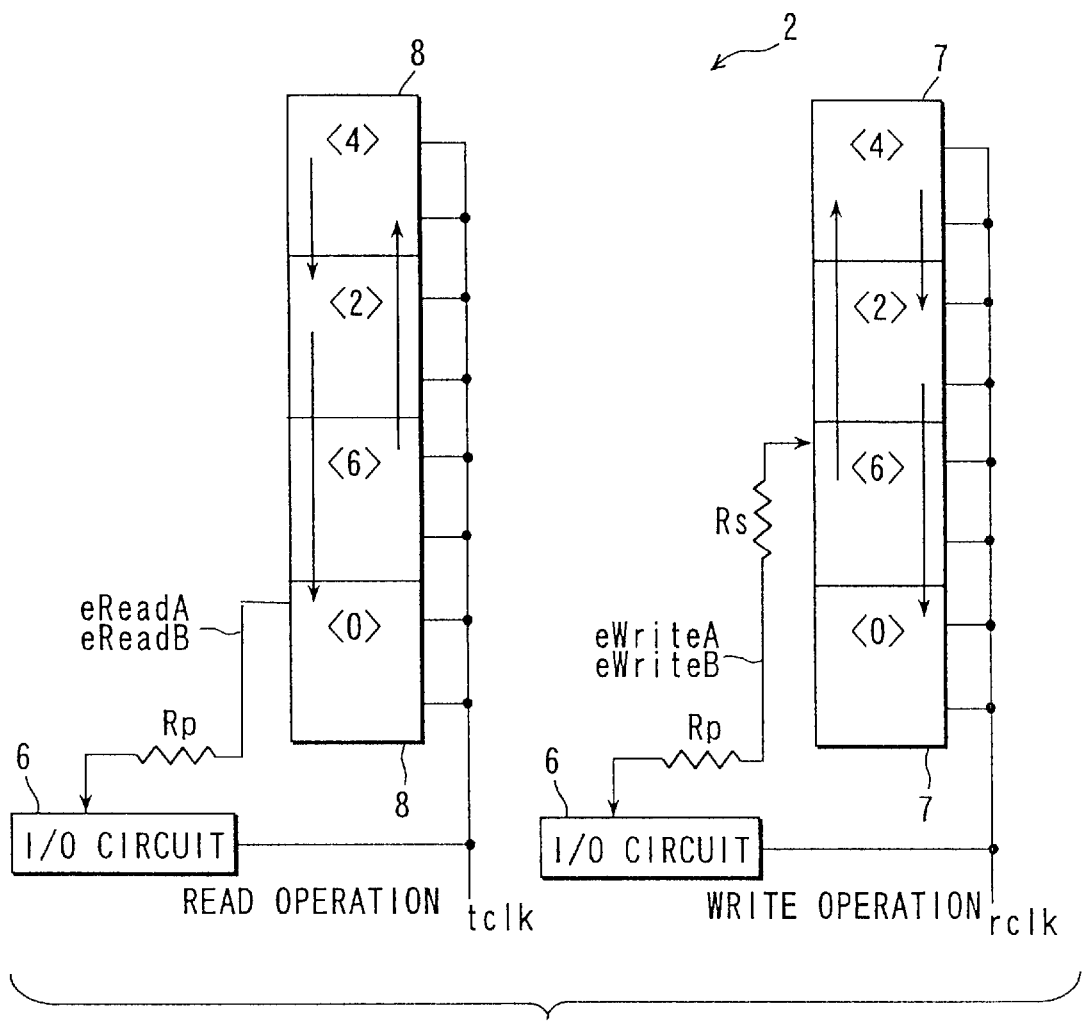
FIG. 32A shows the arrangement of a shift register section according to a fourteenth embodiment of the present invention.
Figure 32B:
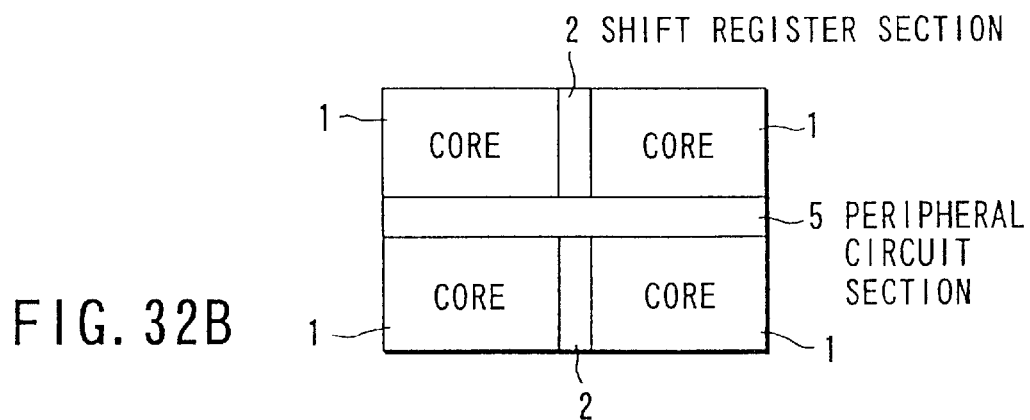
FIG. 32B is a schematic illustration of a pattern layout.

FIGS. 32A and 32B show a fourteenth embodiment of the present invention.

In the fourteenth embodiment, as shown in FIG. 32A, blocks are stacked so that data transfer is made in the form of a loop and the even and odd shift registers are formed separately. Note that the odd shift register is not shown in FIG. 32A.

By stacking even data blocks in the order of <0>, <6>, <2> and <4> and odd data blocks (not shown) in the order of <1>, <7>, <3> and <5>, data transfer can be made in the form of a loop as indicated by arrows in FIG. 32A.

The separation of serial lines into even lines for even bits of data and odd lines for odd bits of data protects data and signal from mutual interference and ensures the symmetry of data lines and signal lines of the shift register section to all the I/O circuits. As to internal serial read data, even data (even bits of data) are output from the closest block <0> to the peripheral circuit section and odd data (odd bits of data) are output from the block <1>. Thus, the wiring resistance Rs from the shift register to the peripheral circuit section including I/O circuits will offer no problem.

As to internal serial write data as well, the length of interconnections from the peripheral circuit section including I/O circuits can be reduced significantly because of data transfer in loop form.

If the formation of the write register described in conjunction with FIG. 30A as a modification of the twelfth embodiment is possible in layout, then the interconnection length from the peripheral circuit section can be further reduced even with no data transfer in loop form.

Figure 33A:
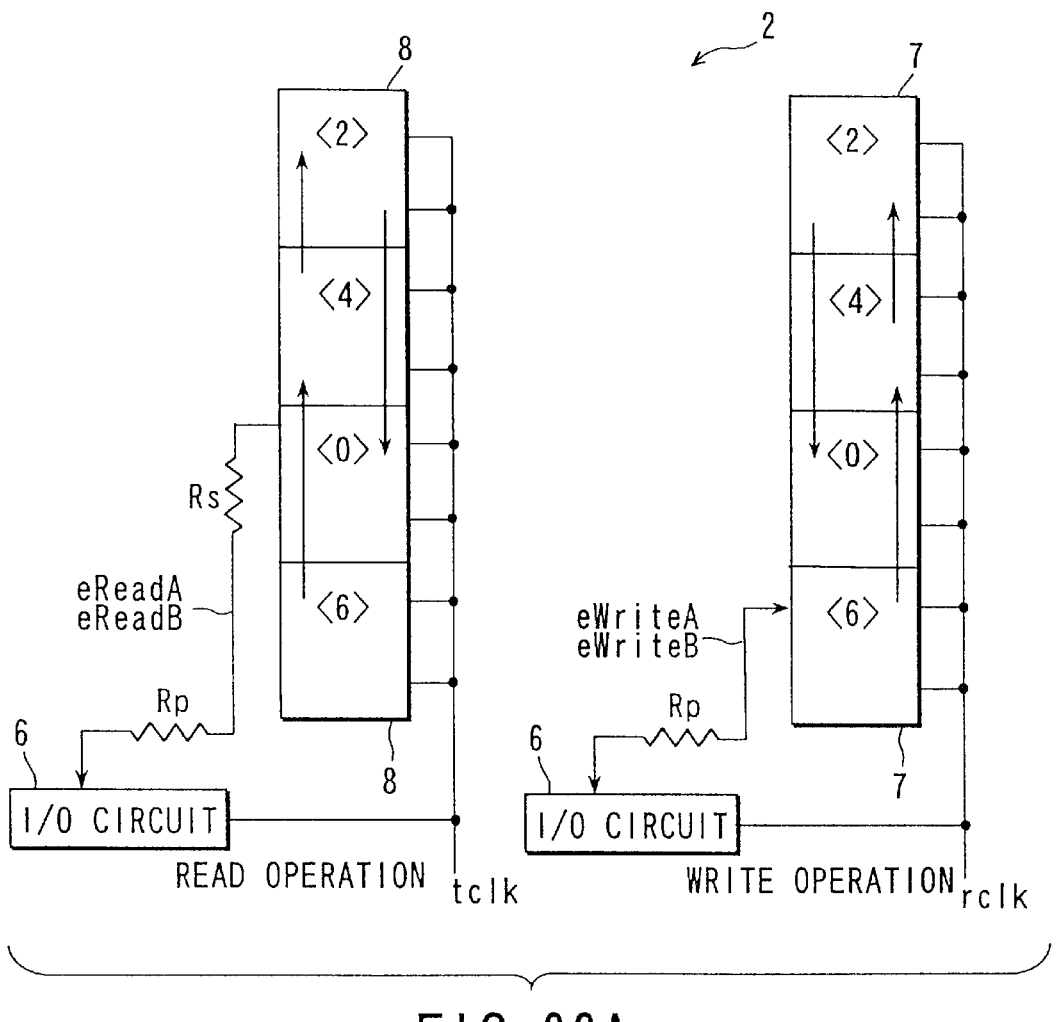
FIG. 33A shows the arrangement of a shift register section according to a fifteenth embodiment of the present invention.
Figure 33B:
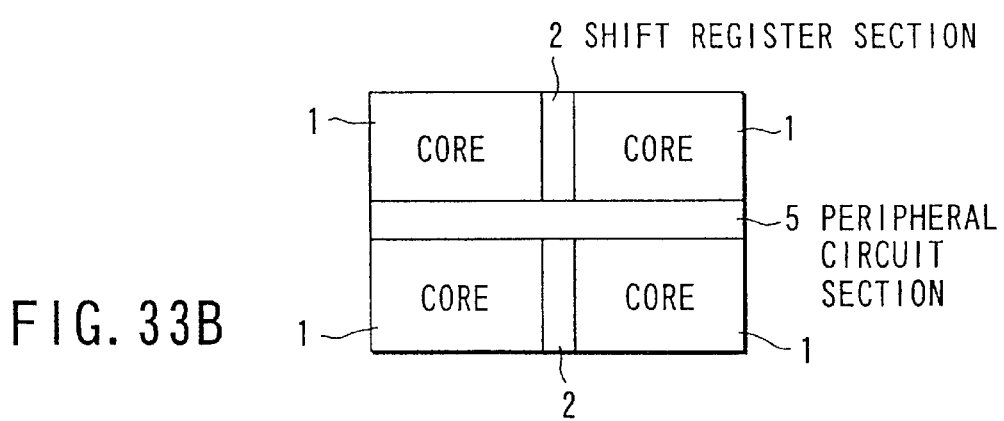
FIG. 33B is a schematic illustration of a pattern layout.

FIGS. 33A and 33B show a fifteenth embodiment of the present invention, which is a modification of the fourteenth embodiment.

In the fifteenth embodiment, as shown in FIG. 33A, blocks are stacked so that data transfer is made in the form of a loop and the even and odd shift registers are formed separately. Note that the odd shift register is not shown in FIG. 33A.

By stacking even data blocks in the order of <6>, <0>, <4> and <2> and odd data blocks (not shown) in the order of <7>, <1>, <5> and <3>, data transfer can be made in the form of a loop as indicated by arrows in FIG. 33A in each of the write register 7 and the read register 8.

The separation of serial lines into even lines and odd lines protects data and signal from mutual interference and ensures the symmetry of data lines and signal lines of the shift register section to all the I/O circuits 6 included in the peripheral circuit section 5. As to internal serial write data, even data are output from the closest block <6> to the peripheral circuit section and odd data are output from the block <7>. Thus, the wiring resistance Rs from the shift register to the peripheral circuit section will offer no problem.

As to internal serial read data as well, the length of interconnections to the peripheral circuit section can be reduced significantly because of data transfer in loop form.

Figure 34:
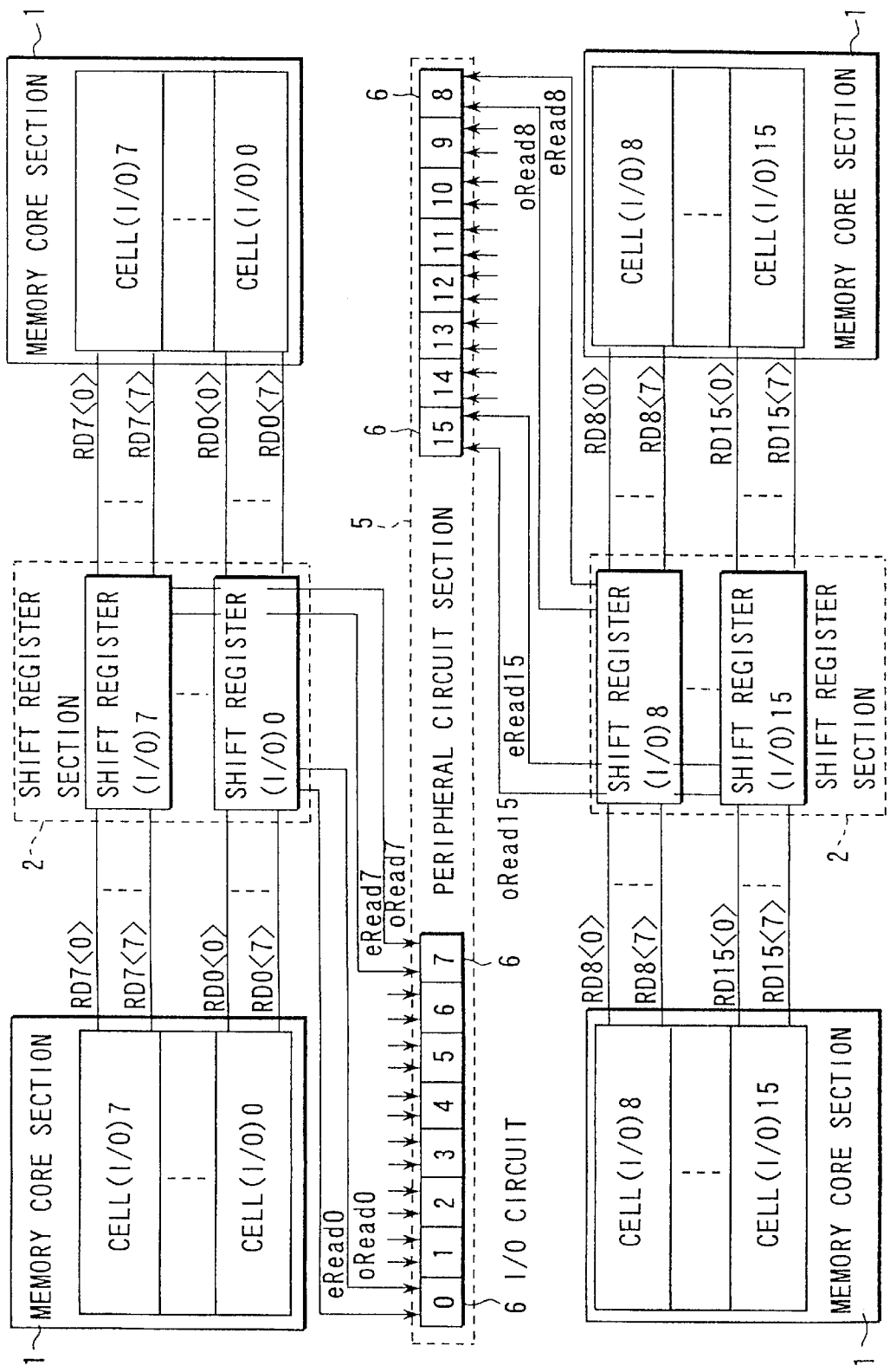
FIG. 34 shows the flow of data among the memory core section, the shift register section, and the I/O circuit in the sixteenth embodiment.

FIG. 34 shows a sixteenth embodiment of the present invention. In the sixteenth embodiment, the configuration of the shift register section 2 of the seventh embodiment described in conjunction with FIGS. 24A, 24B and 24C and the configuration of the memory core section 1 in the synchronous memory will be described.

As shown in FIGS. 24C and 34, the shift register sections 2 placed above and below the peripheral circuit section 5 including the I/O circuits 6 are each divided into eight shift registers to correspond one for one with the eight I/O circuits. Eight-bit areas are allocated to each of the upper right and left memory cores 1 to correspond one for one with the 8-bit I/O circuits 6 consecutively numbered 0 through 7. Likewise, 8-bit areas are allocated to each of the lower right and left memory cores 1 to correspond one for one with the 8-bit I/O circuits 6 consecutively numbered 8 through 15. Thus, a synchronous memory of 16-bit configuration is implemented.

In this manner, each of the upper and lower shift register sections 2 is divided into eight registers which correspond one for one with the I/O circuits and the upper and lower memory cores 1 are allocated cell arrays (I/O)0 through (I/O)7 and cell arrays (I/O)8 through (I/O)15, respectively. Each cell array has areas of 8 bits.

For example, parallel read data of eight bits RD0<0> to RD0<7>read from an area in the cell array (I/O)0 of the upper left memory core 1 is fed into the shift register (I/O)0, then converted therein into serial read data eRead0 and oRead0 and output from the 0-th I/O circuit 6.

In this manner, 8-bit data is read from each of the 8-bit cell arrays allocated to the memory cores 1 through a corresponding one of the shift registers to outside. The flow of data in a write operation can be understood by reversing the flow of data in a read operation and description thereof is therefore omitted.

Figure 35:
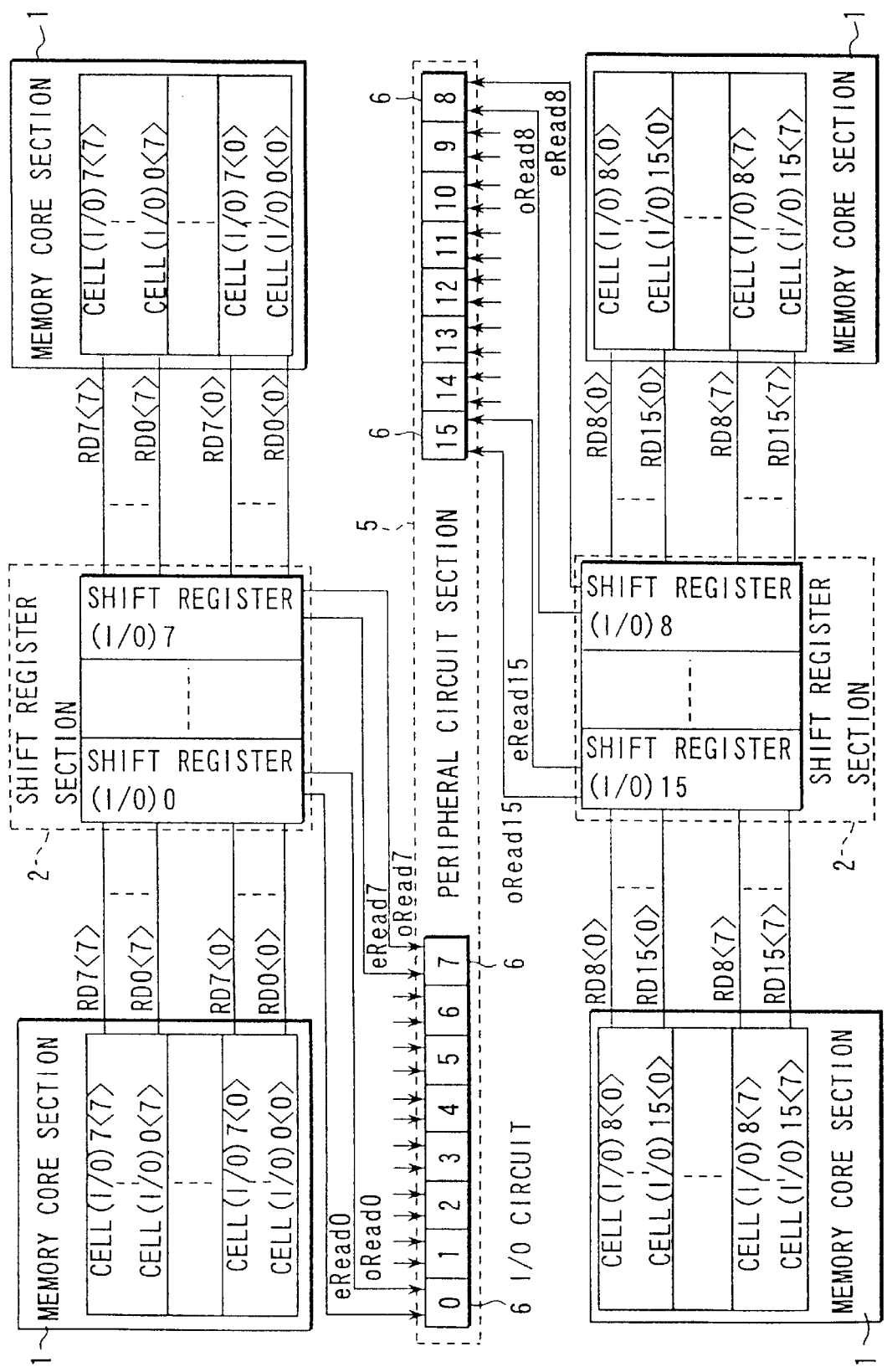
FIG. 35 shows the flow of data among the memory core section, the shift register section, and the I/O circuit in the seventeenth embodiment.

FIG. 35 shows a seventeenth embodiment of the present invention. In the seventeenth embodiment, the configuration of the shift register section 2 of the eighth embodiment described in conjunction with FIGS. 25A and 25B and the configuration of the memory core section 1 in the synchronous memory will be described.

As described previously, the eighth embodiment is characterized in that data flows through the shift register section 2 placed perpendicularly to the peripheral circuit section 5 in the direction indicated by arrows.

In the seventeenth embodiment of FIG. 35, each core memory 1 is allocated 8-bit cell arrays each of which corresponds to a respective one of eight bits <0> to <7> of data.

Unlike the arrangement of FIG. 34, the shift register section 2 is divided vertically into eight shift registers corresponding to eight I/O circuits so that parallel read data from a memory core section are transferred to close to the peripheral circuit section.

For example, parallel read data of bits RD0<0> to RD0<7>read from the cell arrays of the upper left core 1 are entered into the shift register (I/O)0 and then shifted through that shift register to close to the peripheral circuit section 5. Serial read data eRead0 and oRead0 are output from the 0-th I/O circuit 6. In the same manner, parallel read data RD1<0> to RD1<7> and the like are read.

Thus, serial read data are read outside from areas of core memory 1 each of which corresponds to a respective one of eight bit read data through shift registers arranged for each bit of the eight bit read data.

Figure 36:
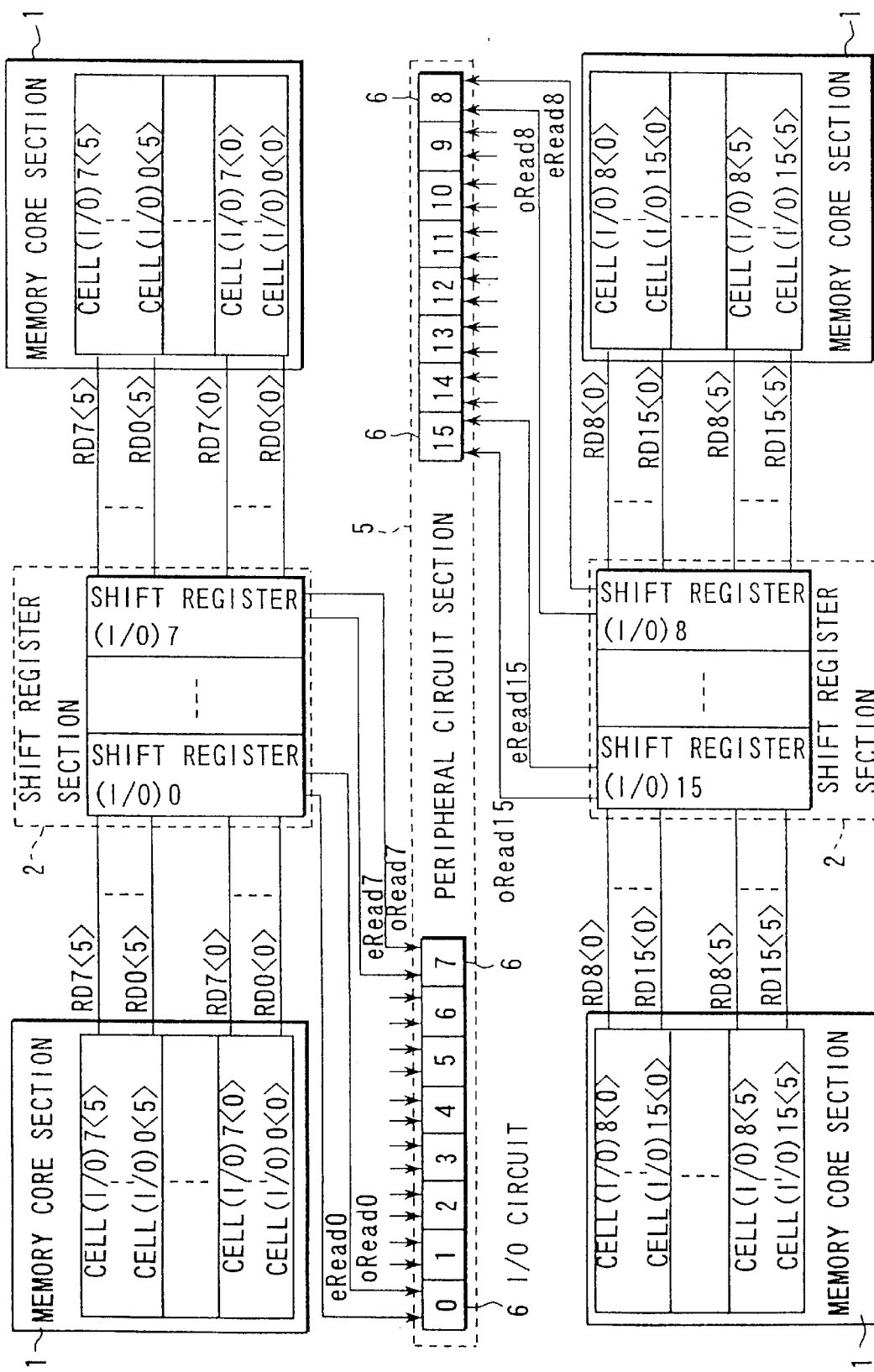
FIG. 36 shows the flow of data among the memory core section, the shift register section, and the I/O circuit in the eighteenth embodiment.

FIG. 36 shows an eighteenth embodiment of the present invention. In the eighteenth embodiment, the configuration of the shift register section 2 of the tenth embodiment described in conjunction with FIGS. 27A, 27B and 27C and the configuration of the memory core section 1 in the synchronous memory will be described.

As described previously, the tenth embodiment is characterized in that data flows through the shift register section 2 placed perpendicularly to the peripheral circuit section 5 in a loop as indicated by arrows in FIGS. 27A and 27B.

For example, parallel read data of bits RD0<0> to RD0<5>(intermediate data arrangement is described in the shift register section of FIG. 27B) read from the cell arrays of the upper left core 1 are entered into the shift register (I/O)0 and then shifted through that shift register to close to the peripheral circuit section 5. Serial read data eRead0 and oRead0 are output from the 0-th I/O circuit 6.

Thus, the parallel read data from the memory core are transferred through the shift register section to form effectively a loop and then sent to close to the peripheral circuit section as serial data. The serial data is output from a corresponding I/O circuit.

Figure 37:
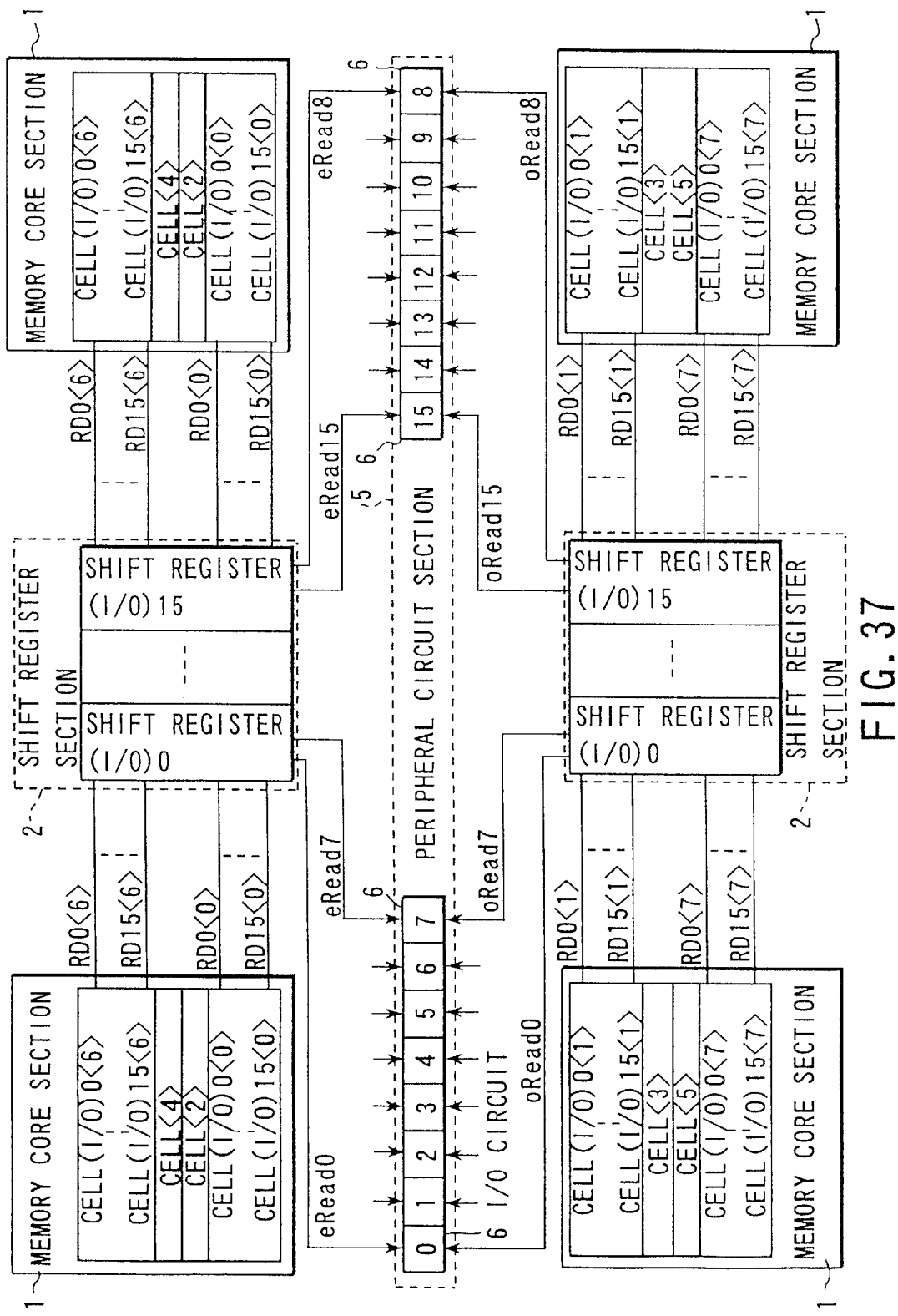
FIG. 37 shows the flow of data among the memory core section, the shift register section, and the I/O circuit in the nineteenth embodiment.

FIG. 37 shows a nineteenth embodiment of the present invention. In the nineteenth embodiment, the configuration of the shift register section 2 of the twelfth embodiment previously described in conjunction with FIGS. 29A and 29B and the configuration of the memory core section 1 in the synchronous memory will be described.

The twelfth embodiment has a distinguished feature that the shift register section 2 is constructed such that even data blocks and odd data blocks are stacked separately as shown in FIG. 29A.

The shift register section 2 of the nineteenth embodiment shown in FIG. 37 is completely separated into shift registers for even data and shift registers for odd data and the even shift registers and the odd shift registers (I/O)0 to (I/O)15 are respectively placed above and below the peripheral circuit section 5. The flow of data remains unchanged from that in the seventeenth embodiment and description thereof is therefore omitted.

Figure 38:
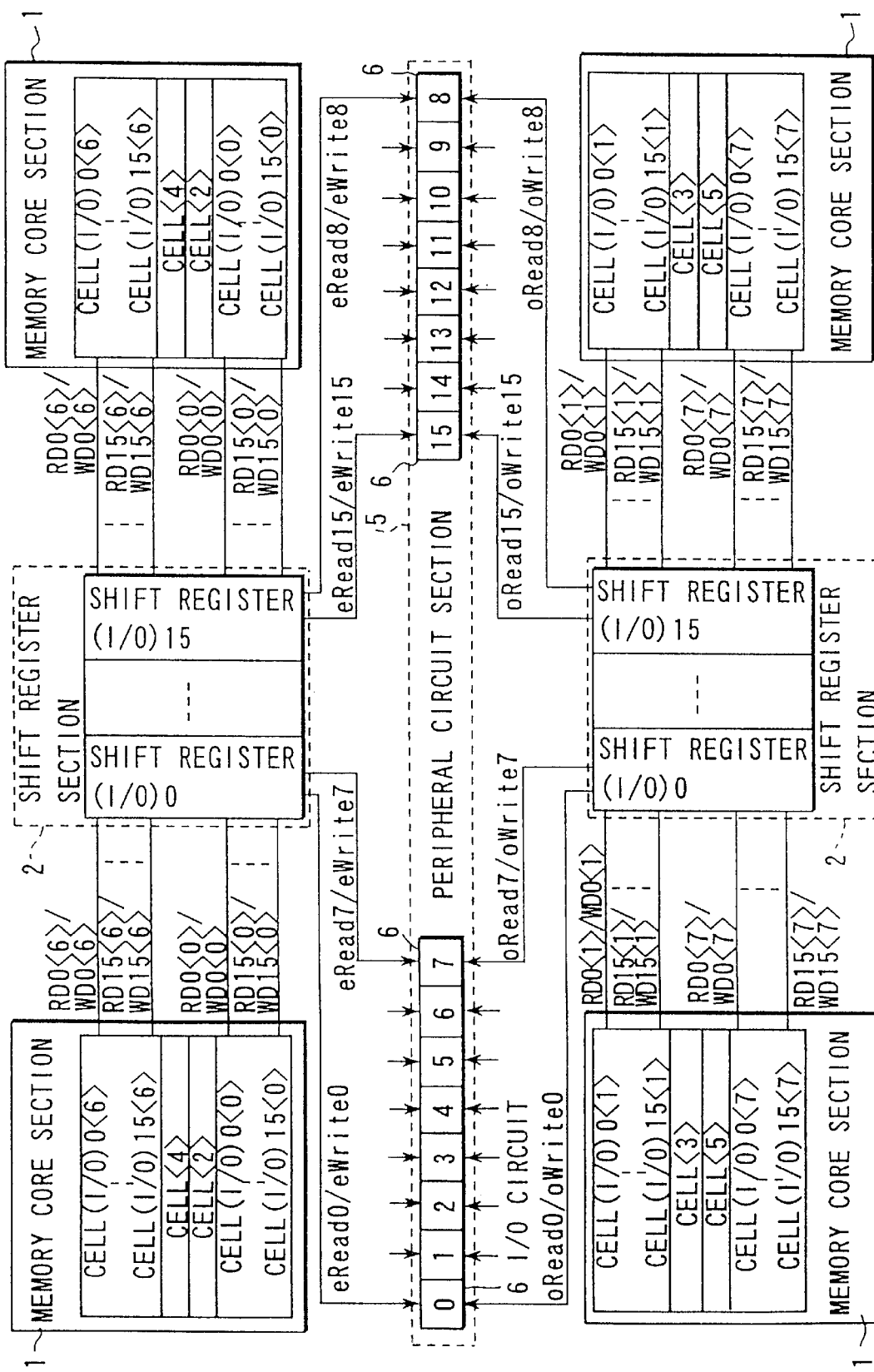
FIG. 38 shows the flow of data among the memory core section, the shift register section, and the I/O circuit in a modification of the nineteenth embodiment.

FIG. 38 shows a modification of the nineteenth embodiment.

In this modification, as in the nineteenth embodiment, the shift register section is constructed such that even data blocks and odd data blocks are stacked separately and write data is entered into the closest block to the peripheral circuit section as shown in FIG. 30A using the write register 7 described in conjunction with FIG. 20.

The present invention is not limited to the embodiments described so far but may be practiced or embodied in still other ways without departing from the scope and spirit thereof.

As described so far, semiconductor memory devices of the present invention are constructed such that in the middle in the vertical direction of a chip a peripheral circuit section is placed so that its longitudinal line is parallel to the horizontal direction of the chip, vertically long shift register sections are placed above and below the peripheral circuit section so that the shift register sections are perpendicular to the peripheral circuit section, and the arrangement of the chip including the peripheral circuit section, the shift register sections and memory core sections is symmetrical in the right-to-left direction. Thus, a semiconductor memory including a synchronous memory can be provided which keeps the symmetry of data lines and signal lines connecting the memory cores to corresponding shift register sections and allows large write/read operation margin without increasing the chip area.

Further, a semiconductor memory including a synchronous memory which is high in writing/reading speed can be provided by dividing each shifting register section into a plurality of data blocks and staking these data blocks vertically with respect to the horizontally long peripheral circuit section to form a vertically long shift register section and selecting the order in which the data blocks are stacked so that the length of interconnections from the peripheral circuit section to the shift register section is minimized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a peripheral circuit section including a plurality of I/O circuits;
    a shift register section placed so that its longitudinal line is perpendicular to the longitudinal line of the peripheral circuit section; and
    a memory core section including a memory cell array and placed adjacent to the shift register section along the longitudinal line of the shift register section.

2. The semiconductor memory device according to claim 1, wherein the memory core section and the shift register section are placed on the chip symmetrically with respect to the center line of the semiconductor chip.

3. The semiconductor memory device according to claim 1, wherein the memory core section is placed adjacent to one side of the shift register section along its longitudinal line.

4. The semiconductor memory device according to claim 1, wherein the memory core section is placed adjacent to both sides of the shift register section along its longitudinal line.

5. The semiconductor memory device according to claim 1, wherein the memory core section comprises first and second memory cores placed adjacent to both sides of the shift register section and the shift register section comprises a first shift register which operates in association with the first memory core and a second shift register which operates in association with the second memory core.

6. The semiconductor memory device according to claim 1, wherein the memory core section comprises first and second memory cores placed adjacent to both sides of the shift register section and the shift register section operates in association with the first and second memory cores.

7. A semiconductor memory device comprising:
    a peripheral circuit section including a plurality of I/O circuits;

a shift register section placed so that its longitudinal line is perpendicular to the longitudinal line of the peripheral circuit section;

a memory core section including a memory cell array and placed adjacent to the shift register section along the longitudinal line of the shift register section; and the shift register section including a plurality of shift registers which are arranged along the vertical side of the chip and correspond one for one with the plurality of I/O circuits.

8. A semiconductor memory device comprising:

a peripheral circuit section including a plurality of I/O circuits;

a shift register section placed so that its longitudinal line is perpendicular to the longitudinal line of the peripheral circuit section;

a memory core section including a memory cell array and placed adjacent to the shift register section along the longitudinal line of the shift register section; and the shift register section including a plurality of shift registers which are arranged along the vertical direction of the chip and correspond one for one with bits of write/read serial data.

9. The semiconductor memory device according to claim 8, wherein the shift register section comprises a first shift register section having a plurality of shift registers which correspond one for one with even bits of the serial data and a second shift register section having a plurality of shift registers which correspond one for one with odd bits of the serial data, the first and second shift register sections being arranged independently.

10. The semiconductor memory device according to claim 8, wherein write/read data is transferred in one of the following transfer modes:

a transfer mode in which, at data write time, serial data is transferred from a shift register which is close to the shift register section to a shift register which is far from the peripheral circuit section;

a transfer mode in which, at data read time, parallel data read from the memory core section is transferred to a shift register close to the peripheral circuit section;

a transfer mode in which, at data write time, serial data is transferred from a shift register close to the peripheral circuit section to a shift register far from the peripheral circuit section and then turns back toward a shift register close to the peripheral circuit section; and a transfer mode in which, at data read time, parallel data read from the memory core section is transferred to a shift register far from the peripheral circuit section and then turns back toward a shift register close to the peripheral circuit section.

11. The semiconductor memory device according to claim 8, wherein a write register forming a part of the shift register section is arranged such that a latch control signal for a plurality of latch circuits is transferred in synchronization with an internal clock signal, bits of serial write register entered into the write register are taken into the latch circuits in a given order, and the bits of the write data are taken from the latch circuits in parallel, and, in the write data transfer mode of the shift register section, by a latch control signal entered into a shift register in the shift register section which is close to the peripheral circuit section being transferred toward a shift register far from the peripheral circuit section, bits of serial write data entered into a shift register close to the peripheral circuit section are sequentially taken into latch circuits in the shift registers from close to the peripheral circuit section to far from the peripheral circuit section.

12. The semiconductor memory device according to claim 9, wherein write/read data is transferred in one of the following transfer modes:

a transfer mode in which, at data write time, serial data is transferred from a shift register close to the shift register section to a shift register far from the peripheral circuit section;

a transfer mode in which, at data read time, parallel data read from the memory core section is transferred to a shift register close to the peripheral circuit section;

a transfer mode in which, at data write time, serial data is transferred from a shift register close to the peripheral circuit section to a shift register fir from the peripheral circuit section and then turns back toward a shift register close to the peripheral circuit section; and a transfer mode in which, at data read time, parallel data read from the memory core section is transferred to a shift register far from the peripheral circuit section and then turns back toward a shift register close to the peripheral circuit section.

13. The semiconductor memory device according to claim 9, wherein a write register forming a part of the shift register section is arranged such that a latch control signal for a plurality of latch circuits is transferred in synchronization with an internal clock signal, bits of serial write register entered into the write register are taken into the latch circuits in a given order, and the bits of the write data are taken from the latch circuits in parallel, and, in the write data transfer mode of the shift register section, by a latch control signal entered into a shift register in the shift register section which is close to the peripheral circuit section being transferred toward a shift register far from the peripheral circuit section, bits of serial write data entered into a shift register close to the peripheral circuit section are sequentially taken into latch circuits in the shift registers from close to the peripheral circuit section to far from the peripheral circuit section.

14. The semiconductor memory device according to claim 1, wherein a fuse circuit and a DQ buffer arc placed adjacent to a side of the shift register section along its longitudinal line.

15. The semiconductor memory device according to claim 1, wherein a plurality of pads are placed along a line oriented parallel to the longitudinal line of the peripheral circuit section.

16. A semiconductor memory device comprising a peripheral circuit section including a plurality of I/O circuits;

four shift register sections comprised of a first shift register section, a second shift register section, a third shift register section and a fourth shift register section; and a memory core section including a memory cell array and placed adjacent to both sides of each of the first to the fourth shift register sections along its longitudinal line;

wherein each of the first to the fourth shift register sections has a longitudinal line perpendicular to the longitudinal line of the peripheral circuit section, and the first and second shift register sections are placed to one side of the peripheral circuit section along its longitudinal line and the third and fourth shift register sections are placed to the other side of the peripheral circuit section along its longitudinal line.

17. A semiconductor memory device according to claim 16, wherein the first and third shift resistor section are placed in such a manner that they are symmetric with respect to the longitudinal line of the peripheral circuit section, the second and fourth shift resistor sections are placed in such a manner that they are symmetric with respect to the longitudinal line of the peripheral circuit section.

18. A semiconductor memory device according to claim 16, wherein a DQ buffer is placed adjacent to a side of each of the first to the fourth shift register sections along its longitudinal line.

19. The semiconductor memory device according to claim 16, wherein a plurality of pads are placed along a line oriented parallel to the longitudinal line of the peripheral circuit section.

20. The semiconductor memory device according to claim 7, wherein a plurality of pads are placed along a line oriented parallel to the longitudinal line of the peripheral circuit section.

* * * * *